US012784833B2

(12) United States Patent
Tessariol et al.

(10) Patent No.: US 12,784,833 B2
(45) Date of Patent: Nov. 3, 2026

(54) MEMORY ARRAY STRUCTURES AND METHODS OF THEIR FABRICATION

(71) Applicant: MICRON TECHNOLOGY, INC., Boise, ID (US)

(72) Inventors: Paolo Tessariol, Arcore (IT); Richard J. Hill, Boise, ID (US); Aaron S. Yip, Los Gatos, CA (US); Kunal Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 18/652,288

(22) Filed: May 1, 2024

(65) Prior Publication Data

US 2024/0395326 A1 Nov. 28, 2024

Related U.S. Application Data

(60) Provisional application No. 63/469,103, filed on May 26, 2023.

(51) Int. Cl.

| | |
|---|---|
| ***G11C 16/04*** | (2006.01) |
| ***G11C 5/06*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(Continued)

(52) U.S. Cl.

CPC .......... *G11C 16/0483* (2013.01); *G11C 5/063* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10D 30/681* (2025.01); *H10D 30/691* (2025.01)

(58) Field of Classification Search

CPC . G11C 16/0483; G11C 16/10; G11C 16/3427; G11C 16/24; G11C 16/0408; G11C 16/06; G11C 16/12; G11C 16/14; G11C 16/26; G11C 16/3418; G11C 16/3459; G11C 5/063; H10B 41/27; H10B 43/10; H10B 43/27; H10B 41/10; H10B 41/35; H10B 43/35; H10B 43/40; H10B 41/40; H10B 41/50; H10B 43/50; H01L 23/5283; H01L 21/76805; H01L 21/76831; H01L 21/76895; H01L 21/76897; H01L 22/20; H01L 23/5226; H01L 23/535

See application file for complete search history.

(56) References Cited

U.S. PATENT DOCUMENTS

| | | | |
|---|---|---|---|
| 5,687,117 | A | 11/1997 | Chevallier et al. |
| 9,299,439 | B2 | 3/2016 | Ghodsi |

(Continued)

*Primary Examiner* — Amir Zarabian

(74) *Attorney, Agent, or Firm* — Dicke, Billig & Czaja, PLLC

(57) ABSTRACT

Memory array structures might include a data line, a common source, and a plurality of sub-blocks of memory cells selectively connected to the data line and to the common source. Sub-blocks of memory cells might include memory cells formed to be around channel material structures, and might include isolation of source-side select lines of adjacent sub-blocks of memory cells. Methods are included for forming such memory array structures.

20 Claims, 33 Drawing Sheets

(51) Int. Cl.
*H10D 30/68* (2025.01)
*H10D 30/69* (2025.01)

(56) References Cited

U.S. PATENT DOCUMENTS

| | | | | |
|---|---|---|---|---|
| 9,460,792 | B2 | 10/2016 | Pan et al. | |
| 9,589,644 | B2* | 3/2017 | Yip .................... | G11C 16/0483 |
| 9,773,553 | B1 | 9/2017 | Tanzawa et al. | |
| 10,170,189 | B2 | 1/2019 | Goda et al. | |
| 2023/0085034 | A1 | 3/2023 | Fukuzumi et al. | |
| 2024/0315028 | A1 | 9/2024 | Tessariol et al. | |

* cited by examiner

MEMORY ARRAY STRUCTURES AND METHODS OF THEIR FABRICATION

RELATED APPLICATION

This application claims the benefit of U.S. Provisional Application No. 63/469,103, filed on May 26, 2023, hereby incorporated herein in its entirety by reference.

TECHNICAL FIELD

The present disclosure relates generally to integrated circuits and methods of their formation, and, in particular, in one or more embodiments, the present disclosure relates to memory array structures having source-side segmentation in a source-last fabrication scheme, and methods of their fabrication.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage nodes (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

DETAILED DESCRIPTION

Figure 1:
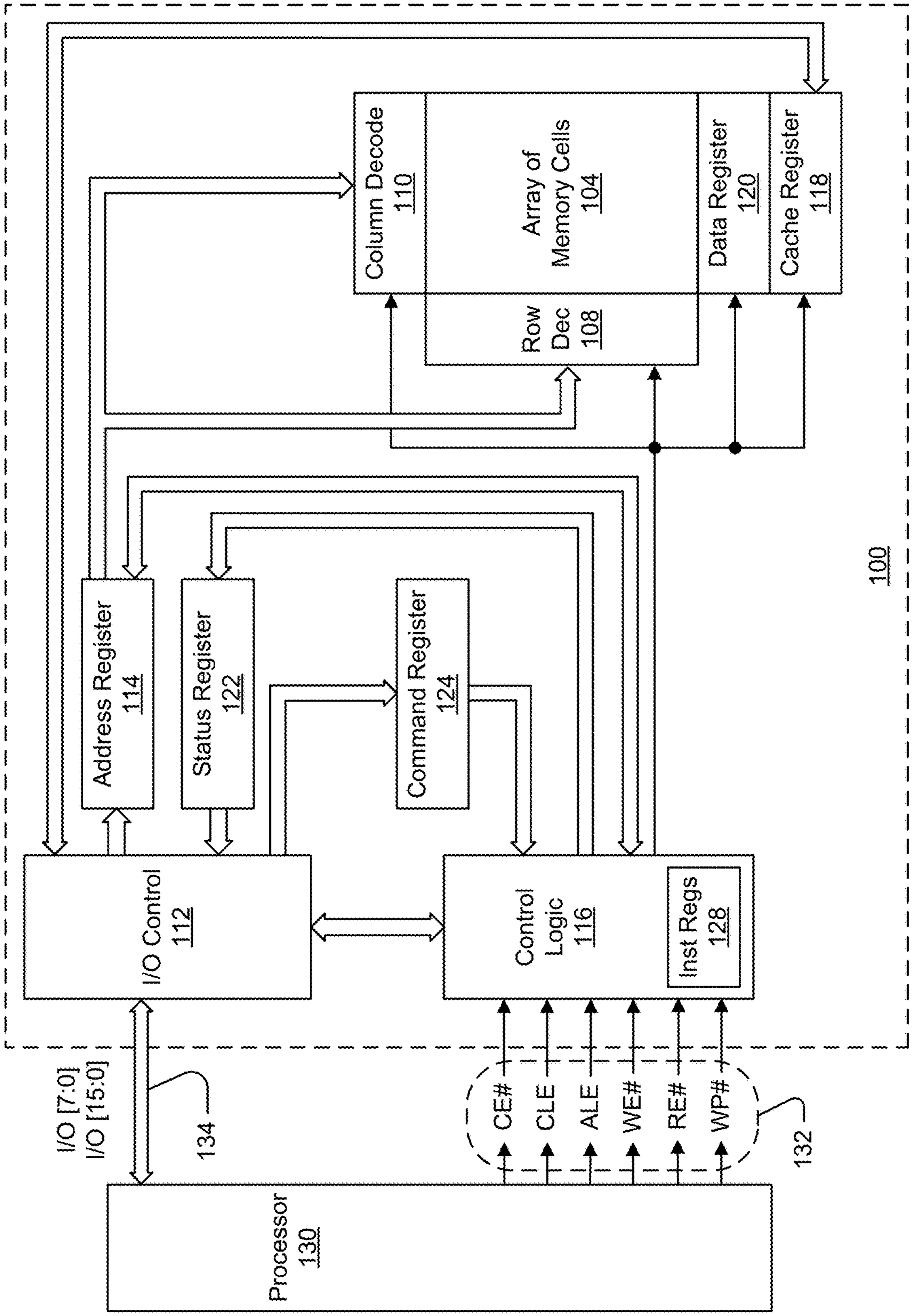
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, portions of each of those acts are simultaneously performed for at least some period of time.

Unless otherwise defined, directional references such as upper, top, lower, bottom, side, left, right, parallel, orthogonal, etc. used in the description of the figures refers to such directions relative to the orientation of the figure itself.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. The array of memory cells 104 might contain memory array structures in accordance with one or more embodiments. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104. The control logic 116 might be configured, e.g., in response to such computer-readable instructions, to cause the memory 100 to perform methods of one or more embodiments.

Control logic 116 might further be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
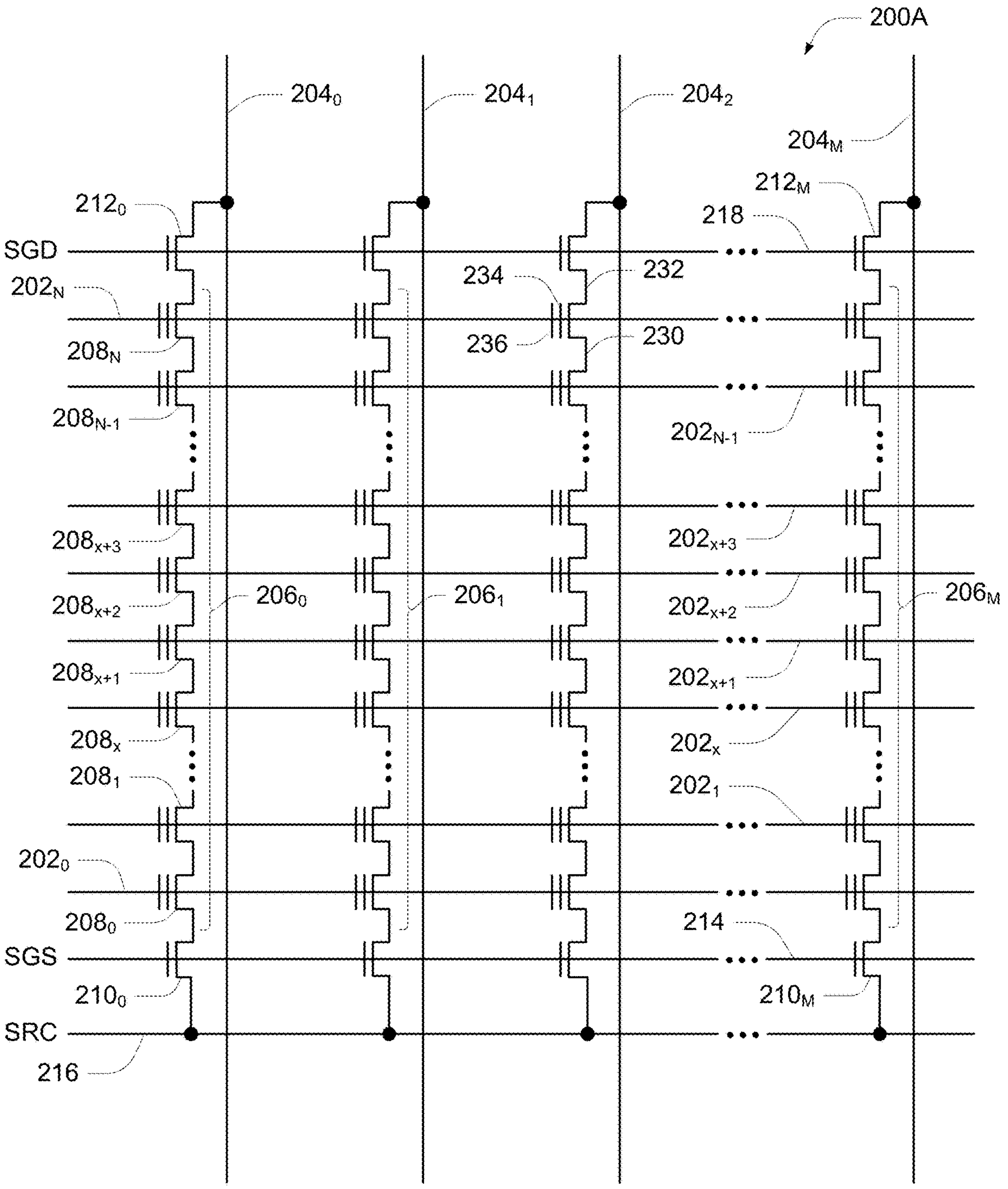
FIGS. 2A-2B are schematics of a portion of an array of memory cells in accordance with an embodiment.

FIG. 2A is a schematic of a portion of an array of memory cells 200A, such as a NAND memory array, in accordance with an embodiment as could be used in a memory of the type described with reference to FIG. 1. The array of memory cells 200A includes access lines (e.g., word lines) $\mathbf{202}_0$ to $\mathbf{202}_N$, and a data line (e.g., bit line) 204. The array of memory cells 200A might be arranged in rows (each corresponding to an access line 202) and columns (each corresponding to a data line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data.

The memory cells 208 of each NAND string 206 might be connected in series between a select gate 210 (e.g., a field-effect transistor), such as one of the select gates $\mathbf{210}_0$ to $\mathbf{210}_M$, and a select gate 212 (e.g., a field-effect transistor), such as one of the select gates $\mathbf{212}_0$ to $\mathbf{212}_M$. Select gates $\mathbf{210}_0$ to $\mathbf{210}_M$ might be commonly connected to a select line 214, such as a source select line (SGS), and select gates $\mathbf{212}_0$ to $\mathbf{212}_M$ might be connected to different select lines 218, e.g., select lines $\mathbf{218}_0$-$\mathbf{218}_M$. A control gate of each select gate 210 might be connected to select line 214. A control gate of each select gate 212 might be connected to select line 218. As used herein, a field-effect transistor, e.g., an integrated circuit device using an electric field to control the flow of current, might be alternatively referred to simply as a transistor.

A source of each select gate 210 might be connected to common source (SRC) 216. The drain of each select gate 210 might be connected to a memory cell 208 of the corresponding NAND string 206. For example, the drain of select gate $\mathbf{210}_0$ might be connected to the source of memory cell $\mathbf{208}_0$ of the corresponding NAND string $\mathbf{206}_0$. Therefore, each select gate 210 for a corresponding NAND string 206 might be configured to selectively connect that NAND string 206 to common source 216.

The drain of each select gate 212 might be connected to the data line 204. The source of each select gate 212 might be connected to a memory cell 208 of the corresponding NAND string 206. For example, the source of select gate $\mathbf{212}_0$ might be connected to memory cell $\mathbf{208}_N$ of the corresponding NAND string $\mathbf{206}_0$. Therefore, each select gate 212 for a corresponding NAND string 206 might be configured to selectively connect that NAND string 206 to the data line 204.

The access lines 202 and select lines 214 and 218 might be formed around channel material structures 244. Each channel material structure 244 might contain a channel material forming a channel of the select gate 210, the select gate 212, and each memory cell 208 of its respective NAND string 206. For example, the channel material structure $\mathbf{244}_0$ might form a channel for the select gate $\mathbf{210}_0$, the select gate $\mathbf{212}_0$, and each memory cell $\mathbf{208}_0$-$\mathbf{208}_N$ of the NAND string $\mathbf{206}_0$.

Typical construction of memory cells 208 includes a data storage structure 234 (e.g., including a floating gate, charge trap, or other structure configured to store charge) that can determine a data state of the memory cell (e.g., through changes in threshold voltage), and a control gate 236, as shown in FIG. 2A. The data storage structure 234 might include conductive and/or dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. Other groupings of memory cells 208 commonly connected to a given access line 202 might also define a physical page of memory cells 208. For certain memory devices, all memory cells commonly connected to a given access line 202 might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells 242 might include memory cells that are configured to be erased together. Unless expressly distinguished, any reference to a page of memory cells herein refers to the memory cells of a logical page of memory cells.

Figure 2B:
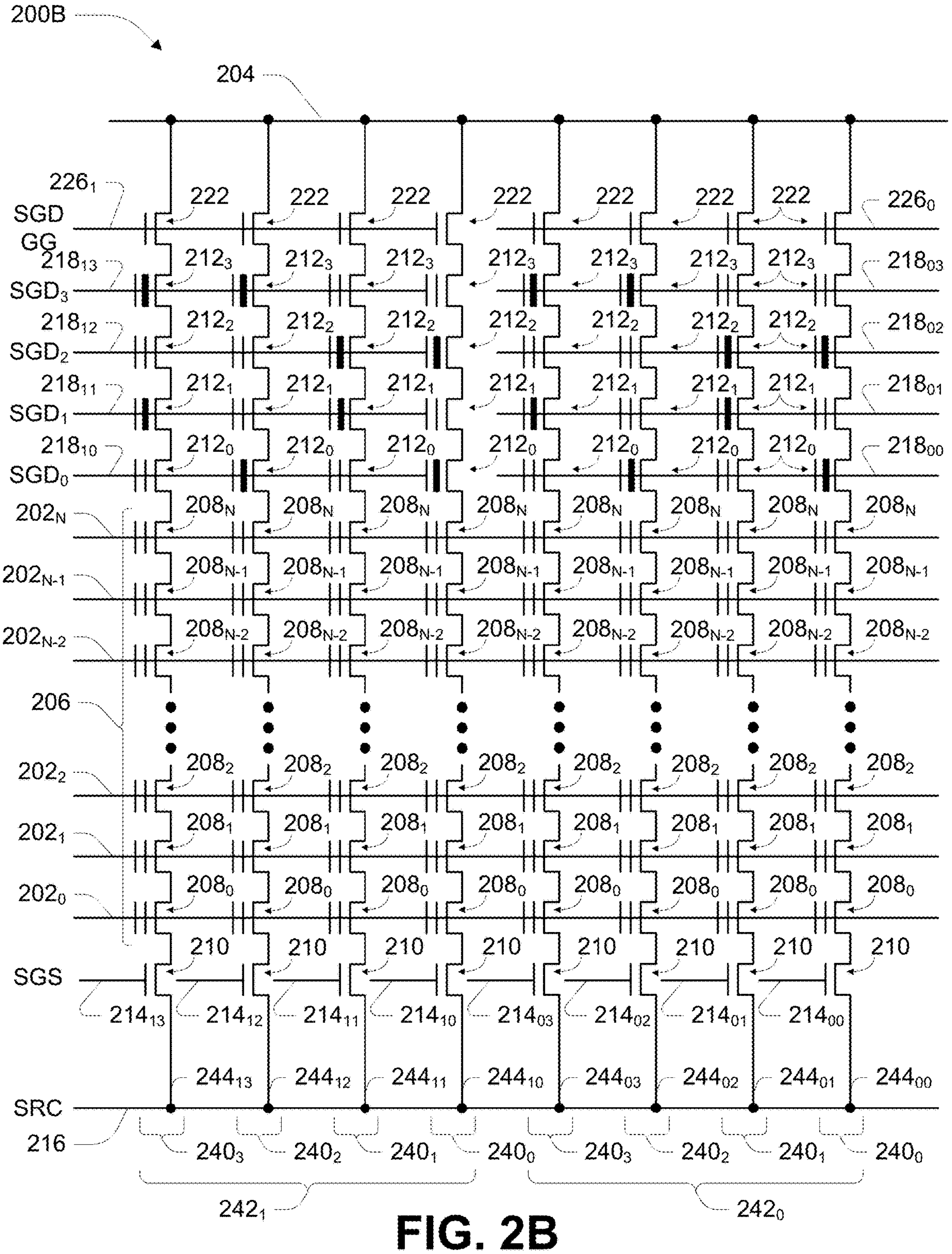

FIG. 2B is a schematic of a portion of an array of memory cells 200B in accordance with an embodiment as could be used in a memory of the type described with reference to FIG. 1, e.g., as a portion of array of memory cells 104. Like numbered elements in FIG. 2B corresponds to the description as provided with respect to FIG. 2A. While FIG. 2A depicted a possible layout for connecting multiple data lines 204 to respective NAND strings 206, FIG. 2B depicts a possible layout for connecting multiple NAND strings 206 to a same data line 204. For example, each data line 204 of FIG. 2A might be selectively connected to multiple NAND strings 206, such as depicted in FIG. 2B.

The array of memory cells 200B includes access lines (e.g., word lines) $\mathbf{202}_0$ to $\mathbf{202}_N$, and the data line (e.g., bit line) 204. The access lines 202 might be connected to global access lines (e.g., global word lines), not shown in FIG. 2B, in a many-to-one relationship. For some embodiments, the array of memory cells 200B might be formed over a semiconductor that, for example, might be conductively doped to have a conductivity type, such as a p-type conductivity, e.g., to form a p-well, or an n-type conductivity, e.g., to form an n-well.

The array of memory cells 200B might be arranged in rows (each corresponding to an access line 202) and columns (each corresponding to a data line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data. Some of the memory cells 208 might represent dummy memory cells, e.g., memory cells not intended to store user data. Dummy memory cells are typically not accessible to a user of the memory, and are typically incorporated into the NAND string 206 for operational advantages, as are well understood.

The memory cells 208 of each NAND string 206 might be connected in series between a select gate 210 that might be a source select transistor, commonly referred to as select gate source, and one or more select gates 212 that might be drain select transistors, commonly referred to as select gate drain. Each select gate 210 might have a control gate connected to a respective select line 214 (e.g., one of select lines $\mathbf{214}_{00}$-$\mathbf{214}_{03}$ or $\mathbf{214}_{10}$-$\mathbf{214}_{13}$), which might be referred to as source select lines (SGS). For some embodiments, the select lines $\mathbf{214}_{00}$-$\mathbf{214}_{03}$ might be commonly connected, such that the select gates 210 corresponding to channel material structures $\mathbf{244}_{00}$-$\mathbf{244}_{03}$ might be responsive to a same control signal, and the select lines $\mathbf{214}_{10}$-$\mathbf{214}_{13}$ might be commonly connected, such that the select gates 210 corresponding to channel material structures $\mathbf{244}_{10}$-$\mathbf{244}_{13}$ might be responsive to a same control signal, which might be independent of, including different than, the control signal to the select lines $\mathbf{214}_{00}$-$\mathbf{214}_{03}$.

Select gates $\mathbf{212}_0$ for each NAND string 206 of the sub-blocks of memory cells 240 (e.g., sub-blocks of memory cells $\mathbf{240}_0$-$\mathbf{240}_3$) of the block of memory cells $\mathbf{242}_1$ might be commonly connected to (e.g., have their control gates commonly connected to) a select line $\mathbf{218}_{10}$, such as a drain select line ($SGD_0$), while select gates $\mathbf{212}_0$ for each NAND string 206 of the sub-blocks of memory cells 240 (e.g., sub-blocks of memory cells $\mathbf{240}_0$-$\mathbf{240}_3$) of the block of memory cells $\mathbf{242}_0$ might be commonly connected to (e.g., have their control gates commonly connected to) a select line $\mathbf{218}_{00}$, such as a drain select line ($SGD_0$). Select gates $\mathbf{212}_1$ for each NAND string 206 of the sub-blocks of memory cells 240 (e.g., sub-blocks of memory cells $\mathbf{240}_0$-$\mathbf{240}_3$) of the block of memory cells $\mathbf{242}_1$ might be commonly connected to (e.g., have their control gates commonly connected to) a select line $\mathbf{218}_{11}$, such as a drain select line ($SGD_1$), while select gates $\mathbf{212}_1$ for each NAND string 206 of the sub-blocks of memory cells 240 (e.g., sub-blocks of memory cells $\mathbf{240}_0$-$\mathbf{240}_3$) of the block of memory cells $\mathbf{242}_0$ might be commonly connected to (e.g., have their control gates commonly connected to) a select line $\mathbf{218}_{01}$, such as a drain select line ($SGD_1$). Select gates $\mathbf{212}_2$ for each NAND string 206 of the sub-blocks of memory cells 240 (e.g., sub-blocks of memory cells $\mathbf{240}_0$-$\mathbf{240}_3$) of the block of memory cells $\mathbf{242}_1$ might be commonly connected to (e.g., have their control gates commonly connected to) a select line $\mathbf{218}_{12}$, such as a drain select line ($SGD_2$), while select gates $\mathbf{212}_2$ for each NAND string 206 of the sub-blocks of memory cells 240 (e.g., sub-blocks of memory cells $\mathbf{240}_0$-$\mathbf{240}_3$) of the block of memory cells $\mathbf{242}_0$ might be commonly connected to (e.g., have their control gates commonly connected to) a select line $\mathbf{218}_{02}$, such as a drain select line ($SGD_2$). Select gates $\mathbf{212}_3$ for each NAND string 206 of the sub-blocks of memory cells 240 (e.g., sub-blocks of memory cells $\mathbf{240}_0$-$\mathbf{240}_3$) of the block of memory cells $\mathbf{242}_1$ might be commonly connected to (e.g., have their control gates commonly connected to) a select line $\mathbf{218}_{13}$, such as a drain select line ($SGD_3$), while select gates $\mathbf{212}_3$ for each NAND string 206 of the sub-blocks of memory cells 240 (e.g., sub-blocks of memory cells $\mathbf{240}_0$-$\mathbf{240}_3$) of the block of memory cells $\mathbf{242}_0$ might be commonly connected to (e.g., have their control gates commonly connected to) a select line $\mathbf{218}_{03}$, such as a drain select line ($SGD_3$). The select gates 212 might utilize a structure similar to (e.g., the same as) the memory cells 208. Although depicted as traditional transistors, the select gates 210 might also utilize a structure similar to (e.g., the same as) the memory cells 208. The select gates 210 and 212 might each represent a plurality of select gates connected in series, with each select gate in series configured to receive a same or independent control signal.

The gate-induced drain leakage (GIDL) generator gates 222, e.g., GG gates 222, might be referred to as drain GG gates. The GG gates 222 might be connected (e.g., directly connected) to the data line 204, and selectively connected to their respective NAND strings 206.

GG gates 222 for each NAND string 206 of the sub-blocks of memory cells 240 (e.g., sub-blocks of memory cells $\mathbf{240}_0$-$\mathbf{240}_3$) of the block of memory cells $\mathbf{242}_1$ might be commonly connected to (e.g., have their control gates commonly connected to) a control line $\mathbf{226}_1$, such as an SGD_GG control line, while GG gates 222 for each NAND string 206 of the sub-blocks of memory cells 240 (e.g., sub-blocks of memory cells $\mathbf{240}_0$-$\mathbf{240}_3$) of the block of memory cells $\mathbf{242}_0$ might be commonly connected to (e.g., have their control gates commonly connected to) a control line $\mathbf{226}_0$, such as an SGD_GG control line. Although depicted as traditional transistors, the GG gates 222 might utilize a structure similar to (e.g., the same as) the memory cells 208. The GG gates 222 might represent a plurality of GG gates connected in series, with each GG gate in series configured to receive a same or independent control signal. The GG gates 222 might be provided to assist in the generation of GIDL current into a channel region of their corresponding NAND string 206 during an erase operation, for example, as is well understood in the art. Although not depicted, additional GG gates might be included between the source select transistors 210 and the common source 216.

The drain of each GG gate 222 might be connected to the data line 204 for the corresponding NAND string 206. Each GG gate 222 might be connected in series with the select gates $\mathbf{212}_3$-$\mathbf{212}_0$ of the corresponding NAND string 206. Therefore, in cooperation, each select gate 212 and GG gate 222 for a corresponding NAND string 206 might be configured to selectively connect that NAND string 206 to the data line 204.

The array of memory cells 200B in FIG. 2B might be a three-dimensional array of memory cells, e.g., where NAND strings 206 might extend substantially perpendicular to a plane containing the common source 216 and to a plane containing the data lines 204 that might be substantially parallel to the plane containing the common source 216.

In the array of memory cells 200B of FIG. 2B, NAND strings 206 of four different sub-blocks of memory cells $\mathbf{240}_0$-$\mathbf{240}_3$ for each block of memory cells $\mathbf{242}_0$ and $\mathbf{242}_1$ are each selectively connected to the data line 204. For example, the NAND strings 206 corresponding to channel material structures $\mathbf{244}_{00}$-$\mathbf{244}_{03}$ and $\mathbf{244}_{10}$-$\mathbf{244}_{13}$ might each be selectively connected to the data line 204 through a respective set of select gates $\mathbf{212}_0$-$\mathbf{212}_3$ and a respective GG gate 222.

Each sub-block of memory cells 240, e.g., a sub-block of memory cells $\mathbf{240}_0$-$\mathbf{240}_3$ for the block of memory cells $\mathbf{242}_0$ or a sub-block of memory cells $\mathbf{240}_0$-$\mathbf{240}_3$ for the block of memory cells $\mathbf{242}_1$, might include one or more NAND strings 206 having their select gates 212 connected to a same select line 218, e.g., a sub-block of memory cells 240 of FIG.

2B might further include NAND strings 206 connected to different data lines 204, such as depicted in the example of FIG. 2A.

In general, an array structure for a given block of memory cells 242 might include a number of select gates 212 between each NAND string 206 and a data line 204 that is equal to or greater than a number of sub-blocks of memory cells 240 of that block of memory cells 242. Although numbers of sub-blocks of memory cells 240 being some power of 2 (e.g., 2, 4, 8, etc.) generally might be preferred, embodiments can be adapted to a number of sub-blocks of memory cells 240 being other than some power of 2.

To connect a NAND string 206 for one sub-block of memory cells 240 to the data line 204 without connecting NAND strings 206 of other sub-blocks of memory cells 240 to the data line 204, the select gates 212 might be programmed to be either activated or deactivated in response to a control signal having a particular voltage level, e.g., they might be programmed to have threshold voltages in one of two different threshold voltage ranges. As will be described in more detail infra, each select gate 212 having a control gate connected to a same select line 218 might have either a first threshold voltage (Vt) or a second threshold voltage different than (e.g., lower than) the first threshold voltage. This configuration will be described by example with reference to the array of memory cells 200B.

In the array of memory cells 200B, the select gates $\mathbf{212}_3$ connected to the select lines $\mathbf{218}_{13}$ and $\mathbf{218}_{03}$ corresponding to the sub-blocks of memory cells $\mathbf{240}_2$ and $\mathbf{240}_3$ of the blocks of memory cells $\mathbf{242}_0$ and $\mathbf{242}_1$ might be programmed to have threshold voltages higher than each remaining select gate $\mathbf{212}_3$ connected to the select lines $\mathbf{218}_{13}$ and $\mathbf{218}_{03}$ and corresponding to the sub-blocks of memory cells $\mathbf{240}_0$ and $\mathbf{240}_1$ of the blocks of memory cells $\mathbf{242}_0$ and $\mathbf{242}_1$. This is indicated by the thick black data storage structures of the select gates $\mathbf{212}_3$ corresponding to the channel material structures $\mathbf{244}_{02}$, $\mathbf{244}_{03}$, $\mathbf{244}_{12}$, and $\mathbf{244}_{13}$. The select gates $\mathbf{212}_2$ connected to the select lines $\mathbf{218}_{12}$ and $\mathbf{218}_{02}$ and corresponding to the sub-blocks of memory cells $\mathbf{240}_0$ and $\mathbf{240}_1$ of the blocks of memory cells $\mathbf{242}_0$ and $\mathbf{242}_1$ might be programmed to have threshold voltages higher than each remaining select gate $\mathbf{212}_2$ connected to the select lines $\mathbf{218}_{12}$ and $\mathbf{218}_{02}$ and corresponding to the sub-blocks of memory cells $\mathbf{240}_2$ and $\mathbf{240}_3$ of the blocks of memory cells $\mathbf{242}_0$ and $\mathbf{242}_1$. This is indicated by the thick black data storage structures of the select gates $\mathbf{212}_2$ corresponding to the channel material structures $\mathbf{244}_{00}$, $\mathbf{244}_{01}$, $\mathbf{244}_{10}$, and $\mathbf{244}_{11}$. The select gates $\mathbf{212}_1$ connected to the select lines $\mathbf{218}_{11}$ and $\mathbf{218}_{01}$ and corresponding to the sub-blocks of memory cells $\mathbf{240}_1$ and $\mathbf{240}_3$ of the blocks of memory cells $\mathbf{242}_0$ and $\mathbf{242}_1$ might be programmed to have threshold voltages higher than each remaining select gate $\mathbf{212}_1$ connected to the select lines $\mathbf{218}_{11}$ and $\mathbf{218}_{01}$ and corresponding to the sub-blocks of memory cells $\mathbf{240}_0$ and $\mathbf{240}_2$ of the blocks of memory cells $\mathbf{242}_0$ and $\mathbf{242}_1$. This is indicated by the thick black data storage structures of the select gates $\mathbf{212}_1$ corresponding to the channel material structures $\mathbf{244}_{01}$, $\mathbf{244}_{03}$, $\mathbf{244}_{11}$, and $\mathbf{244}_{13}$. And the select gates $\mathbf{212}_0$ connected to the select lines $\mathbf{218}_{10}$ and $\mathbf{218}_{00}$ and corresponding to the sub-blocks of memory cells $\mathbf{240}_0$ and $\mathbf{240}_2$ of the blocks of memory cells $\mathbf{242}_0$ and $\mathbf{242}_1$ might be programmed to have threshold voltages higher than each remaining select gate $\mathbf{212}_0$ connected to the select lines $\mathbf{218}_{10}$ and $\mathbf{218}_{00}$ and corresponding to the sub-blocks of memory cells $\mathbf{240}_1$ and $\mathbf{240}_3$ of the blocks of memory cells $\mathbf{242}_0$ and $\mathbf{242}_1$. This is indicated by the thick black data storage structures of the select gates $\mathbf{212}_0$ corresponding to the channel material structures $\mathbf{244}_{00}$, $\mathbf{244}_{02}$, $\mathbf{244}_{10}$, and $\mathbf{244}_{12}$.

Programming of select gates 212 might utilize an iterative process of applying a programming pulse to a programmable transistor and verifying if that transistor has reached a desired threshold voltage in response to that programming pulse, and repeating that iterative process until that transistor passes the verification. Alternatively, programming of select gates 212 might utilize a single programming pulse having a voltage level configured to increase the threshold voltage above some particular voltage level, e.g., above a voltage level to be used to activate an unprogrammed select gate 212 and deactivate a programmed select gate 212. A voltage level of a programming pulse sufficient to increase the threshold voltage of any select gate 212 above the particular voltage level might, for example, be determined experimentally, empirically or through simulation.

This selective programming of the select gates 212 provides a virtual segmentation on the drain-side of the blocks of memory cells 240 by providing a unique pattern of threshold voltages for each sub-block of memory cells 240 of a block of memory cells 242. For example, if the select gates $\mathbf{212}_3$ corresponding to the sub-blocks of memory cells $\mathbf{240}_3$ and $\mathbf{240}_2$ of the block of memory cells $\mathbf{242}_1$, the select gates $\mathbf{212}_2$ corresponding to the sub-blocks of memory cells $\mathbf{240}_1$ and $\mathbf{240}_0$ of the block of memory cells $\mathbf{242}_1$, the select gates $\mathbf{212}_1$ corresponding to the sub-blocks of memory cells $\mathbf{240}_3$ and $\mathbf{240}_1$ of the block of memory cells $\mathbf{242}_1$, and the select gates $\mathbf{212}_0$ corresponding to the sub-blocks of memory cells $\mathbf{240}_2$ and $\mathbf{240}_0$ of the block of memory cells $\mathbf{242}_1$ are programmed to have positive threshold voltages, e.g., 3V, and the remaining select gates 212 for the block of memory cells $\mathbf{242}_1$ have negative threshold voltages, e.g., −1V, a control signal of 5V applied to the select lines $\mathbf{218}_{13}$ and $\mathbf{218}_{11}$ and control signals of 0V applied to the select lines $\mathbf{218}_{12}$, $\mathbf{218}_{10}$, and $\mathbf{218}_{03}$-$\mathbf{218}_{00}$ could be used to connect the NAND strings 206 of the sub-block of memory cells $\mathbf{240}_3$ of the block of memory cells $\mathbf{242}_1$ to the data line 204, and to isolate the NAND strings 206 of the sub-blocks of memory cells $\mathbf{240}_2$-$\mathbf{240}_0$ of the block of memory cells $\mathbf{242}_1$ and of the sub-blocks of memory cells $\mathbf{240}_3$-$\mathbf{240}_0$ of the block of memory cells $\mathbf{242}_0$ from the data line 204.

Selective programming of the select gates 212 might be facilitated by the use of separate select lines 214 for each sub-block of memory cells 240. For example, the drain select gates 212 might be isolated from the data line 204 by applying a voltage level to the select line 226 configured to deactivate the GG gates 222. In addition, any other transistors between the drain select gates 212 and the data line 204 might also be deactivated to further isolate the drain select gates 212 from the data line 204. By applying a voltage level to the select line $\mathbf{214}_{13}$ configured to activate its source select gate 210, and applying voltage levels to the remaining select lines $\mathbf{214}_{12}$-$\mathbf{214}_{10}$ and $\mathbf{214}_{03}$-$\mathbf{214}_{00}$ configured to deactivate their source select gates 210, drain select gates 212 for the sub-block of memory cells $\mathbf{240}_3$ of the block of memory cells $\mathbf{242}_1$ might be enabled for programming, while the select gates 212 for the sub-blocks of memory cells $\mathbf{240}_2$-$\mathbf{240}_0$ of the block of memory cells $\mathbf{242}_1$ and for the sub-blocks of memory cells $\mathbf{240}_3$-$\mathbf{240}_0$ of the block of memory cells $\mathbf{242}_0$ might be inhibited from programming. Note that applying programming voltages to the select lines $\mathbf{218}_{13}$ and $\mathbf{218}_{11}$ might be performed sequentially or concurrently for embodiments utilizing a single programming voltage expected to increase the threshold voltages. Programming of remaining drain select gates 212 might be performed in a similar manner.

For embodiments sharing a source select line 214 for two or more sub-blocks of memory cells 240, some of the drain select gates 212 could be pre-configured to have a high or low threshold voltage during fabrication, such as by doping of their channels during fabrication such as described in U.S. patent application Ser. No. 17/889,471 to Yoshiaki Fukuzumi et al. filed Aug. 17, 2022. For example, if the drain select transistors $\mathbf{212}_3$ and $\mathbf{212}_2$ for the sub-blocks of memory cells $\mathbf{240}_3$, $\mathbf{240}_2$, $\mathbf{240}_1$, and $\mathbf{240}_0$ of the block of memory cells $\mathbf{242}_1$ were doped during fabrication to have relative threshold voltages of Low/Low, Low/High, High/Low, and High/High, respectively, voltage levels could be applied to the drain select lines $\mathbf{218}_{13}$ and $\mathbf{218}_{12}$ (e.g., Low and High control signals, respectively) configured to permit enabling programming of the drain select gates $\mathbf{212}_1$ of the sub-blocks of memory cells $\mathbf{240}_3$ and $\mathbf{240}_2$ of the block of memory cells $\mathbf{242}_1$, and configured to inhibit programming of the drain select gates $\mathbf{212}_1$ of the sub-blocks of memory cells $\mathbf{240}_1$ and $\mathbf{240}_0$ of the block of memory cells $\mathbf{242}_1$ in response to a programming voltage applied to the drain select line $\mathbf{218}_{11}$. Similarly, voltage levels could be applied to the drain select lines $\mathbf{218}_{13}$ and $\mathbf{218}_{12}$ (e.g., High and Low control signals, respectively) and to the drain select line $\mathbf{218}_{11}$ (e.g., a Low control signal) configured to permit enabling programming of the drain select gates $\mathbf{212}_0$ of the sub-blocks of memory cells $\mathbf{240}_1$ and $\mathbf{240}_0$ of the block of memory cells $\mathbf{242}_1$, and configured to inhibit programming of the drain select gates $\mathbf{212}_0$ of the sub-blocks of memory cells $\mathbf{240}_3$ and $\mathbf{240}_2$ of the block of memory cells $\mathbf{242}_1$ in response to a programming voltage applied to the drain select line $\mathbf{218}_{10}$. In this manner, the drain select transistors $\mathbf{212}_1$ and $\mathbf{212}_0$ for the sub-blocks of memory cells $\mathbf{240}_3$, $\mathbf{240}_2$, $\mathbf{240}_1$, and $\mathbf{240}_0$ of the block of memory cells $\mathbf{242}_1$ could be programmed to have relative threshold voltages of High/High, High/Low, Low/High, and Low/Low, respectively. This would permit connection of a NAND string 206 of a single sub-block of memory cells 240 of the block of memory cells $\mathbf{242}_1$ to the data line 204 for subsequent access operations even if the source select lines $\mathbf{214}_{13}$, $\mathbf{214}_{12}$, $\mathbf{214}_{11}$, and $\mathbf{214}_{10}$ were commonly connected.

Figure 3:
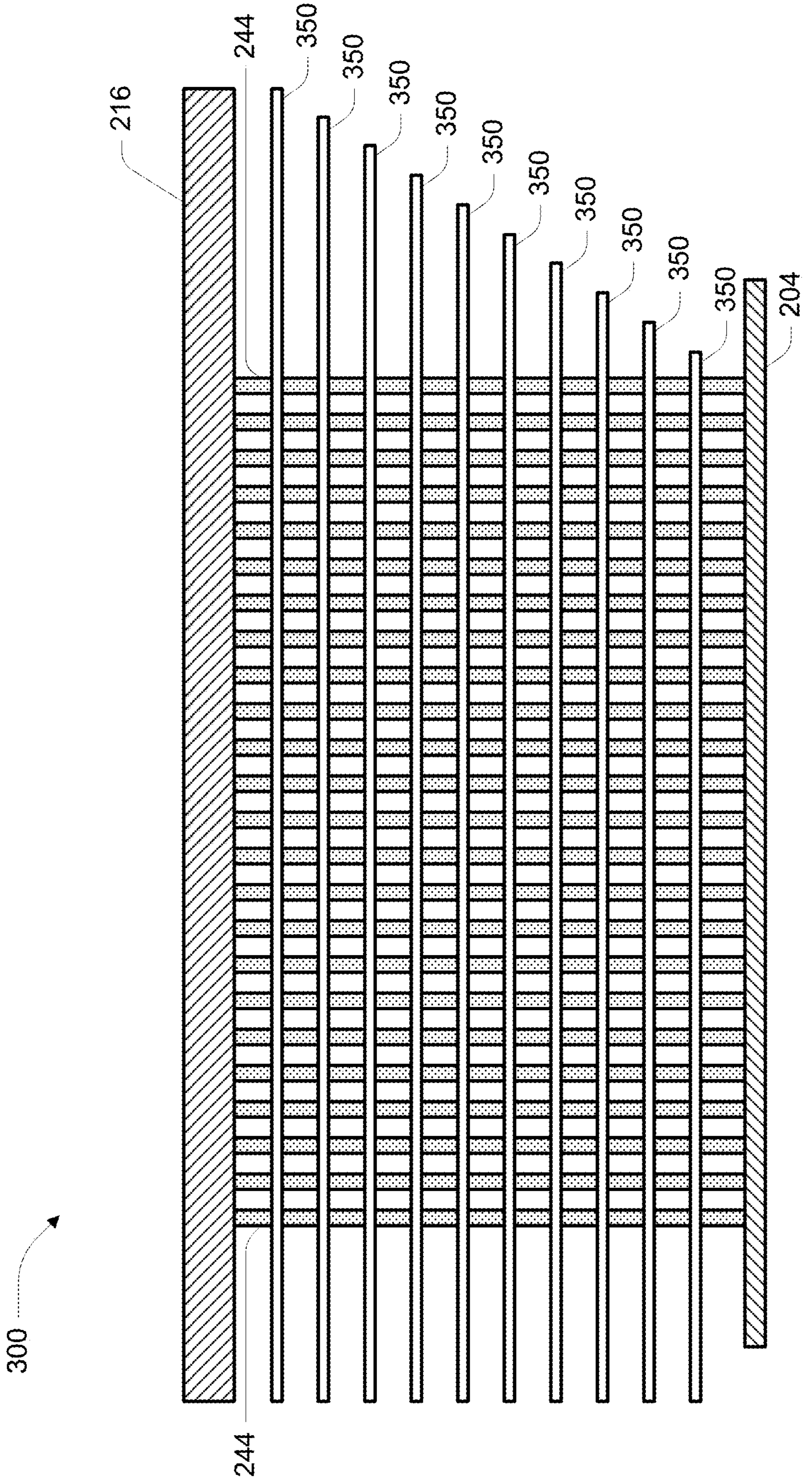
FIG. 3 Related Art
FIG. 3 conceptually depicts a memory array structure of the related art.

FIG. 3 conceptually depicts a memory array structure 300 of the related art. As depicted, the memory array structure 300 includes a data line 204 and a common source 216. Channel material structures 244 might be connected between the data line 204 and the common source 216. The memory array structure 300 further includes conductors 350, which might represent control lines for GG gates, select lines for drain and source select gates, access lines for memory cells, and control lines for any other transistors that might be utilized between the data line 204 and common source 216. Transistors, e.g., GG gates, select gates, memory cells, etc., might be formed at each intersection of a channel material structure 244 and a conductor 350.

Figure 4A:
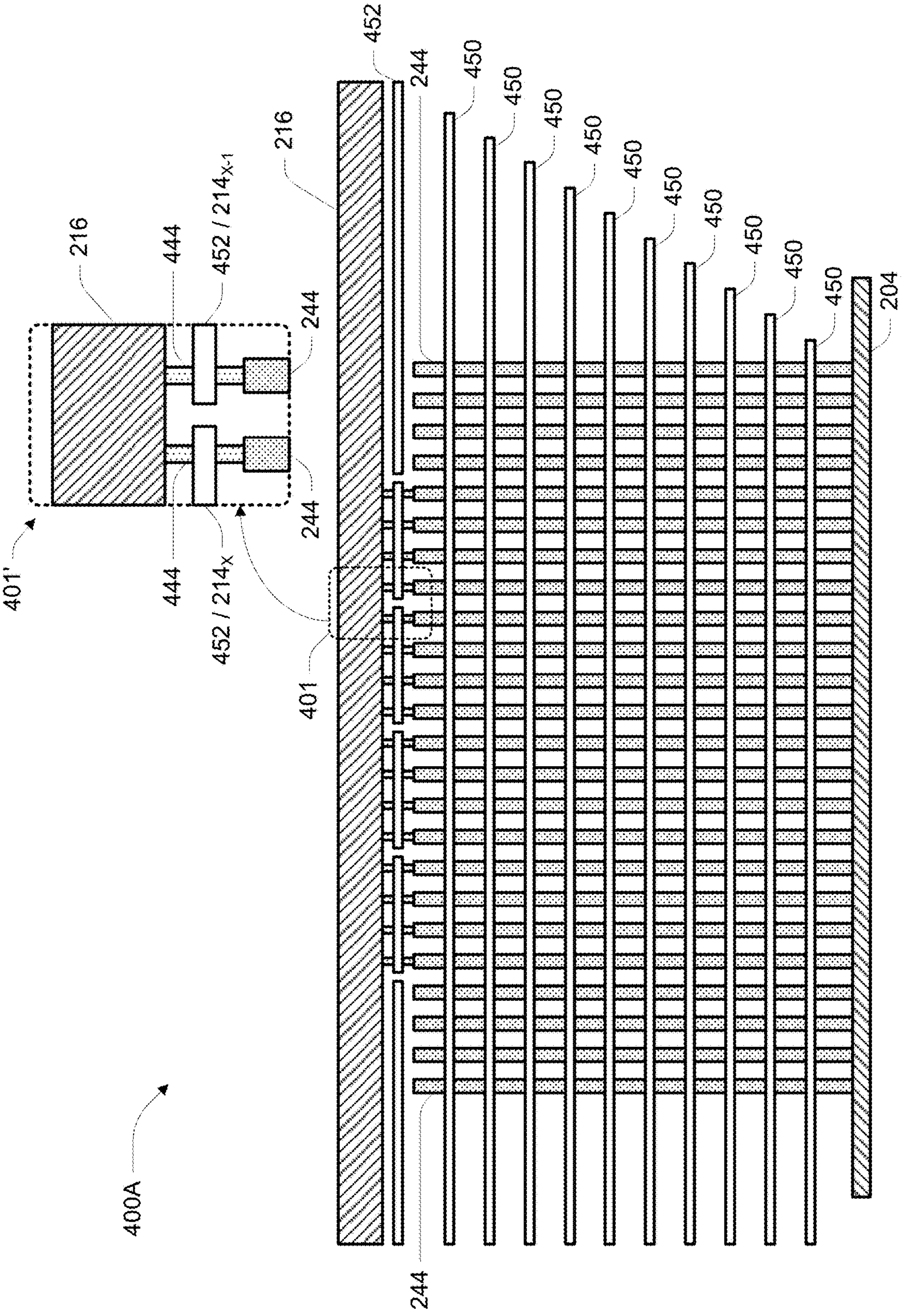
FIGS. 4A-4B conceptually depict memory array structures in accordance with embodiments.

FIG. 4A conceptually depicts a memory array structure 400A in accordance with an embodiment. As depicted, the memory array structure 400A includes a data line 204 and a common source 216. Channel material structures 244, e.g., first channel material structures, might be connected between the data line 204 and second channel material structures 444. Each second channel material structures 444 might be devoid of memory cells between the common source 216 and a respective first channel material structure 244. The second channel material structures 444 might be connected to the common source 216. The first channel material structures 244 might have a different structure than the second channel material structures 444. For example, the first channel material structures 244 might be hollow while the second channel material structures 444 might be solid. As a result of different lengths, the first channel material structures 244 might have larger diameters than the second channel material structures 444 in order to facilitate practicable aspect ratios, e.g., length:diameter, during fabrication. The enlarged section 401' of the section 401 provides detail of such a difference. The memory array structure 400A further includes conductors 450 and one or more conductors 452.

The conductors 452 might represent select lines 214 for source select gates. The conductors 452 might be segmented as depicted, and as will be described in more detail with reference to subsequent figures. Although only one tier of conductors 452 is depicted in FIG. 4A, additional tiers of conductors 452 could be used. For example, multiple source select gates could be connected in series. Alternatively, or in addition, extra tiers of conductors 452 might represent control lines for source GG gates. Transistors, e.g., GG gates, select gates, etc., might be formed at each intersection of a second channel material structure 444 and a conductor 452.

The conductors 450 might represent control lines for drain GG gates, select lines for drain select gates, access lines for memory cells, and/or control lines for other transistors that might be utilized between the data line 204 and the second channel material structure 444. Transistors, e.g., GG gates, select gates, memory cells, etc., might be formed at each intersection of a first channel material structure 244 and a conductor 450.

Figure 4B:
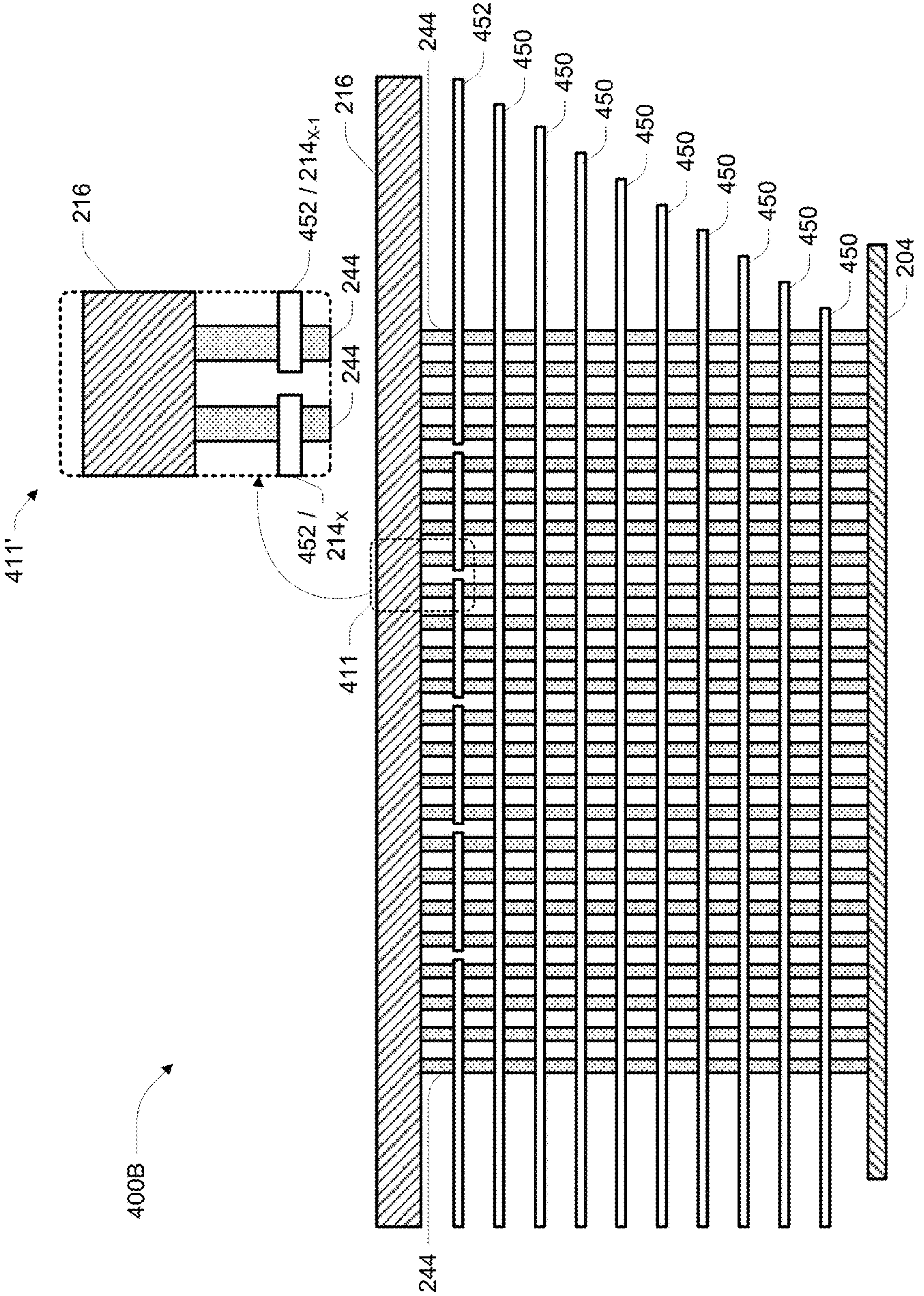

FIG. 4B conceptually depicts a memory array structure 400B in accordance with another embodiment. As depicted, the memory array structure 400B includes a data line 204 and a common source 216. Channel material structures 244 might be connected between the data line 204 and the common source 216. The memory array structure 400B further includes conductors 450 and one or more conductors 452.

The conductors 452 might represent select lines 214 for source select gates. The conductors 452 might be segmented as depicted, and as will be described in more detail with reference to subsequent figures. The enlarged section 411' of the section 411 provides detail of the segmentation. Although only one tier of conductors 452 is depicted in FIG. 4B, additional tiers of conductors 452 could be used. For example, multiple source select gates could be connected in series. Alternatively, or in addition, extra tiers of conductors 452 might represent control lines for source GG gates. Transistors, e.g., GG gates, select gates, etc., might be formed at each intersection of a channel material structure 244 and a conductor 452.

The conductors 450 might represent control lines for drain GG gates, select lines for drain select gates, access lines for memory cells, and/or control lines for other transistors that might be utilized between the data line 204 and the common source 216. Transistors, e.g., GG gates, select gates, memory cells, etc., might be formed at each intersection of a channel material structure 244 and a conductor 450.

Figure 5A:
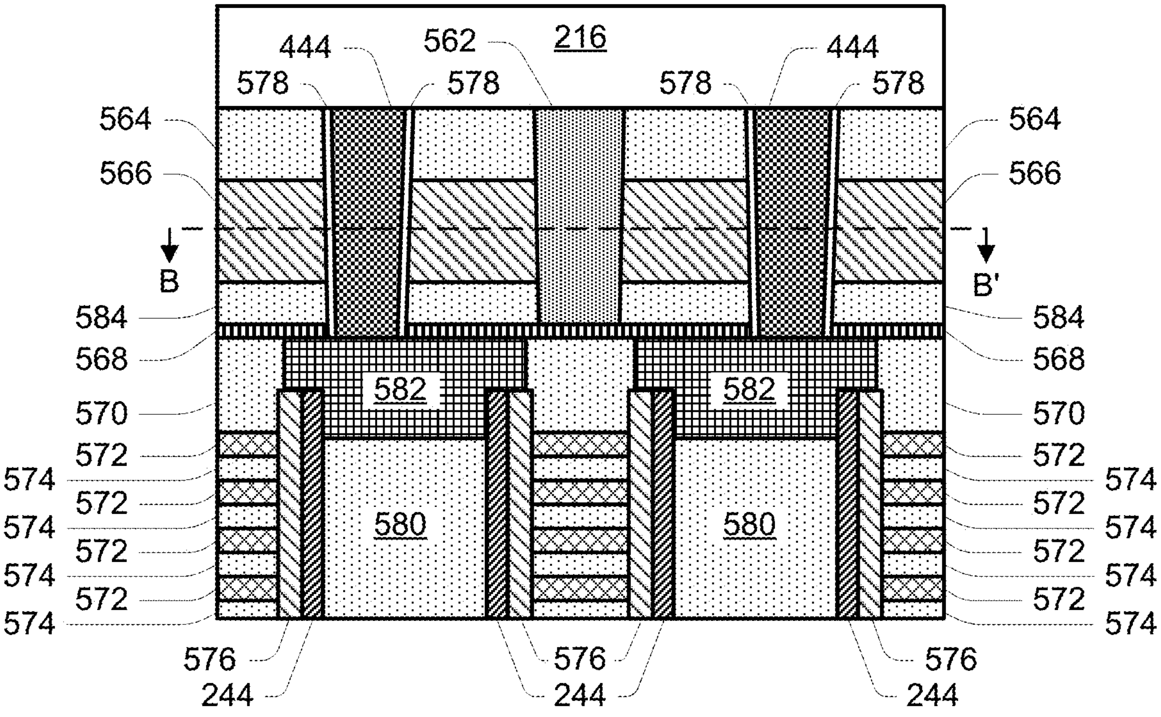
FIGS. 5A-5B depict a cross-sectional view and a top view, respectively, of a portion of a memory array structure in accordance with an embodiment.
Figure 5B:
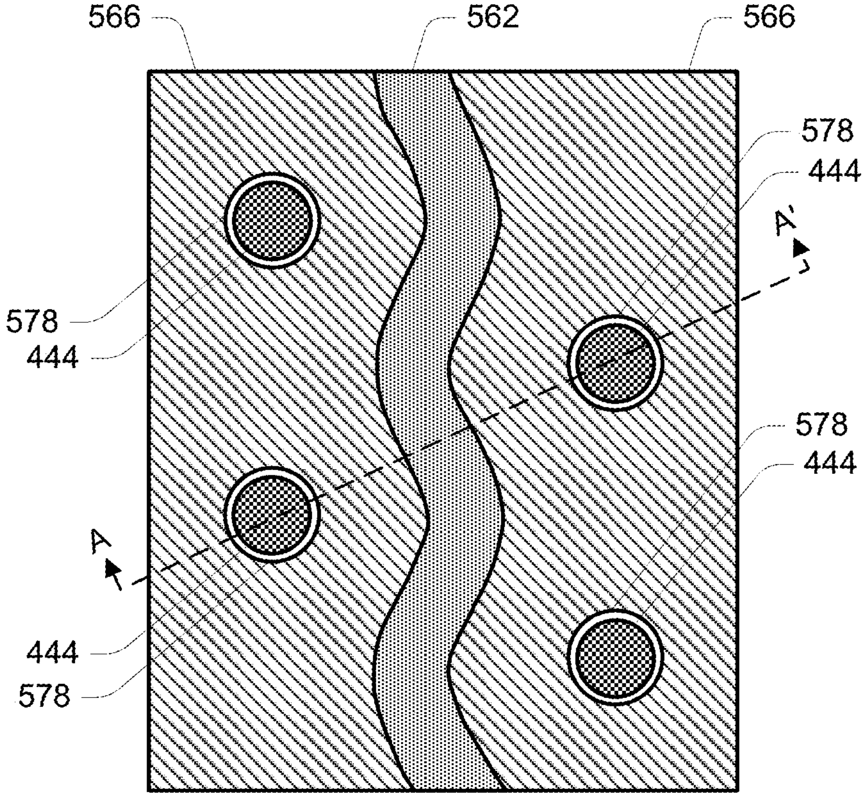

FIGS. 5A-5B depict a cross-sectional view and a top view, respectively, of a portion of a memory array structure in accordance with an embodiment. FIG. 5A represents a cross-sectional view of the portion of the memory array structure of FIG. 5B taken along line A-A'. FIG. 5B represents a top view of the portion of the memory array structure of FIG. 5A taken along line B-B'. The embodiment of FIGS. 5A-5B might correspond to the memory array structure 400A of FIG. 4A, where the conductor 566 might correspond to the conductor 452 of FIG. 4A.

FIGS. 5A-5B collectively depict a portion of a memory array structure having a number of instances of gate structures 572 isolated from one another by instances of dielectric 574. The gate structures 572 include a conductor acting as a control gate of a transistor, e.g., memory cell, select gate, GG gate, etc. The conductor of a gate structure 572 might contain one or more conductive materials. The conductor of the gate structure 572 might comprise, consist of, or consist essentially of a conductively-doped semiconductor material, such as conductively-doped polysilicon. Alternatively or in addition, the conductor of the gate structure 572 might comprise, consist of, or consist essentially of metal, such as a refractory metal, or a metal-containing material, such as a refractory metal silicide or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

The gate structures 572 might further include a dielectric acting as a charge block. The dielectric of a gate structure 572 might contain one or more high-K dielectric materials. High-K dielectric materials as used herein means a material having a dielectric constant greater than that of silicon dioxide. For example, the dielectric of a gate structure 572 might comprise, consist of, or consist essentially of silicon nitride ($Si_3N_4$), an aluminum oxide ($AlO_x$), a hafnium oxide ($HfO_x$), a lanthanum oxide ($LaO_x$), scandium(III) oxide ($Sc_2O_3$), a tantalum oxide ($TaO_x$), a zirconium oxide ($ZrO_x$), an aluminum hafnium oxide ($AlHfO_x$), an aluminum zirconium oxide ($AlZrO_x$), a hafnium silicon oxide ($HfSiO_x$), a hafnium zirconium oxide ($HfZrO_x$), a hafnium aluminum zirconium oxide ($HfAlZrO_x$), or yttrium(III) oxide ($Y_2O_3$), as well as any other high-K dielectric material.

The instances of the gate structures 572 and the dielectric 574 might be formed to surround data storage structures 576, which each might be formed to surround a channel material structure 244. The data storage structures 576 are configured to permit programming of their transistors, e.g., through the selective storage of different levels of charge (e.g., electrons) in a charge storage node of a data storage structure 576 that might be used to change the threshold voltage of its transistor. The materials of the data storage structures 576 will be described in more detail with respect to FIG. 6C, but generally comprise a gate dielectric adjacent the channel material structure 244, a charge blocking dielectric adjacent the instances of the gate structures 572 and dielectric 574, and a charge storage node between its gate dielectric and its charge blocking dielectric. The materials of the channel material structures 244 will be described in more detail with respect to FIG. 6E, but generally comprise a conductively-doped semiconductor material.

The data storage structures 576 and the channel material structures 244 might be hollow structures that might be filled (e.g., at least partially filled) with a dielectric 580. The dielectric 580 might contain one or more dielectric materials. The dielectric 580 might comprise, consist of, or consist essentially of an oxide, e.g., silicon dioxide ($SiO_2$). The dielectric 580 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 580 might further comprise, consist of, or consist essentially of any other dielectric material. The dielectric 580 might contain one or more dielectric materials that can be selectively removed without adversely affecting the materials of the instances of the dielectric 574, the materials of the data storage structures 576, and the materials of the channel material structures 244.

A dielectric 570 might be formed overlying the instances of the gate structures 572, the instances of the dielectric 574, the data storage structures 576, the channel material structures 244, and the dielectric 580. The dielectric 570 might contain one or more dielectric materials such as described with reference to the dielectric 574, the dielectric of the gate structures 572, and/or the dielectric 580. The dielectric 570 might include an instance of a dielectric 574 on which it was formed. Conductive plugs 582 might be formed in the dielectric 570 to be electrically connected to respective channel material structures 244. For example, vias (e.g., defined by the areas for forming the conductive plugs 582) might be formed through the dielectric 570, and one or more conductive materials might be formed (e.g., deposited) in the vias. The conductive plugs 582 might be in direct electrical contact with the channel material structures 244 with no intervening circuit elements. A bottom surface of a conductive plug 582 might extend below a top surface of its corresponding channel material structure 244. For example, a conductive plug 582 might be in physical contact with the top surface of its corresponding channel material structure 244, and further might be in physical contact with sidewalls (e.g., inner sidewalls) of its corresponding channel material structure 244. This might provide improved electrical conduction properties between a common source 216 and a channel material structure 244 over traditional source-side connections.

A dielectric 568 might optionally be formed overlying the dielectric 570 and the conductive plugs 582. The dielectric 568 might contain one or more dielectric materials such as described with reference to the dielectric 574, the dielectric of the gate structures 572, and/or the dielectric 580. The dielectric 568 might act as an etch-stop layer.

A dielectric 584 might be formed overlying the dielectric 568. The dielectric 584 might contain one or more dielectric materials such as described with reference to the dielectric 574, the dielectric of the gate structures 572, and/or the dielectric 580. The dielectric 584 might contain a different dielectric material(s) than the dielectric 568, such that portions of the dielectric 584 could be removed without removing the dielectric 568, e.g., without exposing the dielectric 570.

A conductor 566 might be formed overlying the dielectric 584. The conductor 566 might contain one or more conductive materials such as described with reference to the conductor of the gate structure 572. A dielectric 564 might be formed overlying the conductor 566. The dielectric 564 might contain one or more dielectric materials such as described with reference to the dielectric 574, the dielectric of the gate structures 572, and/or the dielectric 580.

Channel material structures 444 might be formed through the dielectric 564, the conductor 566, the dielectric 584, and the dielectric 568 to be in contact with respective conductive plugs 582. The channel material structures 444 might thus be connected to respective channel material structures 244, e.g., through respective conductive plugs 582. The materials of the channel material structures 444 will be described in more detail with respect to FIG. 7I but generally comprise a conductively-doped semiconductor material. A gate dielectric 578 might be formed to be between a channel material structure 444 and the conductor 566. The conductor 566, gate dielectric 578, and channel material structure 444 might form a transistor, e.g., a source-select gate. This transistor might be devoid of a data storage structure, and might thus be non-programmable. Although only one conductor 566 is depicted in FIG. 5A, additional conductors might be formed to surround the channel material structures 444 to provide multiple source-select gates or other transistors (e.g., GG gates) connected in series.

Isolation structure 562 might be formed through the dielectric 564 and the conductor 566. A bottom surface of the isolation structure 562 might extend below a bottom surface of the conductor 566. The isolation structure 562 might further extend to be in contact with the dielectric 568 as depicted, and might further extend into the dielectric 570. The isolation structure 562 might contain one or more dielectric materials such as described with reference to the dielectric 574, the dielectric of the gate structures 572, and/or the dielectric 580. An isolation structure 562 might be formed between a pair of adjacent (e.g., immediately adjacent) channel material structures 444, and might isolate a portion of the conductor 566 on one side of the isolation structure 562 from a portion of the conductor 566 on the other side of the isolation structure 562. For example, an isolation structure 562 might be formed between adjacent channel material structures 444 for different blocks of memory cells. Alternatively, or in addition, an isolation structure 562 might be formed between each pair of adjacent (e.g., immediately adjacent) channel material structures 444. For example, an isolation structure 562 might be formed between adjacent channel material structures 444 for each sub-block of memory cells for each block of memory cells.

The isolation structure 562 isolates portions of the conductor 566 into separate control lines. For example, the portion of the conductor 566 to the left of the isolation structure 562 might correspond to a control line for one sub-block of memory cells, e.g., the select line $\mathbf{214}_X$ of FIG. 4B, while the portion of the conductor 566 to the right of the isolation structure 562 might correspond to a control line for a different sub-block of memory cells, e.g., the select line $\mathbf{214}_{X-1}$ of FIG. 4B. Source-side segmentation of sub-blocks of memory cells facilitates advantages during operation over structures using only drain-side segmentation. For example, the ability to selectively electrically float the bodies of some sub-blocks of memory cells can reduce loading on access lines and other control lines during access of other sub-blocks of memory cells, thus enabling lower RC values which can result in power savings and improved access speeds.

The common source 216 might be formed overlying the dielectric 564, the channel material structures 444, and the isolation structure 562. The common source 216 might thus be connected to the channel material structures 444, e.g., directly connected. The common source 216 might contain one or more conductive materials such as described with reference to the conductor of the gate structure 572. As one example, the common source 216 might contain conductively-doped polysilicon.

Figure 5C:
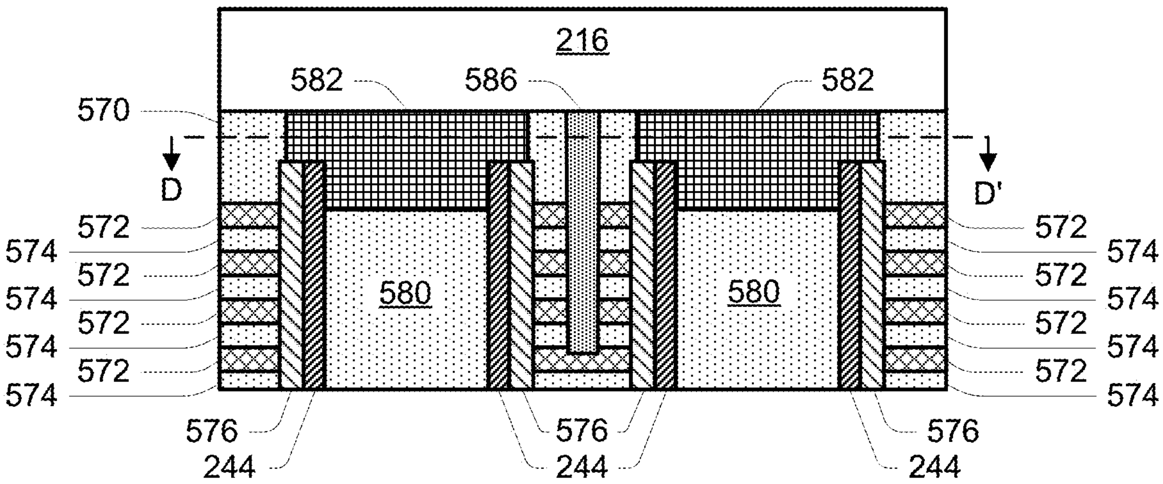
FIGS. 5C-5D depict a cross-sectional view and a top view, respectively, of a portion of a memory array structure in accordance with another embodiment.
Figure 5D:
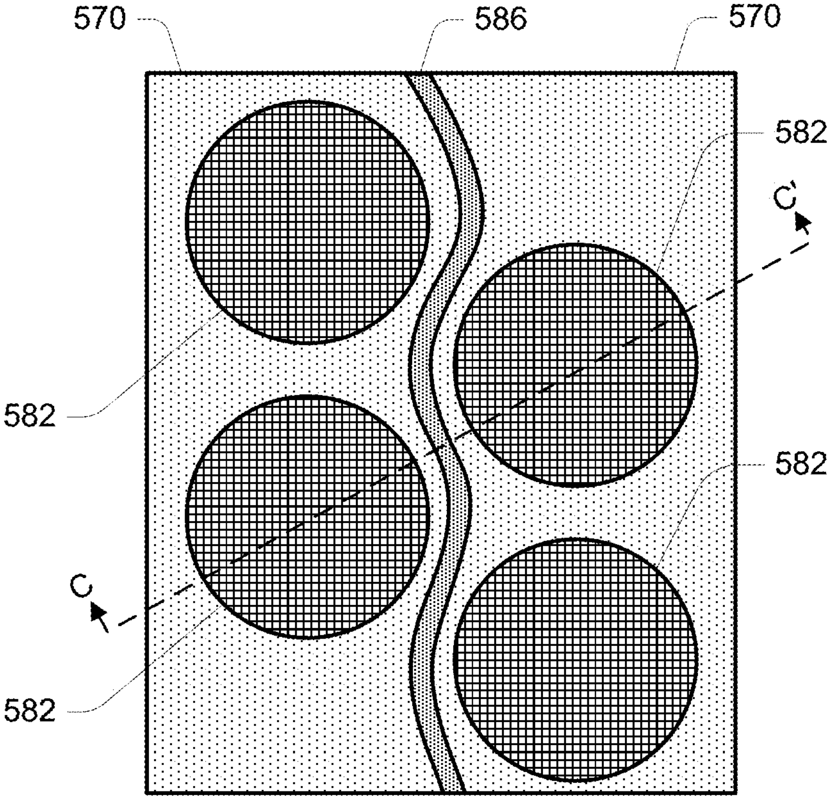

FIGS. 5C-5D depict a cross-sectional view and a top view, respectively, of a portion of a memory array structure in accordance with another embodiment. FIG. 5C represents a cross-sectional view of the portion of the memory array structure of FIG. 5D taken along line C-C'. FIG. 5D represents a top view of the portion of the memory array structure of FIG. 5C taken along line D-D'. The embodiment of FIGS. 5C-5D might correspond to the memory array structure 400B of FIG. 4B, where the instances of the gate structure 572 separated by the isolation structure 586 might each correspond to a conductor 452 of FIG. 4B.

Like numbered elements in FIGS. 5C-5D correspond to the description as provided with respect to FIGS. 5A-5B. The embodiment of FIGS. 5C-5D differs from the embodiment of FIGS. 5A-5B in that the common source 216 might be formed to be in contact with the conductive plugs 582, and an isolation structure 586 might be formed to extend through the dielectric 570 and at least one instance of a gate structure 572. The isolation structure 586 might contain one or more dielectric materials as described with reference to the isolation structure 562 of FIGS. 5A-5B.

FIGS. 5C-5D collectively depict a portion of a memory array structure having a number of instances of gate structures 572 isolated from one another by instances of dielectric 574. The gate structures 572 include a conductor acting as a control gate of a transistor, e.g., memory cell, select gate, GG gate, etc. The conductor of a gate structure 572 might contain one or more conductive materials. The conductor of the gate structure 572 might comprise, consist of, or consist essentially of a conductively-doped semiconductor material, such as conductively-doped polysilicon. Alternatively or in addition, the conductor of the gate structure 572 might comprise, consist of, or consist essentially of metal, such as a refractory metal, or a metal-containing material, such as a refractory metal silicide or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

The gate structures 572 might further include a dielectric acting as a charge block. The dielectric of a gate structure 572 might contain one or more high-K dielectric materials. High-K dielectric materials as used herein means a material having a dielectric constant greater than that of silicon dioxide. For example, the dielectric of a gate structure 572 might comprise, consist of, or consist essentially of silicon nitride ($Si_3N_4$), an aluminum oxide ($AlO_x$), a hafnium oxide ($HfO_x$), a lanthanum oxide ($LaO_x$), scandium(III) oxide ($Sc_2O_3$), a tantalum oxide ($TaO_x$), a zirconium oxide ($ZrO_x$), an aluminum hafnium oxide ($AlHfO_x$), an aluminum zirconium oxide ($AlZrO_x$), a hafnium silicon oxide ($HfSiO_x$), a hafnium zirconium oxide ($HfZrO_x$), a hafnium aluminum zirconium oxide ($HfAlZrO_x$), or yttrium(III) oxide ($Y_2O_3$), as well as any other high-K dielectric material.

The instances of the gate structures 572 and the dielectric 574 might be formed to surround data storage structures 576, which each might be formed to surround a channel material structure 244. The materials of the data storage structures 576 will be described in more detail with respect to FIG. 6C, but generally comprise a gate dielectric adjacent the channel material structure 244, a charge blocking dielectric adjacent the instances of the gate structures 572 and dielectric 574, and a charge storage node between its gate dielectric and its charge blocking dielectric. The materials of the channel material structures 244 will be described in more detail with respect to FIG. 6E, but generally comprise a conductively-doped semiconductor material.

The data storage structures 576 and the channel material structures 244 might be hollow structures that might be filled (e.g., at least partially filled) with a dielectric 580. The dielectric 580 might contain one or more dielectric materials. The dielectric 580 might comprise, consist of, or consist essentially of an oxide, e.g., silicon dioxide ($SiO_2$). The dielectric 580 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 580 might further comprise, consist of, or consist essentially of any other dielectric material. The dielectric 580 might contain one or more dielectric materials that can be selectively removed without adversely affecting the materials of the instances of the dielectric 574, the materials of the data storage structures 576, and the materials of the channel material structures 244.

A dielectric 570 might be formed overlying the instances of the gate structures 572, the instances of the dielectric 574, the data storage structures 576, the channel material structures 244, and the dielectric 580. The dielectric 570 might contain one or more dielectric materials such as described with reference to the dielectric 574, the dielectric of the gate structures 572, and/or the dielectric 580. The dielectric 570 might include an instance of a dielectric 574 on which it was formed. Conductive plugs 582 might be formed in the dielectric 570 to be in electrical contact with respective channel material structures 244.

Isolation structure 586 might be formed to extend through the dielectric 570 and at least one instance of a gate structure 572. A bottom surface of the isolation structure 586 might extend below a bottom surface of at least one gate structure 572. The isolation structure 586 might further extend through one or more additional instances of the gate structures 572 and instances of the dielectric 574. For example, as depicted in FIG. 5C, the isolation structure 586 further extends through three instances of the gate structures 572 and three instances of the dielectric 574, and further has a bottom surface extending into a fourth instance of the gate structure 572. The isolation structure 586 might contain one or more dielectric materials such as described with reference to the dielectric 574, the dielectric of the gate structures 572, and/or the dielectric 580. This isolation of different portions of the instances of the gate structures 572 facilitates independent control of source select gates for different sub-blocks of memory cells.

An isolation structure 586 might be formed between a pair of adjacent (e.g., immediately adjacent) channel material structures 244, and might isolate portions of the gate structures 685 on one side of the isolation structure 586 from portions of the gate structures 685 on the other side of the isolation structure 586. For example, an isolation structure 586 might be formed between adjacent channel material structures 244 for different blocks of memory cells. Alternatively, or in addition, an isolation structure 586 might be formed between each pair of adjacent (e.g., immediately adjacent) channel material structures 244. For example, an isolation structure 586 might be formed between adjacent channel material structures 244 for each sub-block of memory cells for each block of memory cells.

The common source 216 might be formed overlying the dielectric 570, the conductive plugs 582, and the isolation structure 586. The common source 216 might thus be connected to the channel material structures, e.g., directly connected. The common source 216 might contain one or more conductive materials such as described with reference to the conductor of the gate structure 572. As one example, the common source 216 might contain conductively-doped polysilicon.

Figure 5E:
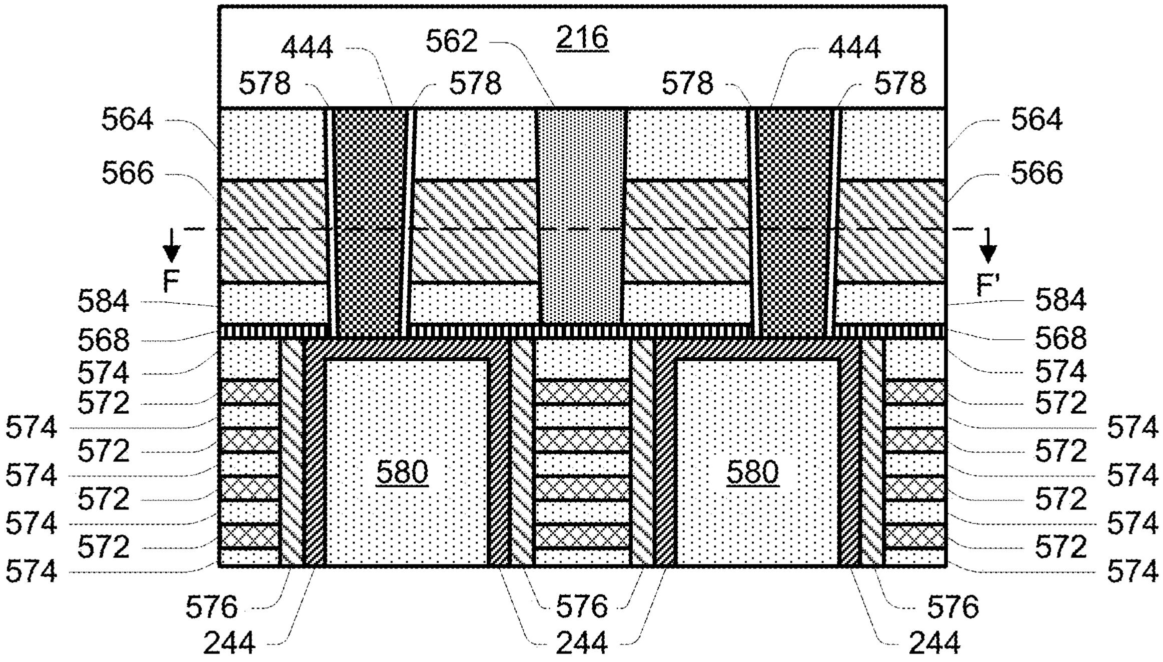
FIGS. 5E-5F depict a cross-sectional view and a top view, respectively, of a portion of a memory array structure in accordance with a further embodiment.
Figure 5F:
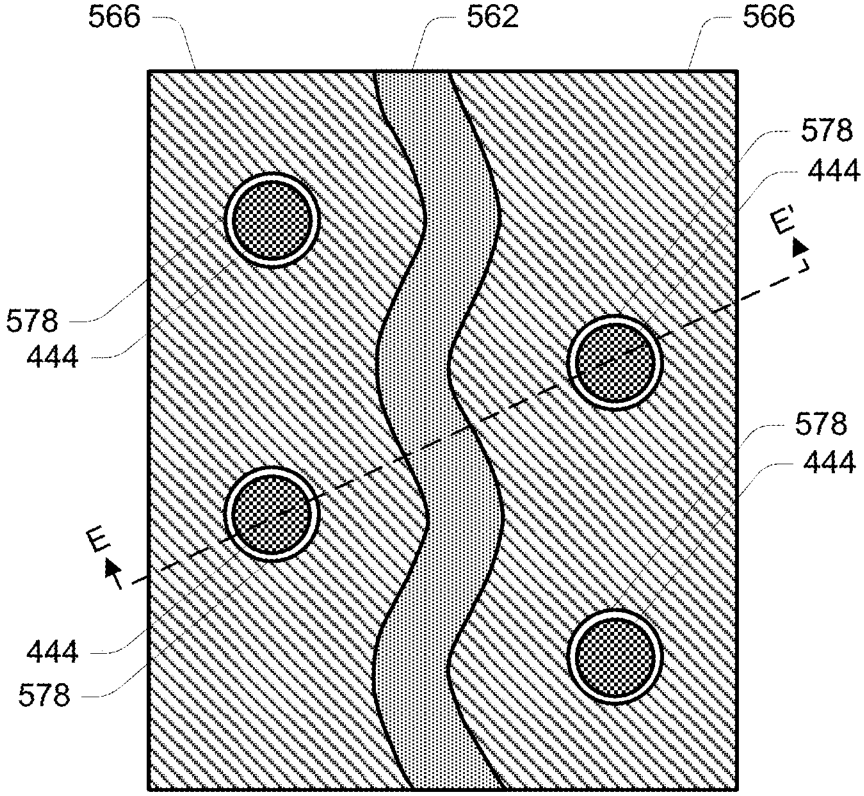

FIGS. 5E-5F depict a cross-sectional view and a top view, respectively, of a portion of a memory array structure in accordance with an embodiment. FIG. 5E represents a cross-sectional view of the portion of the memory array structure of FIG. 5F taken along line E-E'. FIG. 5F represents a top view of the portion of the memory array structure of FIG. 5E taken along line F-F'. The embodiment of FIGS. 5E-5F might correspond to the memory array structure 400A of FIG. 4A, where the conductor 566 might correspond to the conductor 452 of FIG. 4A.

FIGS. 5E-5F collectively depict a portion of a memory array structure having a number of instances of gate structures 572 isolated from one another by instances of dielectric 574. The gate structures 572 include a conductor acting as a control gate of a transistor, e.g., memory cell, select gate, GG gate, etc. The conductor of a gate structure 572 might contain one or more conductive materials. The conductor of the gate structure 572 might comprise, consist of, or consist essentially of a conductively-doped semiconductor material, such as conductively-doped polysilicon. Alternatively or in addition, the conductor of the gate structure 572 might comprise, consist of, or consist essentially of metal, such as a refractory metal, or a metal-containing material, such as a refractory metal silicide or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

The gate structures 572 might further include a dielectric acting as a charge block. The dielectric of a gate structure 572 might contain one or more high-K dielectric materials. High-K dielectric materials as used herein means a material having a dielectric constant greater than that of silicon dioxide. For example, the dielectric of a gate structure 572 might comprise, consist of, or consist essentially of silicon nitride ($Si_3N_4$), an aluminum oxide ($AlO_x$), a hafnium oxide ($HfO_x$), a lanthanum oxide ($LaO_x$), scandium(III) oxide ($Sc_2O_3$), a tantalum oxide ($TaO_x$), a zirconium oxide ($ZrO_x$), an aluminum hafnium oxide ($AlHfO_x$), an aluminum zirconium oxide ($AlZrO_x$), a hafnium silicon oxide ($HfSiO_x$), a hafnium zirconium oxide ($HfZrO_x$), a hafnium aluminum zirconium oxide ($HfAlZrO_x$), or yttrium(III) oxide ($Y_2O_3$), as well as any other high-K dielectric material.

The instances of the gate structures 572 and the dielectric 574 might be formed to surround data storage structures 576, which each might be formed to surround a channel material structure 244. The data storage structures 576 are configured to permit programming of their transistors, e.g., through the selective storage of different levels of charge (e.g., electrons) in a charge storage node of a data storage structure 576 that might be used to change the threshold voltage of its transistor. The materials of the data storage structures 576 will be described in more detail with respect to FIG. 6C, but generally comprise a gate dielectric adjacent the channel material structure 244, a charge blocking dielectric adjacent the instances of the gate structures 572 and dielectric 574, and a charge storage node between its gate dielectric and its charge blocking dielectric. The materials of the channel material structures 244 will be described in more detail with respect to FIG. 6E, but generally comprise a conductively-doped semiconductor material.

The data storage structures 576 and the channel material structures 244 might be hollow structures that might be filled (e.g., at least partially filled) with a dielectric 580. The dielectric 580 might contain one or more dielectric materials. The dielectric 580 might comprise, consist of, or consist essentially of an oxide, e.g., silicon dioxide ($SiO_2$). The dielectric 580 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 580 might further comprise, consist of, or consist essentially of any other dielectric material. The dielectric 580 might contain one or more dielectric materials that can be selectively removed without adversely affecting the materials of the instances of the dielectric 574, the materials of the data storage structures 576, and the materials of the channel material structures 244.

A dielectric 568 might optionally be formed overlying the dielectric 574, the data storage structures 576, and the channel material structures 244. The dielectric 568 might contain one or more dielectric materials such as described with reference to the dielectric 574, the dielectric of the gate structures 572, and/or the dielectric 580. The dielectric 568 might act as an etch-stop layer.

A dielectric 584 might be formed overlying the dielectric 568. The dielectric 584 might contain one or more dielectric materials such as described with reference to the dielectric 574, the dielectric of the gate structures 572, and/or the dielectric 580. The dielectric 584 might contain a different dielectric material(s) than the dielectric 568, such that portions of the dielectric 584 could be removed without removing the dielectric 568, e.g., without exposing the uppermost instance of dielectric 574.

A conductor 566 might be formed overlying the dielectric 584. The conductor 566 might contain one or more conductive materials such as described with reference to the conductor of the gate structure 572. A dielectric 564 might be formed overlying the conductor 566. The dielectric 564 might contain one or more dielectric materials such as described with reference to the dielectric 574, the dielectric of the gate structures 572, and/or the dielectric 580.

Channel material structures 444 might be formed through the dielectric 564, the conductor 566, the dielectric 584, and the dielectric 568 to be in contact with respective channel material structures 244. The channel material structures 444 might thus be connected to respective channel material structures 244, e.g., directly connected. The materials of the channel material structures 444 will be described in more detail with respect to FIG. 7I but generally comprise a conductively-doped semiconductor material. A gate dielectric 578 might be formed to be between a channel material structure 444 and the conductor 566. The conductor 566, gate dielectric 578, and channel material structure 444 might form a transistor, e.g., a source-select gate. This transistor might be devoid of a data storage structure, and might thus be non-programmable. Although only one conductor 566 is depicted in FIG. 5E, additional conductors might be formed to surround the channel material structures 444 to provide multiple source-select gates or other transistors (e.g., GG gates) connected in series.

Isolation structure 562 might be formed through the dielectric 564 and the conductor 566. A bottom surface of the isolation structure 562 might extend below a bottom surface of the conductor 566. The isolation structure 562 might further extend to be in contact with the dielectric 568 as depicted, and might further extend into the dielectric 570. The isolation structure 562 might contain one or more dielectric materials such as described with reference to the dielectric 574, the dielectric of the gate structures 572, and/or the dielectric 580. An isolation structure 562 might be formed between a pair of adjacent (e.g., immediately adjacent) channel material structures 444, and might isolate a portion of the conductor 566 on one side of the isolation structure 562 from a portion of the conductor 566 on the other side of the isolation structure 562. For example, an isolation structure 562 might be formed between adjacent channel material structures 444 for different blocks of memory cells. Alternatively, or in addition, an isolation structure 562 might be formed between each pair of adjacent (e.g., immediately adjacent) channel material structures 444. For example, an isolation structure 562 might be formed between adjacent channel material structures 444 for each sub-block of memory cells for each block of memory cells.

The isolation structure 562 isolates portions of the conductor 566 into separate control lines. For example, the portion of the conductor 566 to the left of the isolation structure 562 might correspond to a control line for one sub-block of memory cells, e.g., the select line $\mathbf{214}_X$ of FIG. 4B, while the portion of the conductor 566 to the right of the isolation structure 562 might correspond to a control line for a different sub-block of memory cells, e.g., the select line $\mathbf{214}_{X-1}$ of FIG. 4B. Source-side segmentation of sub-blocks of memory cells facilitates advantages during operation over structures using only drain-side segmentation. For example, the ability to selectively electrically float the bodies of some sub-blocks of memory cells can reduce loading on access lines and other control lines during access of other sub-blocks of memory cells, thus enabling lower RC values which can result in power savings and improved access speeds.

The common source 216 might be formed overlying the dielectric 564, the channel material structures 444, and the isolation structure 562. The common source 216 might thus be connected to the channel material structures 444, e.g., directly connected. The common source 216 might contain one or more conductive materials such as described with reference to the conductor of the gate structure 572. As one example, the common source 216 might contain conductively-doped polysilicon.

Figure 5G:
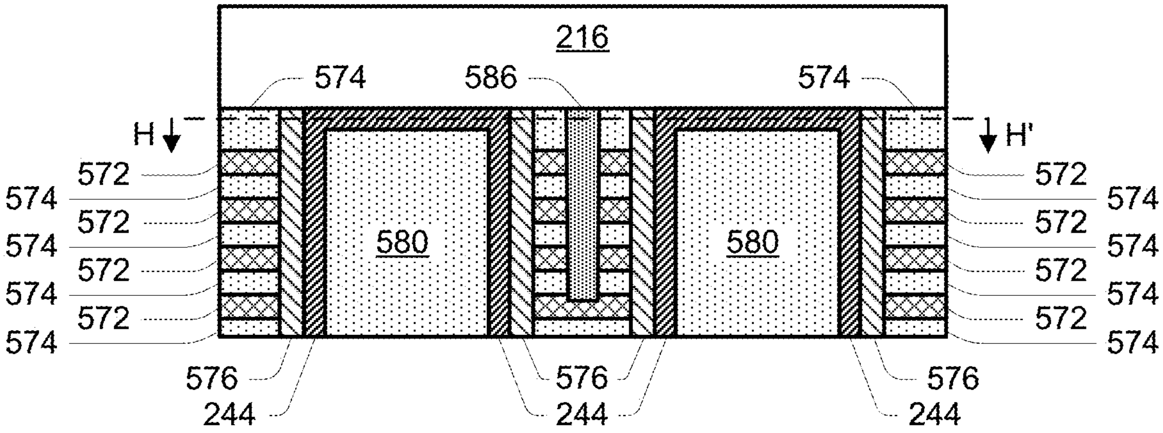
FIGS. 5G-5H depict a cross-sectional view and a top view, respectively, of a portion of a memory array structure in accordance with a still further embodiment.
Figure 5H:
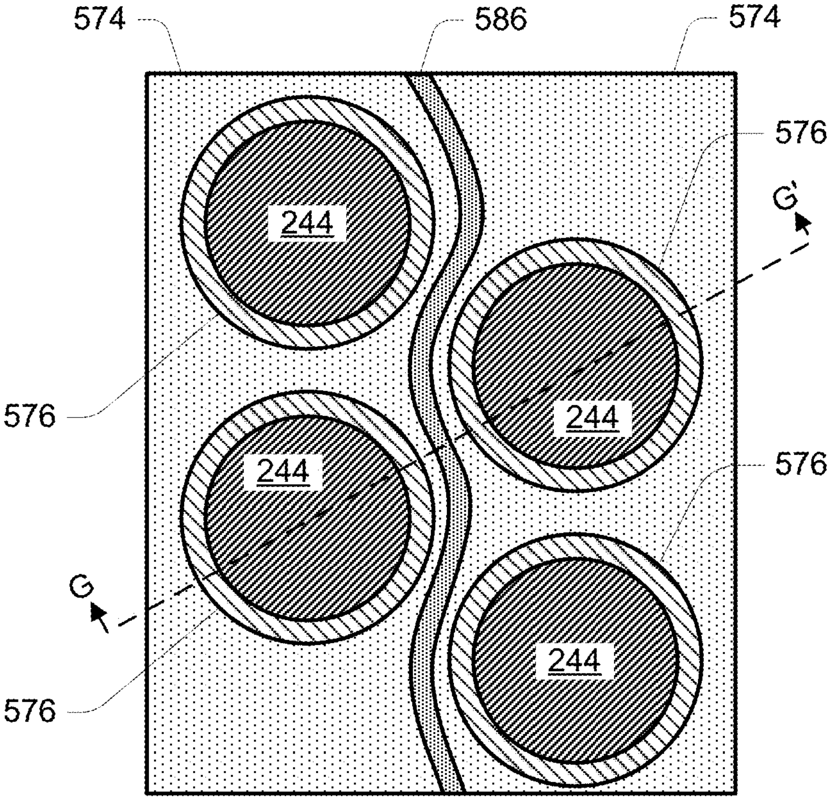

FIGS. 5G-5H depict a cross-sectional view and a top view, respectively, of a portion of a memory array structure in accordance with another embodiment. FIG. 5G represents a cross-sectional view of the portion of the memory array structure of FIG. 5H taken along line G-G'. FIG. 5H represents a top view of the portion of the memory array structure of FIG. 5G taken along line H-H'. The embodiment of FIGS. 5G-5H might correspond to the memory array structure 400B of FIG. 4B, where the instances of the gate structure 572 separated by the isolation structure 586 might each correspond to a conductor 452 of FIG. 4B.

Like numbered elements in FIGS. 5G-5H correspond to the description as provided with respect to FIGS. 5E-5F. The embodiment of FIGS. 5G-5H differs from the embodiment of FIGS. 5E-5F in that the common source 216 might be formed to be in contact with the channel material structures 244, and an isolation structure 586 might be formed to extend through the uppermost instance of dielectric 574 and at least one instance of a gate structure 572. The isolation structure 586 might contain one or more dielectric materials as described with reference to the isolation structure 562 of FIGS. 5E-5F.

FIGS. 5G-5H collectively depict a portion of a memory array structure having a number of instances of gate structures 572 isolated from one another by instances of dielectric 574. The gate structures 572 include a conductor acting as a control gate of a transistor, e.g., memory cell, select gate, GG gate, etc. The conductor of a gate structure 572 might contain one or more conductive materials. The conductor of the gate structure 572 might comprise, consist of, or consist essentially of a conductively-doped semiconductor material, such as conductively-doped polysilicon. Alternatively or in addition, the conductor of the gate structure 572 might comprise, consist of, or consist essentially of metal, such as a refractory metal, or a metal-containing material, such as a refractory metal silicide or a metal nitride, e.g., a refractory metal nitride, as well as any other conductive material. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

The gate structures 572 might further include a dielectric acting as a charge block. The dielectric of a gate structure 572 might contain one or more high-K dielectric materials. High-K dielectric materials as used herein means a material having a dielectric constant greater than that of silicon dioxide. For example, the dielectric of a gate structure 572 might comprise, consist of, or consist essentially of silicon nitride ($Si_3N_4$), an aluminum oxide ($AlO_x$), a hafnium oxide ($HfO_x$), a lanthanum oxide ($LaO_x$), scandium(III) oxide ($Sc_2O_3$), a tantalum oxide ($TaO_x$), a zirconium oxide ($ZrO_x$), an aluminum hafnium oxide ($AlHfO_x$), an aluminum zirconium oxide ($AlZrO_x$), a hafnium silicon oxide ($HfSiO_x$), a hafnium zirconium oxide ($HfZrO_x$), a hafnium aluminum zirconium oxide ($HfAlZrO_x$), or yttrium(III) oxide ($Y_2O_3$), as well as any other high-K dielectric material.

The instances of the gate structures 572 and the dielectric 574 might be formed to surround data storage structures 576, which each might be formed to surround a channel material structure 244. The materials of the data storage structures 576 will be described in more detail with respect to FIG. 6C, but generally comprise a gate dielectric adjacent the channel material structure 244, a charge blocking dielectric adjacent the instances of the gate structures 572 and dielectric 574, and a charge storage node between its gate dielectric and its charge blocking dielectric. The materials of the channel material structures 244 will be described in more detail with respect to FIG. 6E, but generally comprise a conductively-doped semiconductor material.

The data storage structures 576 and the channel material structures 244 might be hollow structures that might be filled (e.g., at least partially filled) with a dielectric 580. The dielectric 580 might contain one or more dielectric materials. The dielectric 580 might comprise, consist of, or consist essentially of an oxide, e.g., silicon dioxide ($SiO_2$). The dielectric 580 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 580 might further comprise, consist of, or consist essentially of any other dielectric material. The dielectric 580 might contain one or more dielectric materials that can be selectively removed without adversely affecting the materials of the instances of the dielectric 574, the materials of the data storage structures 576, and the materials of the channel material structures 244.

Isolation structure 586 might be formed to extend through the uppermost instance of dielectric 574 and at least one instance of a gate structure 572. A bottom surface of the isolation structure 586 might extend below a bottom surface of at least one gate structure 572. The isolation structure 586 might further extend through one or more additional instances of the gate structures 572 and instances of the dielectric 574. For example, as depicted in FIG. 5G, the isolation structure 586 further extends through three instances of the gate structures 572 and four instances of the dielectric 574, and further has a bottom surface extending into a fourth instance of the gate structure 572. The isolation structure 586 might contain one or more dielectric materials such as described with reference to the dielectric 574, the dielectric of the gate structures 572, and/or the dielectric 580. This isolation of different portions of the instances of the gate structures 572 facilitates independent control of source select gates for different sub-blocks of memory cells.

An isolation structure 586 might be formed between a pair of adjacent (e.g., immediately adjacent) channel material structures 244, and might isolate portions of the gate structures 685 on one side of the isolation structure 586 from portions of the gate structures 685 on the other side of the isolation structure 586. For example, an isolation structure 586 might be formed between adjacent channel material structures 244 for different blocks of memory cells. Alternatively, or in addition, an isolation structure 586 might be formed between each pair of adjacent (e.g., immediately adjacent) channel material structures 244. For example, an isolation structure 586 might be formed between adjacent channel material structures 244 for each sub-block of memory cells for each block of memory cells.

The common source 216 might be formed overlying the uppermost instance of dielectric 574, the data storage structures 576, the channel material structures 244, and the isolation structure 586. The common source might thus be connected to the channel material structures 244, e.g., directly connected. The common source 216 might contain one or more conductive materials such as described with reference to the conductor of the gate structure 572. As one example, the common source 216 might contain conductively-doped polysilicon.

FIGS. 6A-6J depict cross-sectional views of a portion of a memory array structure during various stages of fabrication in accordance with embodiments. For example, the memory array structure of FIGS. 6A-6J might be utilized with wafer-on-wafer (WOW) technology or similar technology. In WOW technology, portions of an integrated circuit device might be formed on different substrates, which might be referred to as carrier substrates. These carrier substrates might include semiconductor substrates or dielectric substrates, for example. As one example, relevant to the present disclosure, a portion of a memory array structure might be first formed without a source-side connection to its strings of series-connected memory cells as depicted in FIGS. 6A-6J, and source-side connections might be subsequently made after formation of its strings of series-connected memory cells as depicted in the alternative embodiments of FIGS. 7A-7K and 8A-8B.

Figure 6A:
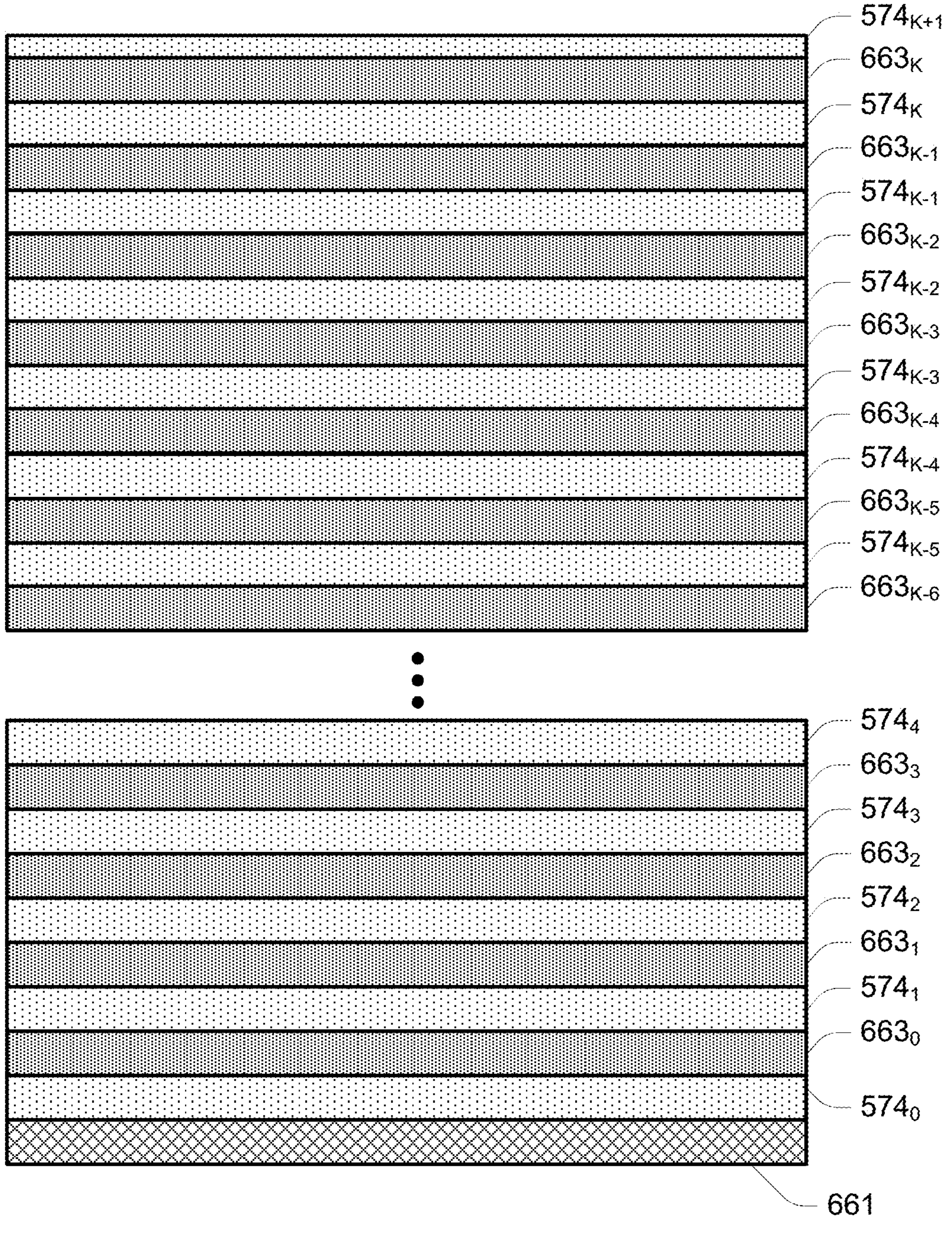
FIGS. 6A-6J depict cross-sectional views of a portion of a memory array structure during various stages of fabrication in accordance with embodiments.

In FIG. 6A, K+2 instances of a dielectric 574 (e.g., $\mathbf{574}_0$ to $\mathbf{574}_{K+1}$) and K+1 instances of a sacrificial material 663 (e.g., $\mathbf{663}_0$ to $\mathbf{663}_K$) might be formed in an alternating manner. Although instances of the dielectric $\mathbf{574}_5$-$\mathbf{574}_{K-6}$, and instances of sacrificial material $\mathbf{663}_4$-$\mathbf{663}_{K-5}$, are not explicitly depicted in the figures, it will be understood that these instances of the dielectric 574 and of the sacrificial material 663 could also be formed in an alternating manner as depicted in the figures. The instance of the dielectric $\mathbf{574}_0$ could be formed overlying a carrier substrate 661, e.g., a sacrificial carrier substrate. The carrier substrate 661 might be any material compatible with the materials formed thereon. For one embodiment, the carrier substrate 661 might be a semiconductor, such as monocrystalline silicon.

The value K+1 might represent the number of transistors to be formed around a channel material structure 244. The instances of the dielectric 574 might each contain one or more dielectric materials. The instances of dielectric 574 might comprise, consist of, or consist essentially of an oxide, e.g., silicon dioxide ($SiO_2$), and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. The instances of dielectric 574 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The instances of dielectric 574 might further comprise, consist of, or consist essentially of any other dielectric material. As one example, the instances of the dielectric 574 might contain silicon dioxide.

The instances of the sacrificial material 663 might contain a material that can be subjected to removal without significantly affecting the material(s) of the dielectric 574 or materials of a data storage structure 576 (not depicted in FIG. 6A). As one example, the instances of the sacrificial material 663 might contain silicon nitride for instances of the dielectric 574 containing silicon dioxide. Additional instances of the dielectric 574 and instances of the sacrificial material 663 might be formed, depending upon the number of transistors intended to be formed, e.g., memory cells, dummy memory cells, GIDL generator gates, select gates, etc.

Figure 6B:
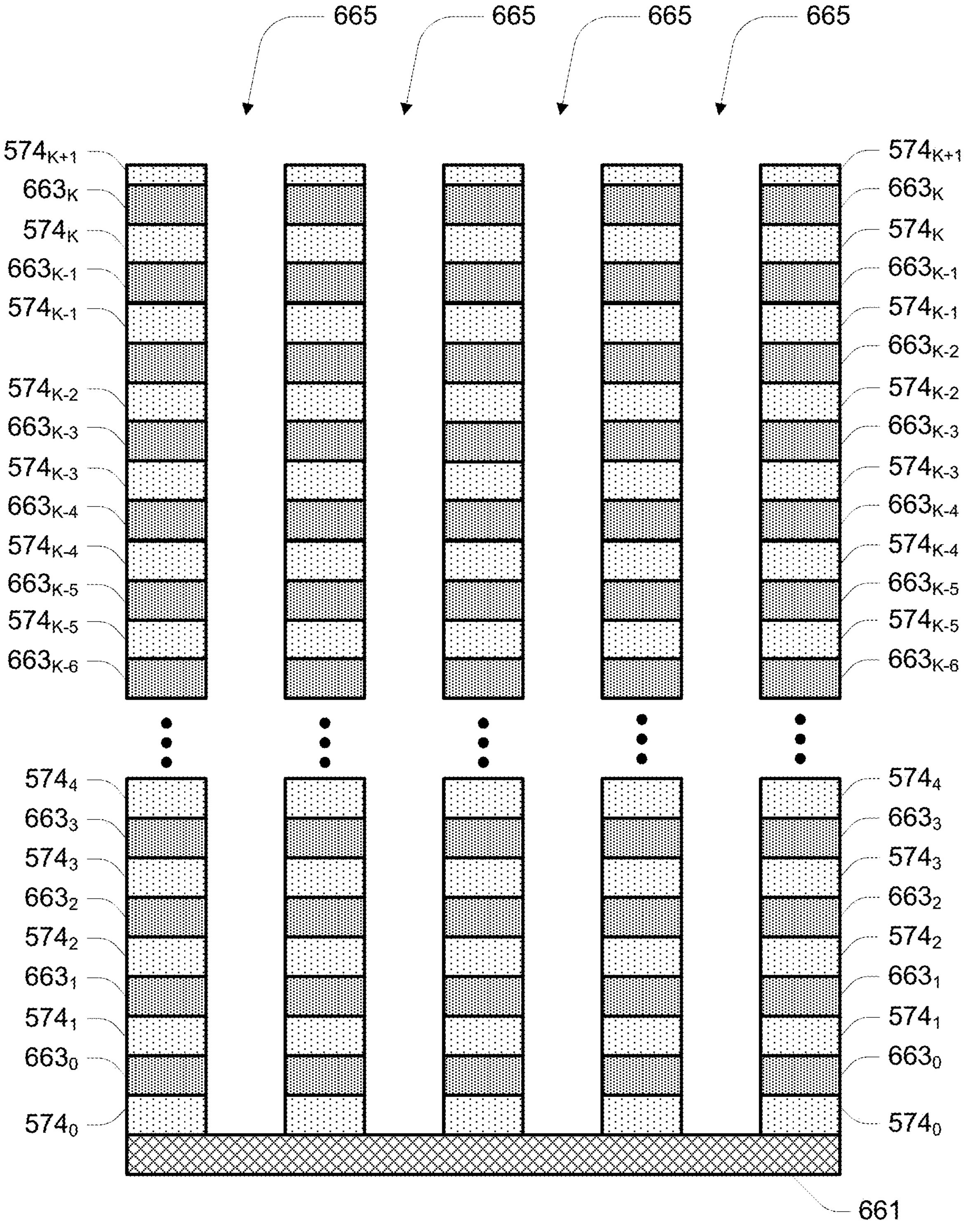

In FIG. 6B, vias 665 might be formed through the instances of the dielectric 574 and the instances of the sacrificial material 663. For example, an anisotropic removal process, e.g., reactive ion etching (RIE), might be used with the carrier substrate 661 acting as an etch stop. As such, the vias 665 might extend through all instances of the dielectric 574 and through all instances of the sacrificial material 663, exposing portions of the carrier substrate 661. Although not depicted, the vias 665 could extend below the surface of the carrier substrate 661.

Figure 6C:
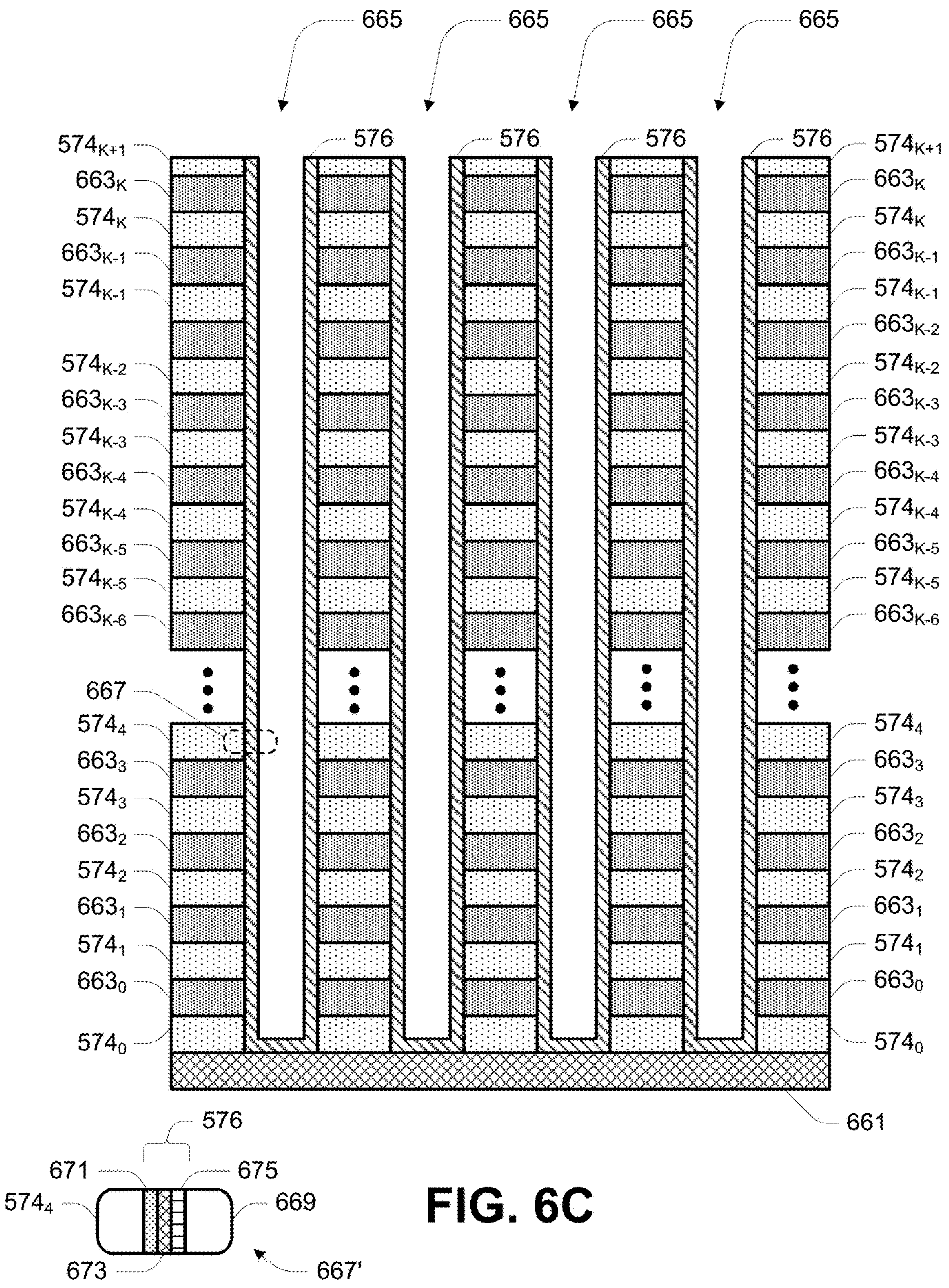

In FIG. 6C, data storage structures 576 might be formed in (e.g., to line the sidewalls of) each via 665, e.g., formed along the sidewalls of the instances of the dielectric 574 and the instances of the sacrificial material 663, and the exposed portions of the carrier substrate 661. The portion 667 of the channel material structure 576 is depicted in further detail in the expanded portion 667'. As depicted, the data storage structures 576 might each include a charge-blocking material 671 formed to line the via 665, a charge-storage material 673 might be formed on the charge-blocking material 671, and a dielectric (e.g., gate dielectric) 675 might be formed on the charge-storage material 673. The charge-storage material 673 might contain a dielectric or conductive charge-storage material. The charge-storage material 673 might further contain both dielectric and conductive materials, e.g., conductive nano-particles in a dielectric bulk material. For charge-storage material 673 containing a conductive material as its bulk, or as a continuous structure, resulting memory cells might typically be referred to as floating-gate memory cells. For charge-storage material 673 containing a dielectric material as its bulk, or as a continuous structure, resulting memory cells might typically be referred to as charge-trap memory cells.

The charge-blocking material 671 might function as a charge-blocking node for future memory cells and other transistors having a same structure, and might include one or more dielectric materials, such as described with reference to the dielectric 574. For example, the charge-blocking material 671 might include a high-K dielectric material. The charge-storage material 673 might function as a charge-storage node for future memory cells and other transistors having a same structure, and might include one or more conductive or dielectric materials capable of storing a charge. For example, the charge-storage material 673 might include silicon nitride, which has charge trapping levels inside the film. The dielectric 675 might function as a gate dielectric for future memory cells and other transistors having a same structure, and might include one or more dielectric materials such as described with reference to the dielectric 574.

Figure 6D:
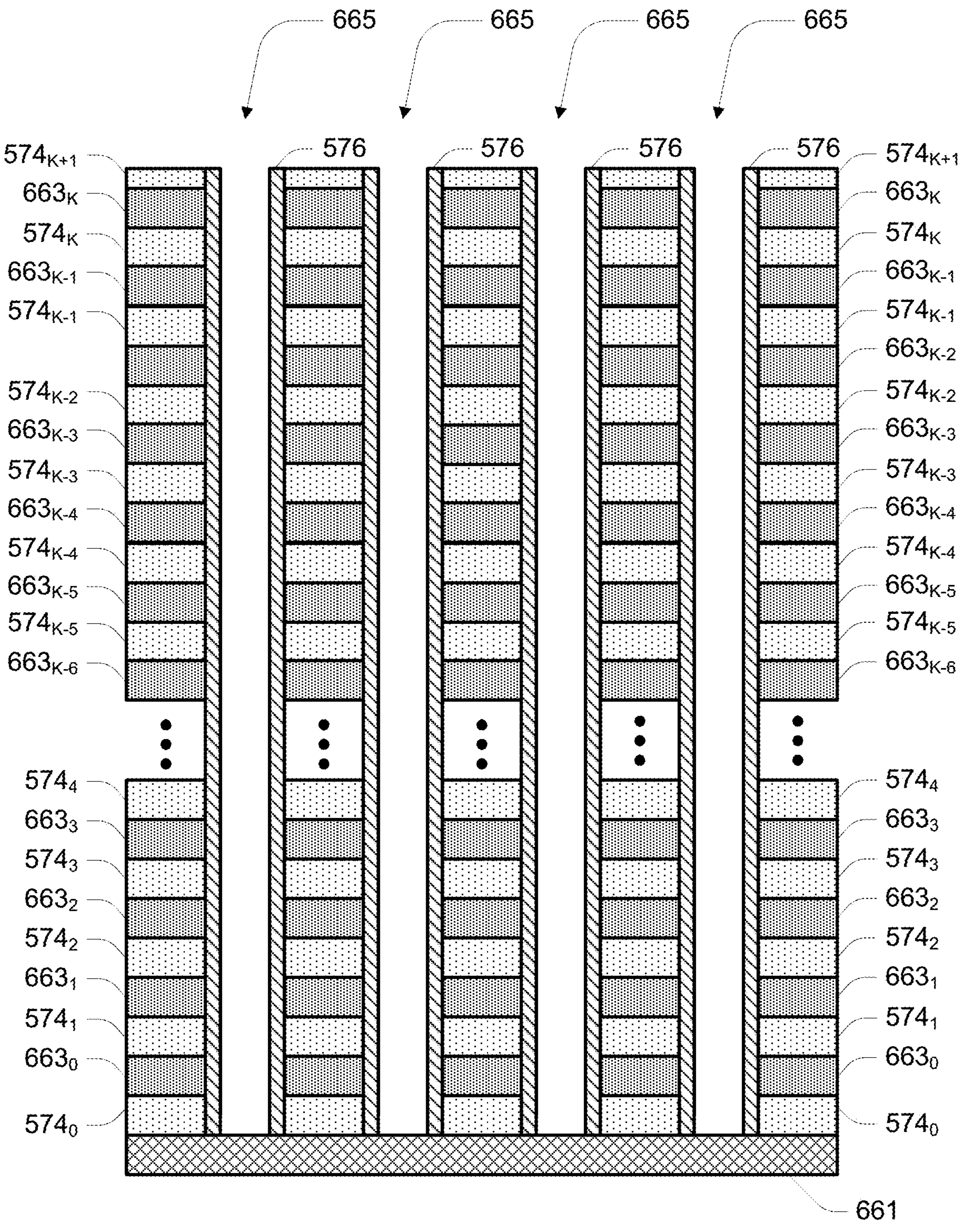

In FIG. 6D, optionally, a portion (e.g., a bottom portion) of each data storage structure 576 might be removed. For example, an anisotropic removal process, e.g., reactive ion etching (RIE), might be used with the carrier substrate 661 acting as an etch stop. As such, portions of the carrier substrate 661 might again be exposed. Alternatively, the data storage structure 576 might be left intact, such that the carrier substrate 661 could remain covered.

Figure 6E:
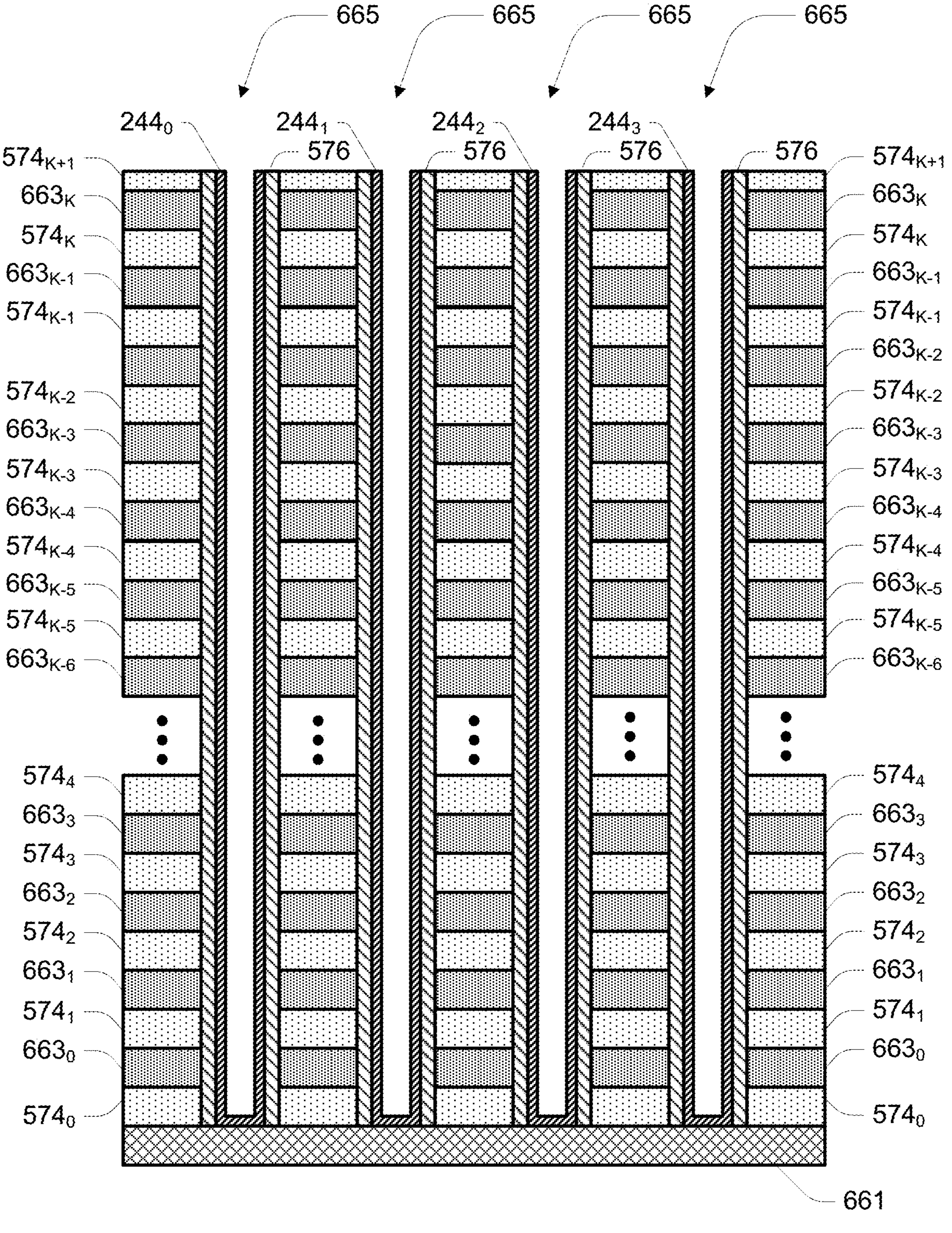

In FIG. 6E, channel material structures 244 might be formed in (e.g., to line) the voids 665, e.g., the channel material structures 244 might be formed to line sidewalls (e.g., inner sidewalls) of respective data storage structures 576. The channel material structure 244 might be a portion of a contiguous semiconductor structure, e.g., a channel material structure 244, for each transistor that is formed around a given data storage structure 576, or might otherwise be electrically connected, which might include selectively electrically connected, to channels of each such transistor. The channel material structure 244 might function as a channel for future memory cells and other transistors having a same or similar structure. The channel material structure 244 might include one or more semiconductor materials. For one embodiment, the channel material structure 244 might include a silicon-containing material, such as amorphous or polycrystalline silicon. The channel material structure 244 might have a conductivity type, e.g., a p-type conductivity or an n-type conductivity, and may have sufficient conductivity to give a future transistor a negative threshold voltage. Although the channel material structure 244 is depicted as a hollow structure, the channel material structure 244 could alternatively be a solid structure.

Figure 6F:
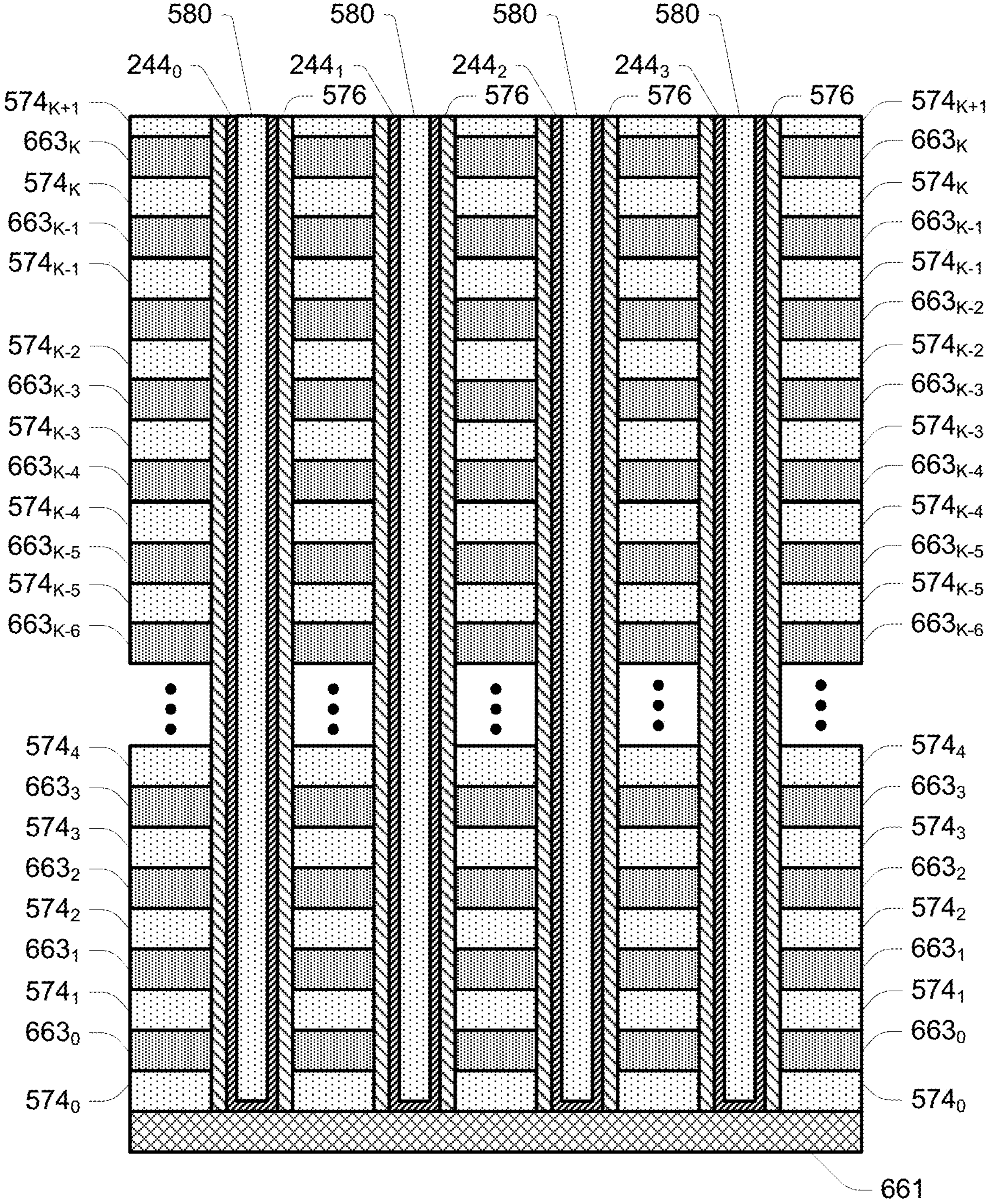

In FIG. 6F, a dielectric 580 might be formed in the voids 665. The dielectric 580 might contain one or more dielectric materials. The dielectric 580 might comprise, consist of, or consist essentially of an oxide, e.g., silicon dioxide ($SiO_2$). The dielectric 580 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 580 might further comprise, consist of, or consist essentially of any other dielectric material. The dielectric 580 might contain one or more dielectric materials that can be selectively removed without adversely affecting the materials of the instances of dielectric 574, the charge-blocking material 671, the charge-storage material 673, the gate dielectric 675, and the channel material structure 244. The dielectric 580 might be deposited overlying the structure of FIG. 6E, and then removed to the level of an upper surface of the upper instance of dielectric 574, e.g., instance of dielectric $574_{K+1}$, such as by chemical-mechanical planarization (CMP). Although depicted as a solid dielectric 580, a portion of each void 665 might remain after forming the dielectric 580.

Figure 6G:
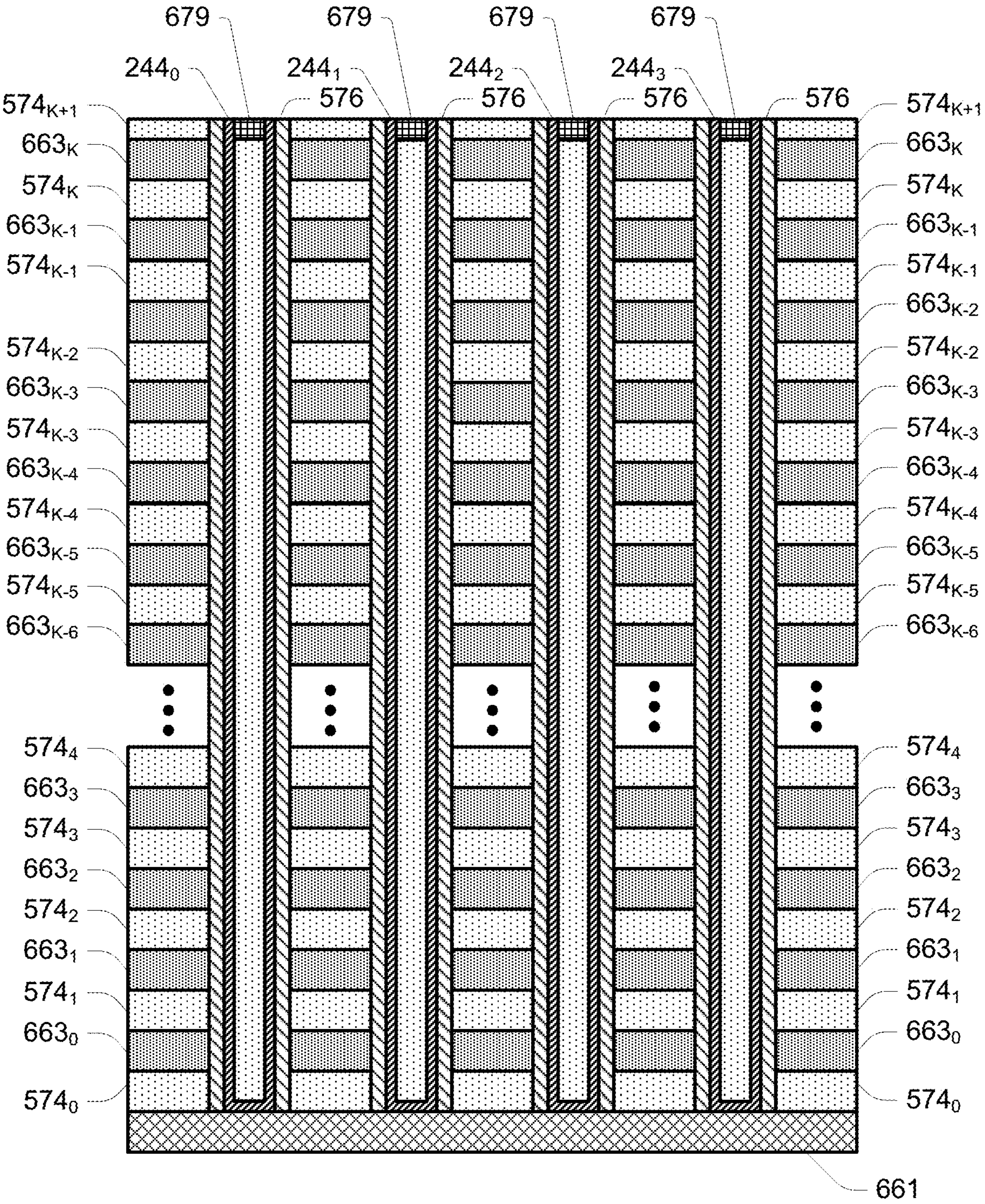

In FIG. 6G, a portion of each instance of dielectric 580 might be removed to recess the upper surface of the instances of dielectric 580. For example, the instances of dielectric 580 might be recessed to expose portions (e.g., portions of sidewalls) of the channel material structures 244, and might be recessed to a level of the upper instance of sacrificial material 663, e.g., instance of sacrificial material $663_K$. A respective conductive plug 679 might then be formed overlying each instance of dielectric 580 and electrically connected to its corresponding channel material structure 244, and might be formed to line and be in physical contact with sidewalls (e.g., inner sidewalls) of its corresponding channel material structure 244, and might further be formed overlying and in physical contact with an upper surface of its corresponding channel material structure 244. The conductive plugs 679 might be in direct electrical contact with the channel material structures 244 with no intervening circuit elements. Each conductive plug 679 might contain one or more conductive materials, and might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. For some embodiments, the conductive plugs 679 might contain a conductively-doped polysilicon, such as an $n^+$-type conductively-doped polysilicon.

Figure 6H:
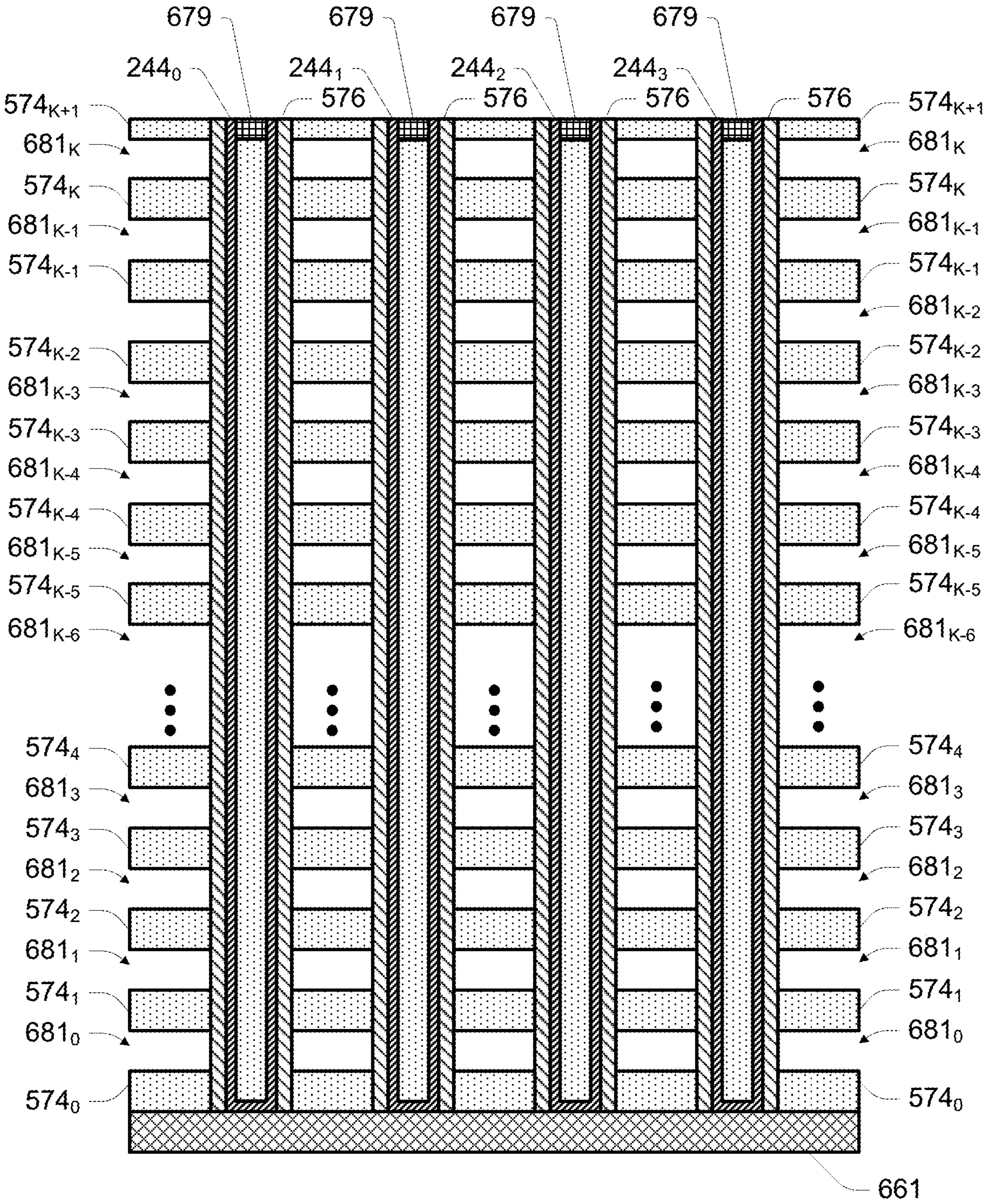
Figure 6I:
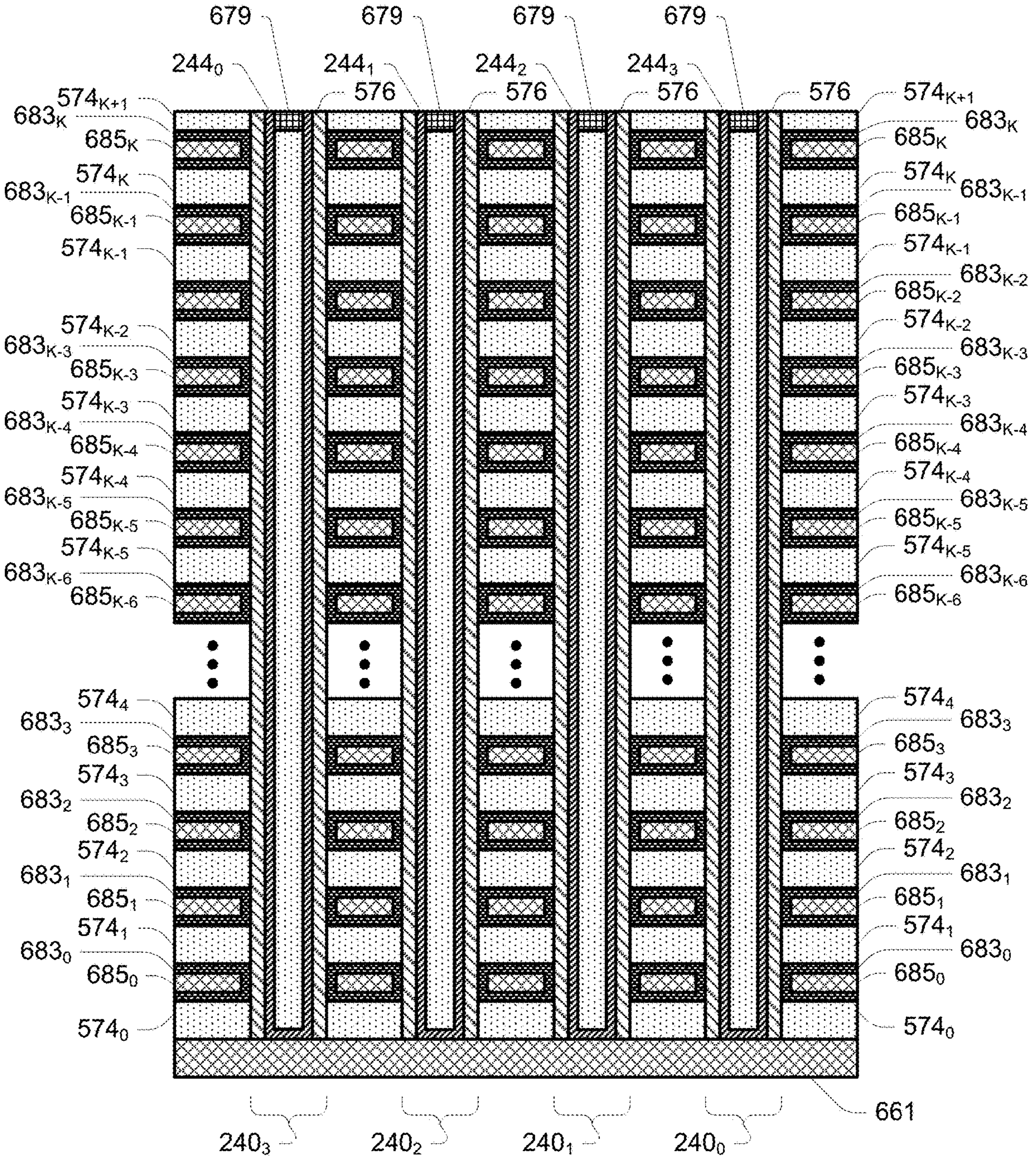

If FIG. 6H, the instances of sacrificial material 663 might be removed to define voids 681, e.g., voids $\mathbf{681}_0$ to $\mathbf{681}_K$. The removal might include an isotropic removal process, e.g., a plasma etching process. The voids 681 might expose portions of sidewalls (e.g., outer sidewalls) of each of the data storage structures 576. In FIG. 6I, instances of an optional charge-blocking material 683, e.g., instances of charge-blocking material $\mathbf{683}_0$ to $\mathbf{683}_K$, might be formed to line the voids 681, e.g., voids $\mathbf{681}_0$ to $\mathbf{681}_K$, respectively. The instances of charge-blocking material 683 might include one or more dielectric materials, such as described with reference to the dielectric 574, and might include a high-K dielectric material. For embodiments with the charge-blocking material 671, the instances of charge-blocking material 683 might function as an additional charge-blocking material of a charge-blocking node for future memory cells and other transistors having a same or similar structure. For embodiments without the charge-blocking material 671, the instances of charge-blocking material 683 might function individually as a charge-blocking node for future memory cells and other transistors having a same structure. For embodiments with the charge-blocking material 671, and without the instances of charge-blocking material 683, the charge-blocking material 671 might function individually as a charge-blocking node for future memory cells and other transistors having a same or similar structure. Instances of a conductor 685, e.g., instances of a conductor $\mathbf{685}_0$ to $\mathbf{685}_K$, might be formed in (e.g., to fill) the voids 681, e.g., voids $\mathbf{681}_0$ to $\mathbf{681}_K$, respectively. The instances of the conductor 685 might contain one or more conductive materials. The instances of the conductor 685 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material.

A transistor might be formed at each intersection of an instance of the conductor 685 and a channel material structure 244, where an instance of the conductor 685 might function as a control gate of the transistor, adjacent channel material structure 244 might function as a channel of the transistor, and an instance of charge-blocking material 683 and/or charge-blocking material 671, charge-storage material 673, and dielectric 675 between the instance of the conductor 685 and the adjacent channel material structure 244 might function as a charge-blocking node, charge-storage node and gate dielectric, respectively, of that transistor. Such transistors could include memory cells 208, select gates 210, select gates 212, etc.

Figure 6J:
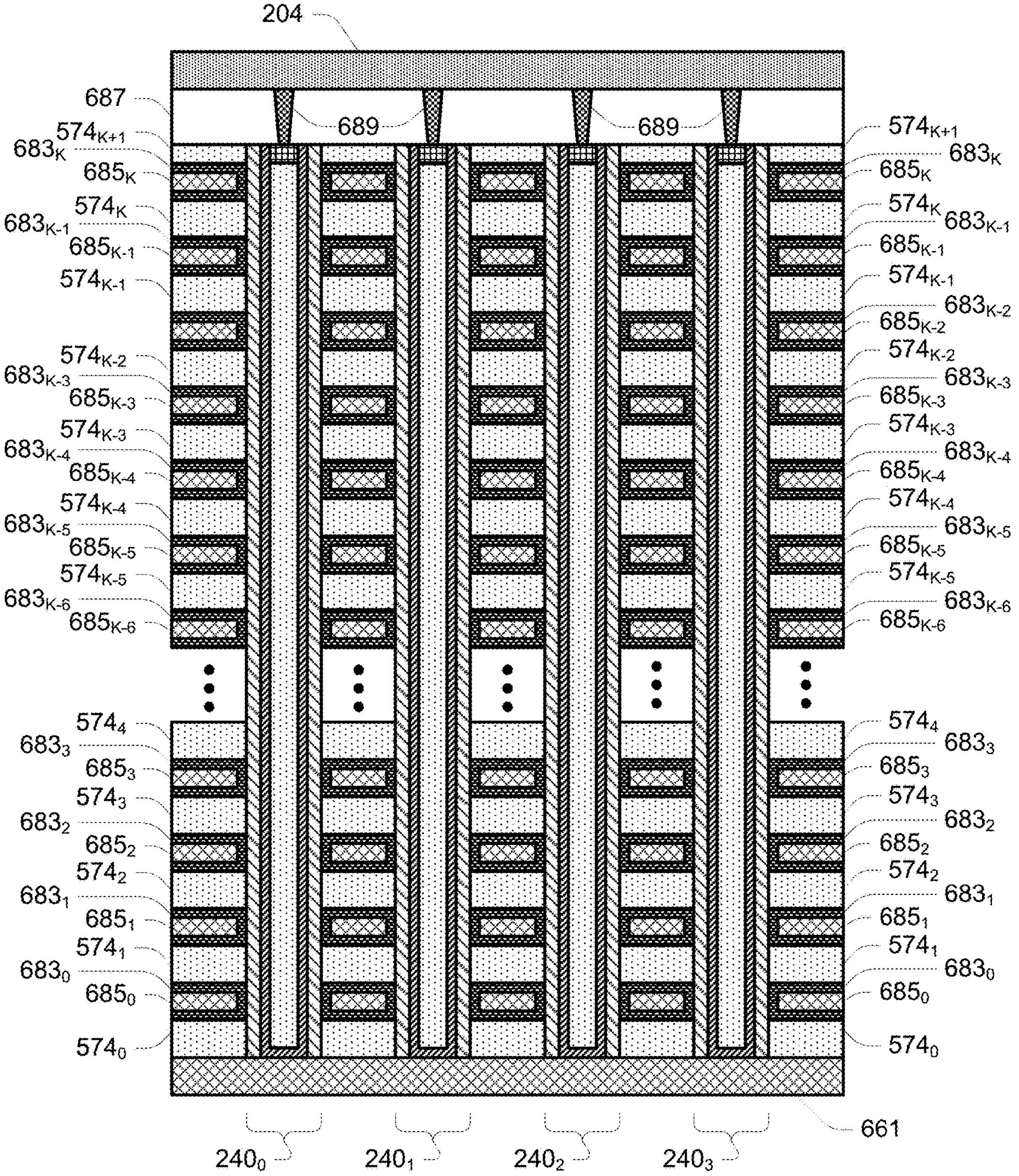

In FIG. 6J, data line contacts 689 might be formed through a dielectric 687, that might be formed overlying the structure of FIG. 6I, and might be connected to respective conductive plugs 679. A data line 204 might be formed overlying the dielectric 687 and data line contacts 689, and might be connected to the data line contacts 689. The data line 204 might thus be connected to the channel material structures 244, e.g., through the data line contacts 689 and conductive plugs 679. The contacts 689 might contain one or more conductive materials, e.g., conductive materials such as described with reference to the conductor 685. For some embodiments, the contacts 689 might contain an $n^+$-type conductively-doped polysilicon. For other embodiments, the contacts 689 might include an $n^+$-type conductively-doped polysilicon formed overlying the conductive plugs 679, titanium nitride (TiN) formed overlying the $n^+$-type conductively-doped polysilicon, and tungsten (W) formed overlying the titanium nitride. While FIGS. 6A-6J depicted an example method of fabricating a portion of a memory array structure, other methods of fabrication could be used with various embodiments.

As previously noted, the portion of the memory array structure of FIGS. 6A-6J might be incomplete as not yet having a connection to a common source. Subsequent fabrication depicted in FIGS. 7A-7K show one example of forming the source-side connections. FIGS. 7A-7K depict cross-sectional views of a portion of a memory array structure during various stages of fabrication in accordance with embodiments. Like numbered elements in FIGS. 7A-7K correspond to the description as provided with respect to FIGS. 6A-6J.

Figure 7A:
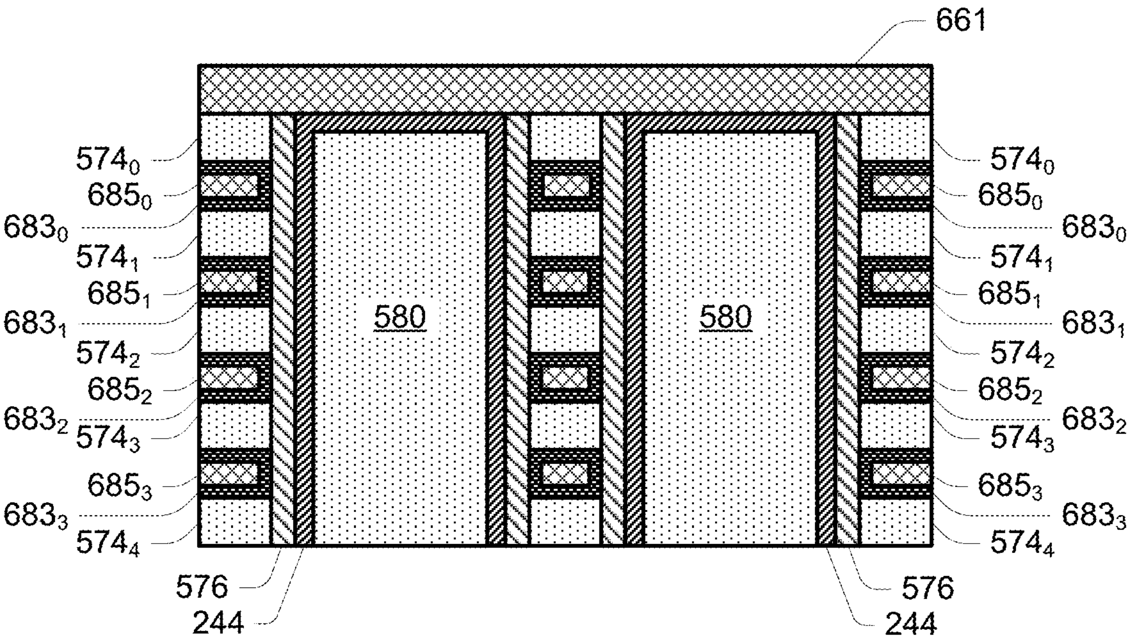
FIGS. 7A-7K depict cross-sectional views of a portion of a memory array structure during various stages of fabrication in accordance with embodiments.
Figure 7B:
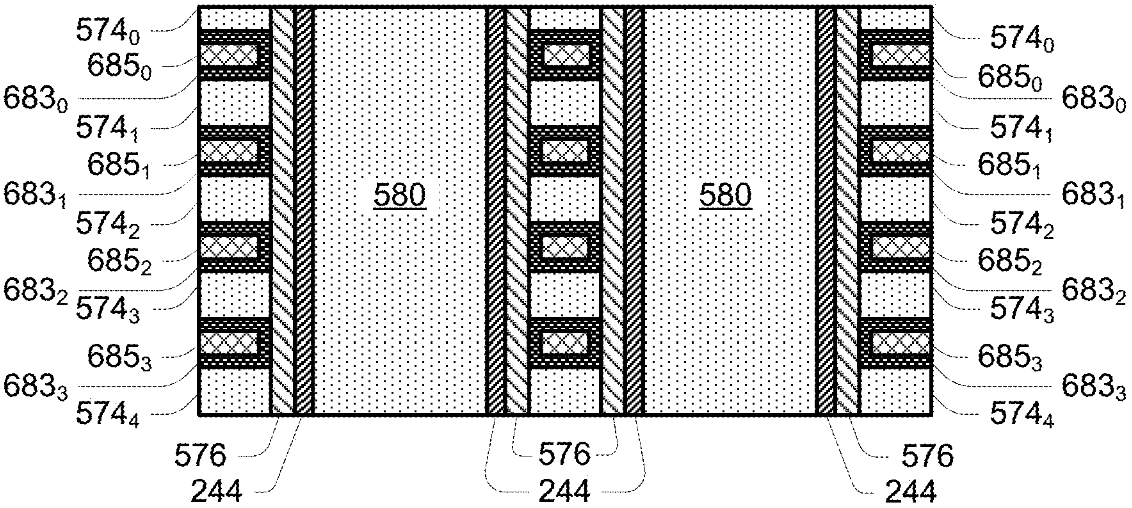

FIG. 7A might depict an inverted portion of the structure of FIG. 6J, with the carrier substrate 661 overlying the remaining structures. In general, a portion of the carrier substrate 661 might be removed prior to FIG. 7A, such as by cleaving, to reduce the thickness prior to further processing. In FIG. 7B, the carrier substrate 661 might be removed (e.g., further removed) to expose the channel material structures 244. Removal of the carrier substrate 661 at this stage might involve CMP. Removal of the carrier substrate 661 might further involve removal of portions of the instance of dielectric $\mathbf{574}_0$, the data storage structures 576, the channel material structures 244, and the dielectrics 580. Exposure of the channel material structures 244 might include removal of any closed end of its hollow structure as depicted between FIGS. 7A and 7B. For embodiments that do no remove the closed ends of the data storage structures 576 before formation of the channel material structures 244, these closed ends might further be removed at this stage. Following removal of the carrier substrate 661, the resulting structure might be annealed, e.g., using rapid thermal annealing (RTA), furnace annealing, and/or laser annealing, to repair any damage to the channel material structures 244. This might improve conductivity of the channel material structures 244.

Figure 7C:
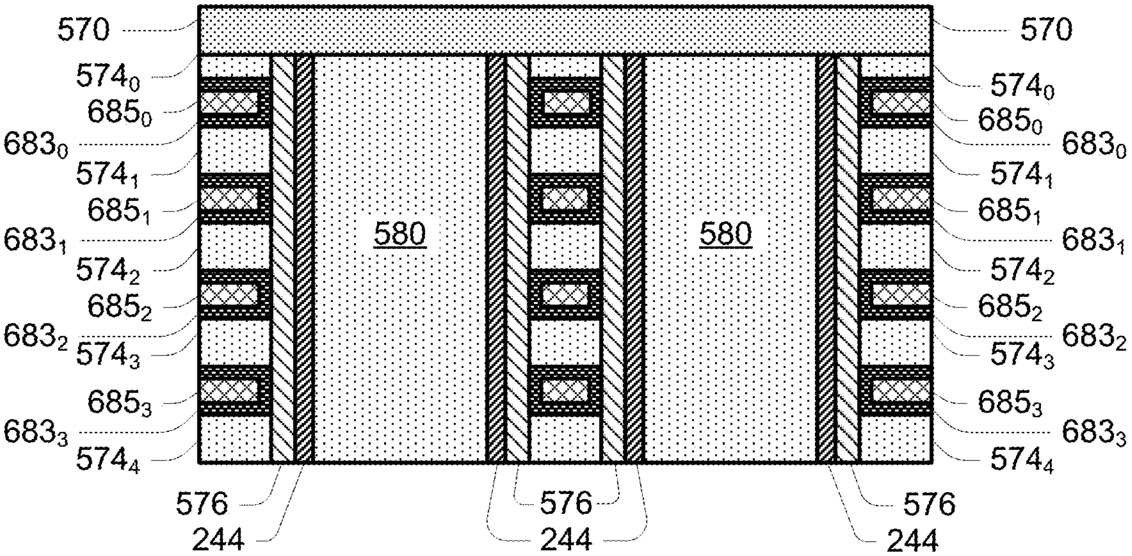
Figure 7D:
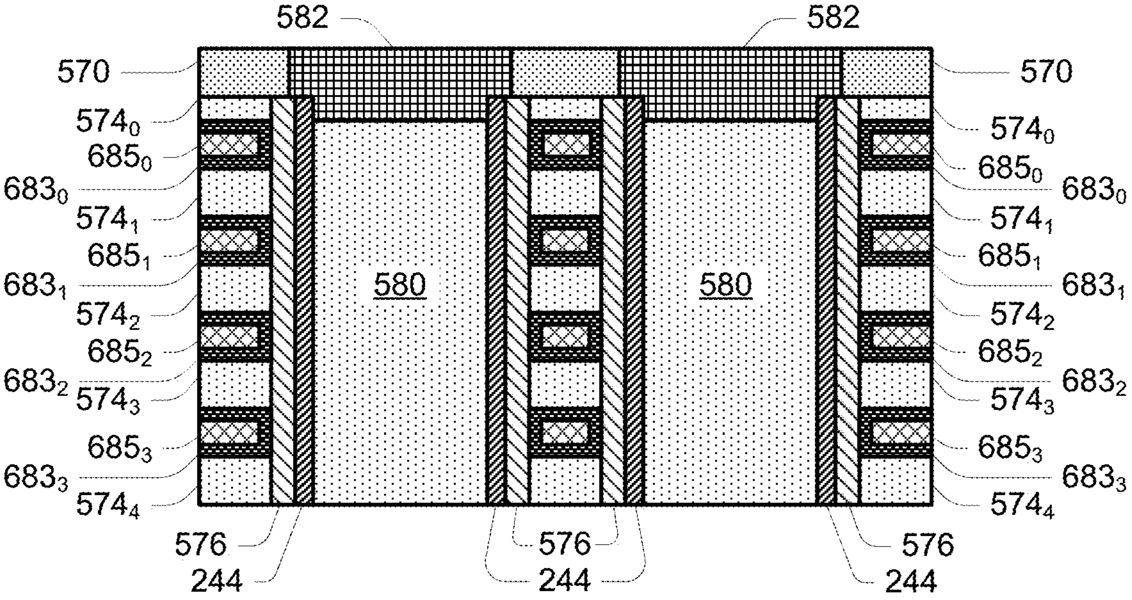

In FIG. 7C, a dielectric 570 might be formed overlying the instance of dielectric $\mathbf{574}_0$, the data storage structures 576, the channel material structures 244, and the dielectrics 580. The dielectric 570 might contain one or more dielectric materials such as described with reference to the dielectric 574, the dielectric of the gate structures 572, and/or the dielectric 580. In FIG. 7D, conductive plugs 582 might be formed overlying the channel material structures 244 and the dielectrics 580. Portions of the conductive plugs 582 might further be formed overlying the data storage structures 576.

For example, portions of the dielectric 570 might be removed to expose portions of the channel material structures 244 and dielectrics 580 and to define areas for formation of the conductive plugs 582. Removal of the portions of the dielectric 570 might further remove portions of (e.g., recess) the dielectrics 580 to expose sidewalls of the channel material structures 244. This might be used to increase the amount of surface area of the channel material structures 244 to be in contact with the conductive plugs 582. The material(s) of the conductive plugs 582 might then be formed (e.g., deposited) in these areas to be in electrical contact with respective channel material structures 244 and physical contact with dielectrics 580.

Each conductive plug 582 might contain one or more conductive materials, and might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. For some embodiments, the conductive plugs 582 might contain a conductively-doped polysilicon, such as an $n^+$-type conductively-doped polysilicon.

Figure 7E:
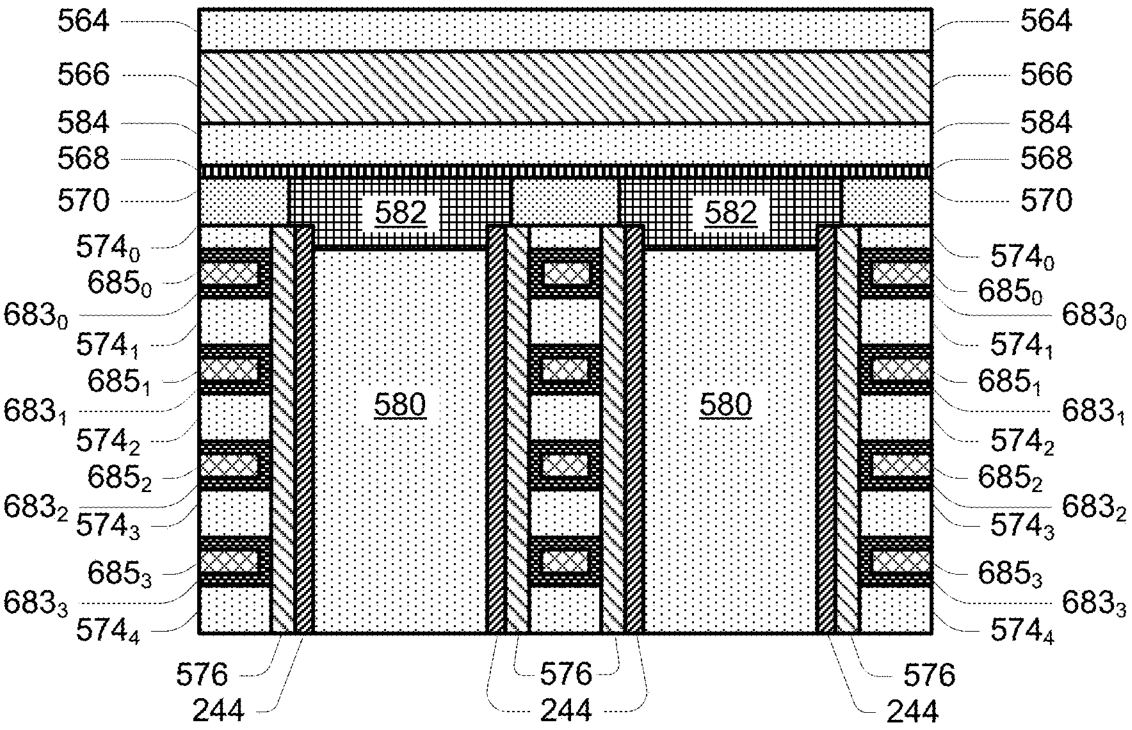

In FIG. 7E, an optional dielectric 568 might be formed overlying the dielectric 570 and the conductive plugs 582, a dielectric 584 might be formed overlying the dielectric 568 (or overlying the dielectric 570 and the conductive plugs 582 for embodiments without the dielectric 568), a conductor 566 might be formed overlying the dielectric 584, and a dielectric 564 might be formed overlying the conductor 566. The dielectric 568, dielectric 584 and/or the dielectric 564 might each contain one or more dielectric materials such as described with reference to the dielectric 574, the dielectric of the gate structures 572, and/or the dielectric 580. The conductor 566 might contain one or more conductive materials such as described with reference to the conductor of the gate structure 572.

Figure 7F:
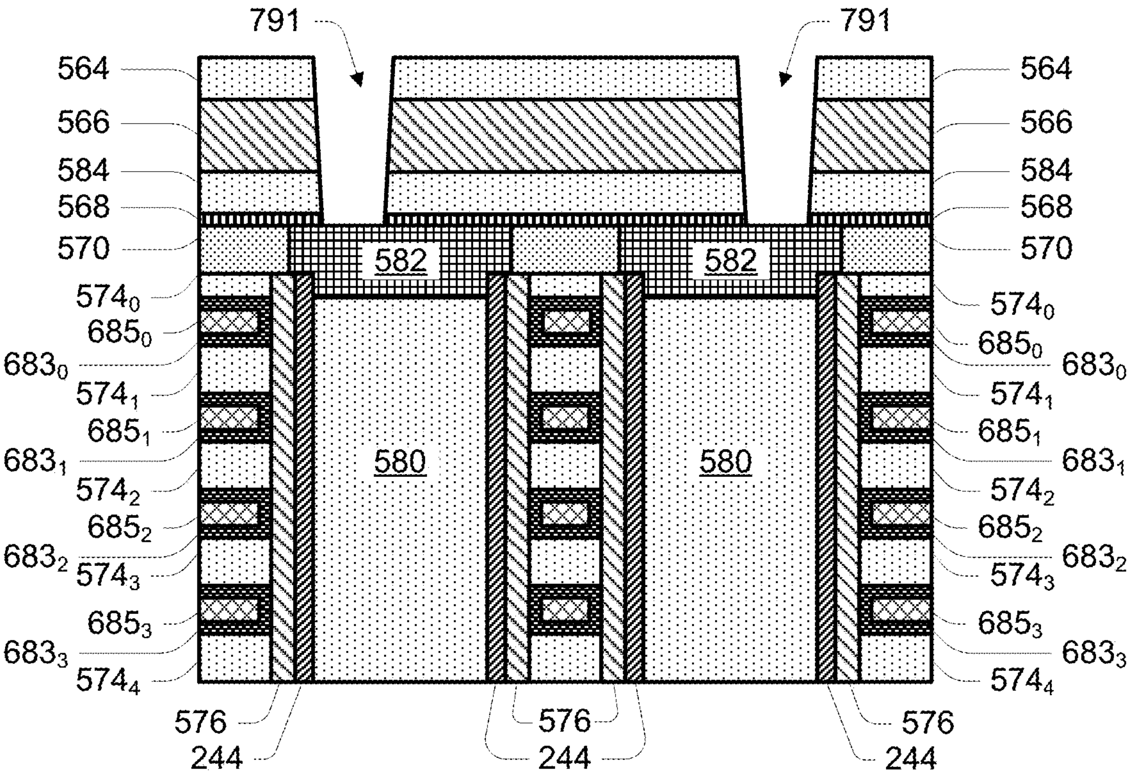
Figure 7G:
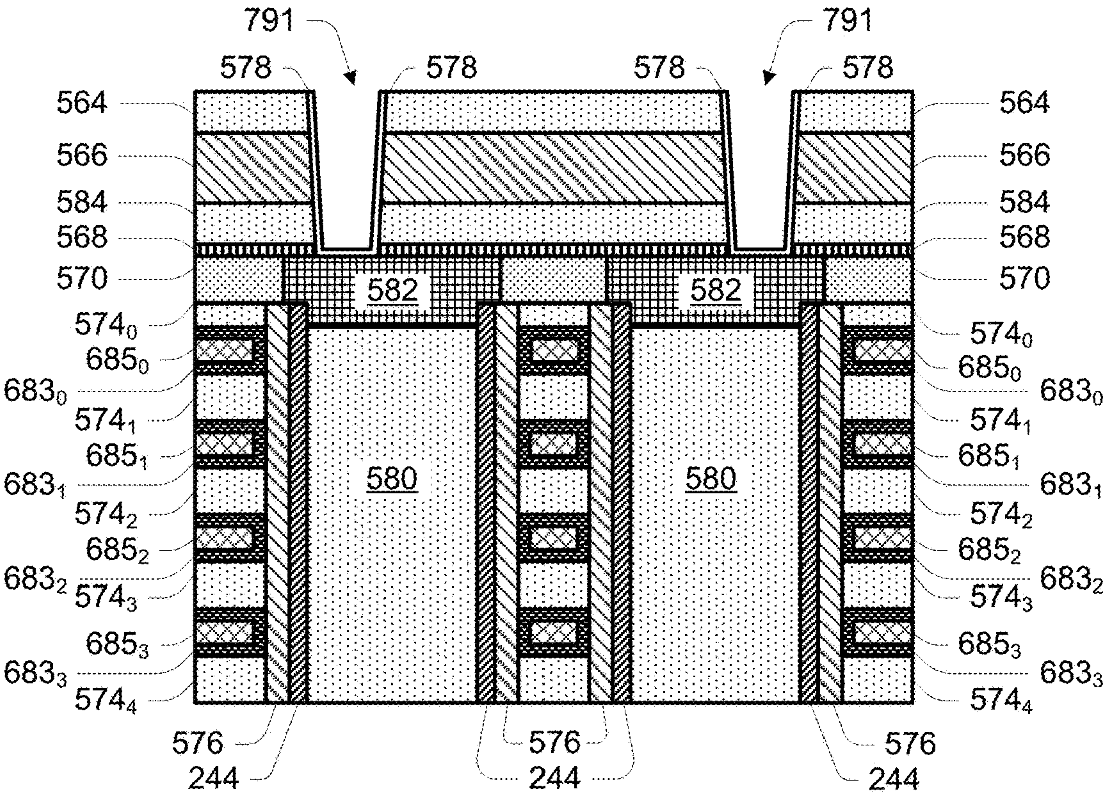
Figure 7H:
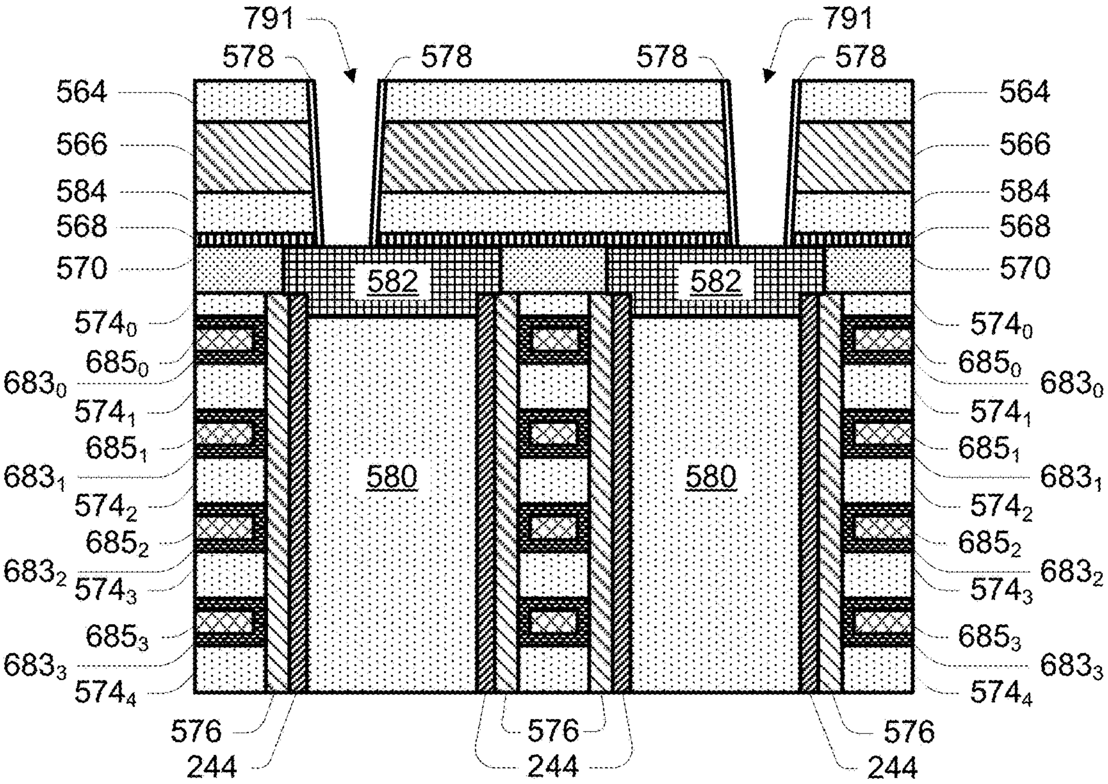

In FIG. 7F, portions of the dielectric 564, conductor 566, dielectric 584 and dielectric 568 might be removed to form vias 791 and to expose portions of the conductive plugs 582. This removal might involve an anisotropic removal process, such as RIE. In FIG. 7G, dielectrics 578 might be formed to line the vias 791. In FIG. 7H, portions of the dielectrics 578, e.g., bottom portions, might be removed to expose portions of the conductive plugs 582. This removal might involve an anisotropic removal process, such as RIE.

Figure 7I:
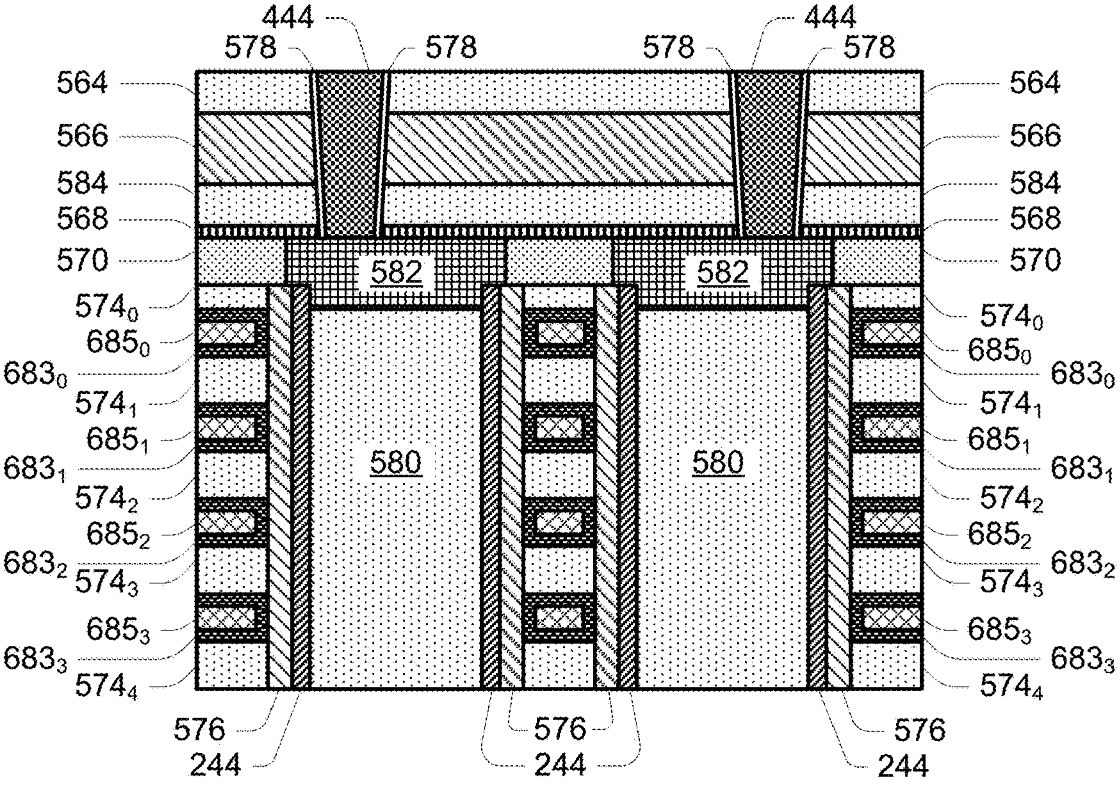

In FIG. 7I, channel material structures 444 might be formed in (e.g., to fill) the vias 791. The channel material structures 444 might include one or more semiconductor materials. For one embodiment, the channel material structures 444 might include a silicon-containing material, such as amorphous or polycrystalline silicon. The channel material structure 444 might have a conductivity type, e.g., a p-type conductivity or an n-type conductivity, and might have sufficient conductivity to give a future transistor a negative threshold voltage. Although the channel material structure 444 is depicted as a solid structure, the channel material structure 444 could alternatively be a hollow structure.

Figure 7J:
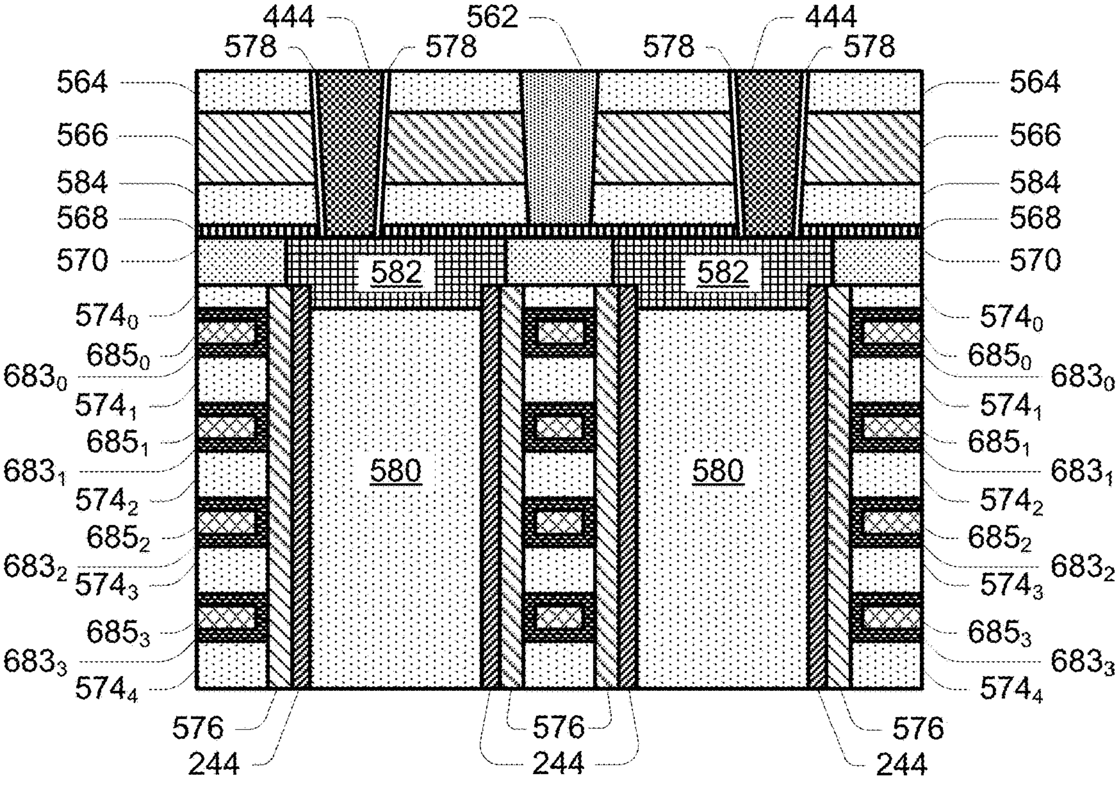

In FIG. 7J, an isolation structure 562 might be formed through the dielectric 564 and the conductor 566. A bottom surface of the isolation structure 562 might extend below a bottom surface of the conductor 566. The isolation structure 562 might further extend to be in contact with the dielectric 568 as depicted, and might further extend into the dielectric 570. The isolation structure 562 might contain one or more dielectric materials such as described with reference to the dielectric 574, the dielectric of the gate structures 572, and/or the dielectric 580.

Figure 7K:
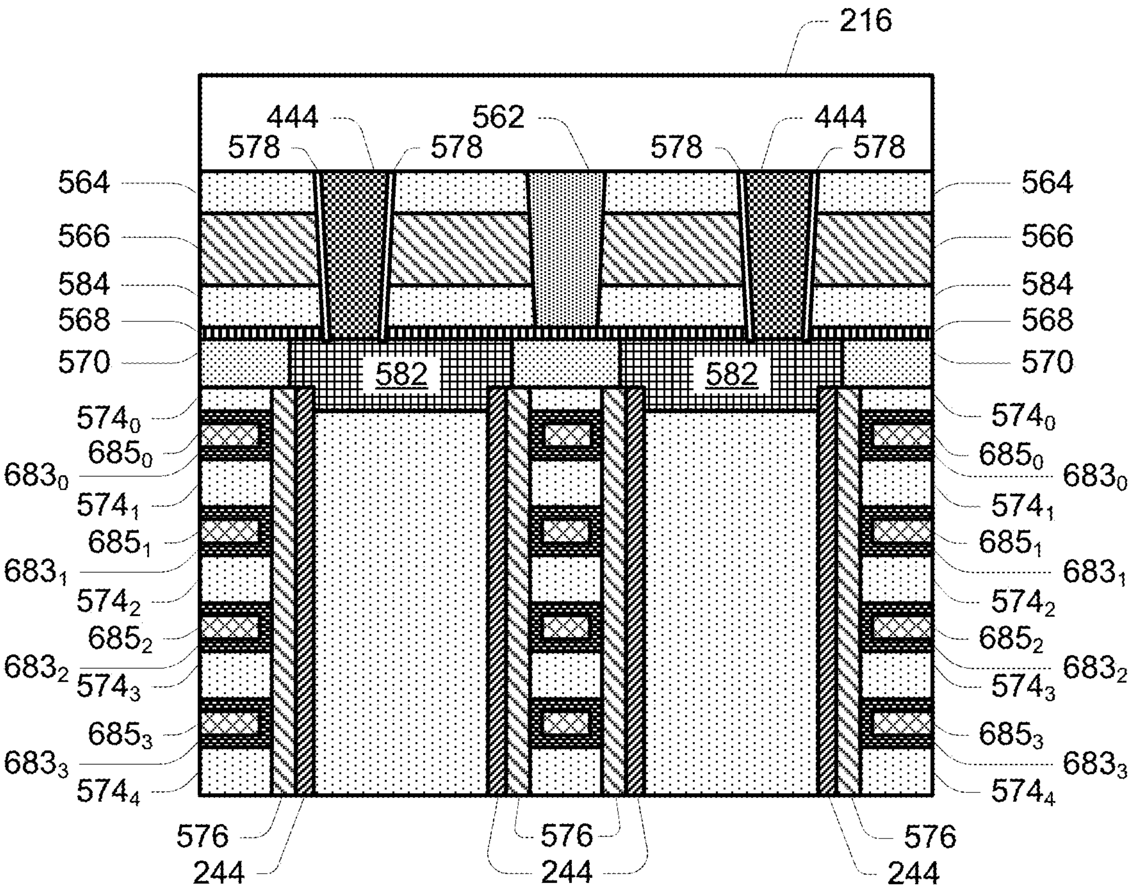

In FIG. 7K, the common source 216 might be formed overlying the dielectric 564, the dielectrics 578, the channel material structures 444, and the isolation structure 562. The common source 216 might contain one or more conductive materials such as described with reference to the conductor of the gate structure 572. As one example, the common source 216 might contain conductively-doped polysilicon. For some embodiments, the common source 216 might represent a surface of a second carrier substrate and might be bonded to the structure of FIG. 7J. For other embodiments, the common source 216 might be deposited on the structure of FIG. 7J.

Figure 8A:
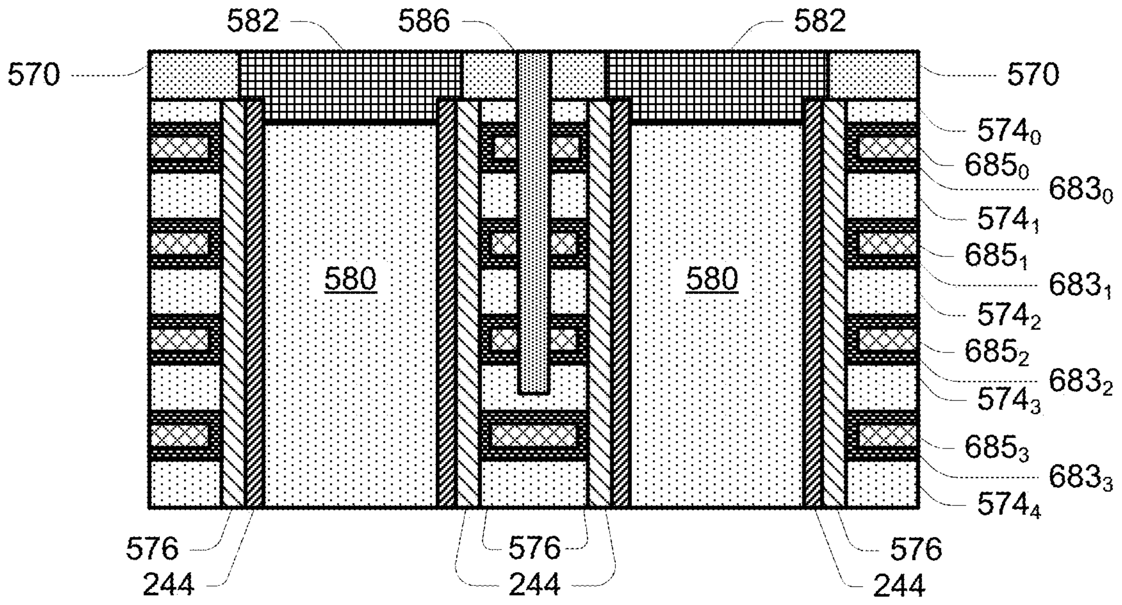
FIGS. 8A-8B depict cross-sectional views of a portion of a memory array structure during various stages of fabrication in accordance with embodiments.
Figure 8B:
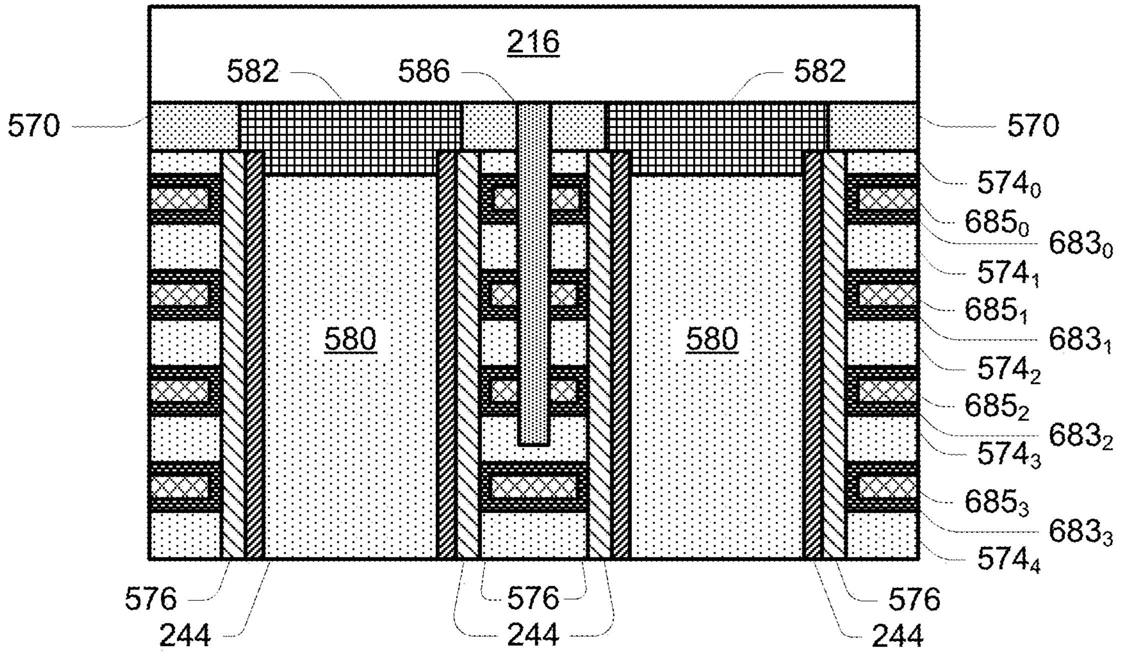

The structure depicted in FIG. 7K might correspond to the portion of the memory array structure depicted in FIGS. 5A-5B. To fabricate a structure such as depicted in FIGS. 5C-5D, the process might proceed as described with reference to FIGS. 6A-6J and 7A-7D, and then proceed to a process as described with reference to FIGS. 8A-8B. FIGS. 8A-8B depict cross-sectional views of a portion of a memory array structure during various stages of fabrication in accordance with embodiments. Like numbered elements in FIGS. 8A-8B correspond to the description as provided with respect to FIGS. 7A-7D.

In FIG. 8A, an isolation structure 586 might be formed through the dielectric 570, the instance of the dielectric $\mathbf{574}_0$, the instance of the charge-blocking material $\mathbf{683}_0$, and the instance of the conductor $\mathbf{685}_0$, thereby separating the instance of the conductor $\mathbf{685}_0$ into isolated control lines. For example, the portion of the instance of the conductor $\mathbf{685}_0$ to the left of the isolation structure 586 might correspond to a control line for one sub-block of memory cells, e.g., the select line $\mathbf{214}_X$ of FIG. 4B, while the portion of the instance of the conductor $\mathbf{685}_0$ to the right of the isolation structure 586 might correspond to a control line for a different sub-block of memory cells, e.g., the select line $\mathbf{214}_{X-1}$ of FIG. 4B.

The isolation structure 586 might further extend through one or more additional instances of the conductors 685 as well as other intervening structures. For example, as depicted in FIG. 8A, the isolation structure 586 further extends through the instance of the conductor $\mathbf{685}_1$, the instance of the conductor $\mathbf{685}_2$, the instance of the charge-blocking layer $\mathbf{683}_1$, the instance of the charge-blocking layer $\mathbf{683}_2$, the instance of the dielectric $\mathbf{574}_1$, and the instance of the dielectric $\mathbf{574}_2$, and further has a bottom surface (relative to the orientation of FIG. 8A) extending into the instance of the dielectric $\mathbf{574}_3$. Similar to the isolated portions of the instance of the conductor $\mathbf{685}_0$, the portion of the instance of the conductor $\mathbf{685}_1$ to the left of the isolation structure 586 might correspond to a control line for the one sub-block of memory cells, while the portion of the instance of the conductor $\mathbf{685}_1$ to the right of the isolation structure 586 might correspond to a control line for the different sub-block of memory cells, and the portion of the instance of the conductor $\mathbf{685}_2$ to the left of the isolation structure 586 might correspond to a control line for the one sub-block of memory cells, while the portion of the instance of the conductor $\mathbf{685}_2$ to the right of the isolation structure 586 might correspond to a control line for the different sub-block of memory cells. It is noted that the instances of the conductor 685 that are segmented by the isolation structure 586 might correspond to select lines for source select gates, to control lines for GG gates, and/or to control lines for other transistors for which segmentation by sub-block of memory cells might be desired.

In FIG. 8B, the common source 216 might be formed overlying the dielectric 570, the conductive plugs 582, and the isolation structure 586. The common source 216 might contain one or more conductive materials such as described with reference to the conductor of the gate structure 572. As one example, the common source 216 might contain conductively-doped polysilicon. For some embodiments, the common source 216 might represent a surface of a second carrier substrate and might be bonded to the structure of FIG. 8A. For other embodiments, the common source 216 might be deposited on the structure of FIG. 8A.

As previously noted, the portion of the memory array structure of FIGS. 6A-6J might be incomplete as not yet having a connection to a common source. Subsequent fabrication depicted in FIGS. 9A-9I show another example of forming the source-side connections for embodiments maintaining the integrity of the channel material structures 244. FIGS. 9A-9I depict cross-sectional views of a portion of a memory array structure during various stages of fabrication in accordance with embodiments. Like numbered elements in FIGS. 9A-9I correspond to the description as provided with respect to FIGS. 6A-6J and FIGS. 7A-7K.

Figure 9A:
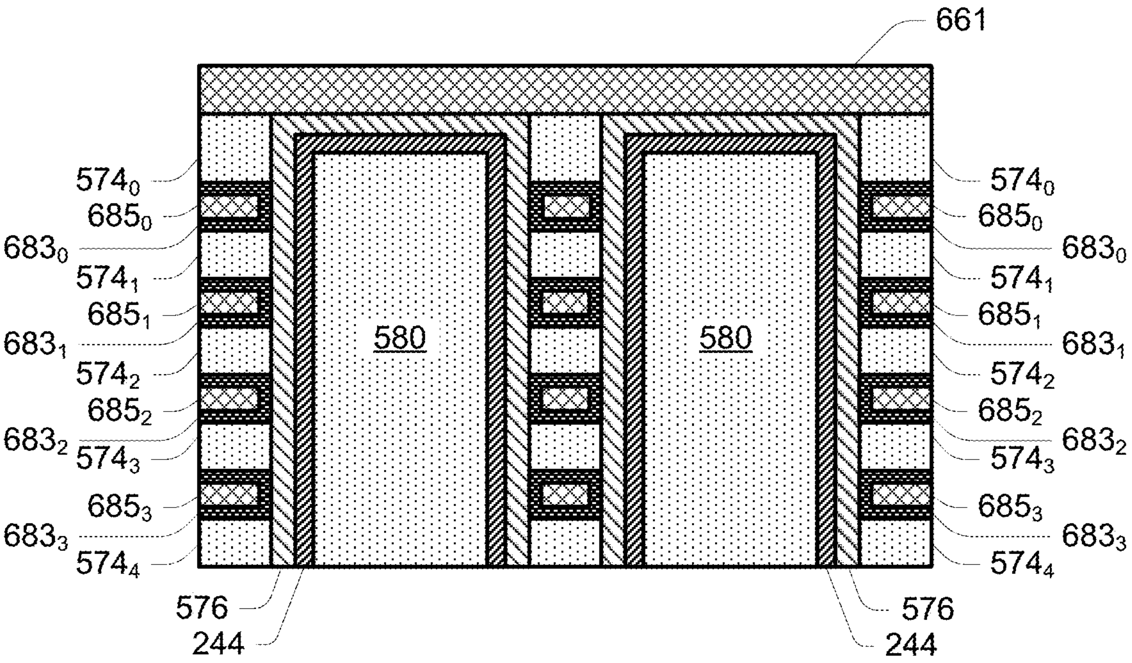
FIGS. 9A-9I depict cross-sectional views of a portion of a memory array structure during various stages of fabrication in accordance with embodiments.
Figure 9B:
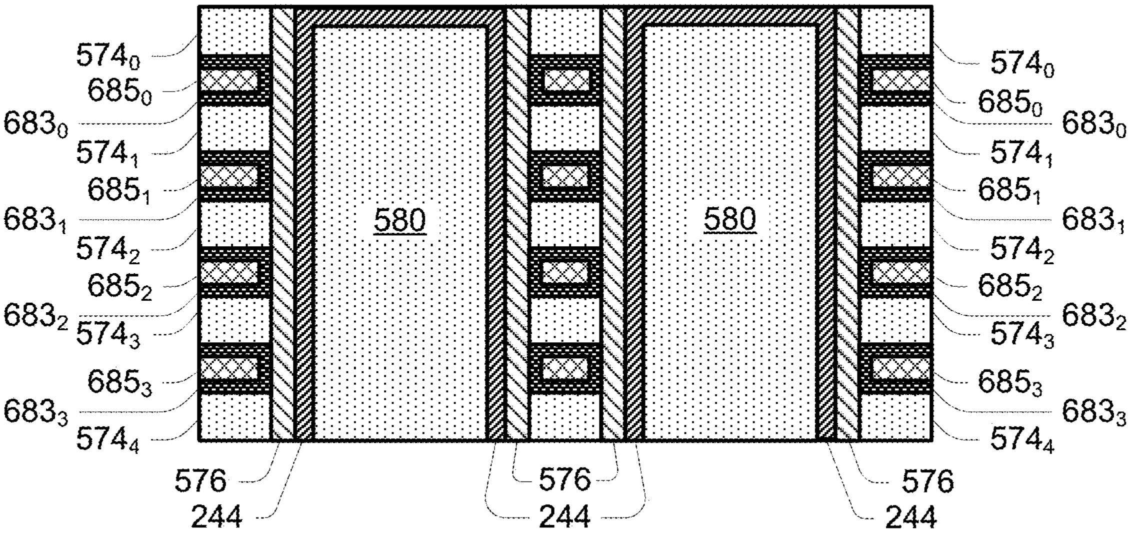

FIG. 9A might depict an inverted portion of the structure similar to that of FIG. 6J but without removal of portions of the data storage structures 576 to expose portions of the carrier substrate 661 as depicted in FIG. 6D. In general, a portion of the carrier substrate 661 might be removed prior to FIG. 9A, such as by cleaving, to reduce the thickness prior to further processing. In FIG. 9B, the carrier substrate 661 might be removed (e.g., further removed), and portions of the data storage structures 576, to expose the channel material structures 244. Removal of the carrier substrate 661 and data storage structures 576 at this stage might involve CMP. Removal of the carrier substrate 661 might further involve removal of portions of the instance of dielectric 574$_0$, and may involve removal of portions of the channel material structures 244. Alternatively, removal of the carrier substrate 661 might proceed from a structure such as that depicted in FIG. 7A, e.g., without portions of the data storage structures 576 between the channel material structures 244 and the carrier substrate 661, and might again result in a structure such as that depicted in FIG. 9B. Following removal of the carrier substrate 661, the resulting structure might be annealed, e.g., using rapid thermal annealing (RTA), furnace annealing, and/or laser annealing, to repair any damage to the channel material structures 244. This might improve conductivity of the channel material structures 244.

Figure 9C:
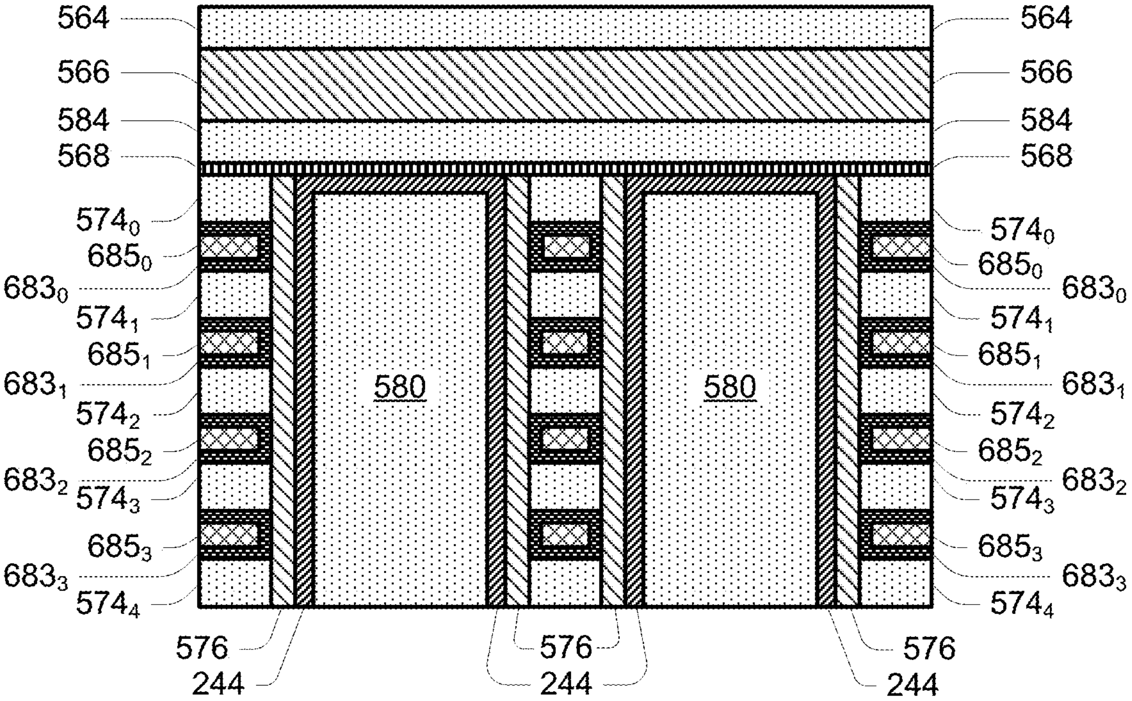

In FIG. 9C, an optional dielectric 568 might be formed overlying the dielectric 574$_0$, the data storage structures 576, and the channel material structures 244. A dielectric 584 might be formed overlying the dielectric 568 (or overlying the dielectric 574$_0$, the data storage structures 576, and the channel material structures 244 for embodiments without the dielectric 568), a conductor 566 might be formed overlying the dielectric 584, and a dielectric 564 might be formed overlying the conductor 566. The dielectric 568, dielectric 584 and/or the dielectric 564 might each contain one or more dielectric materials such as described with reference to the dielectric 574, the dielectric of the gate structures 572, and/or the dielectric 580. The conductor 566 might contain one or more conductive materials such as described with reference to the conductor of the gate structure 572.

Figure 9D:
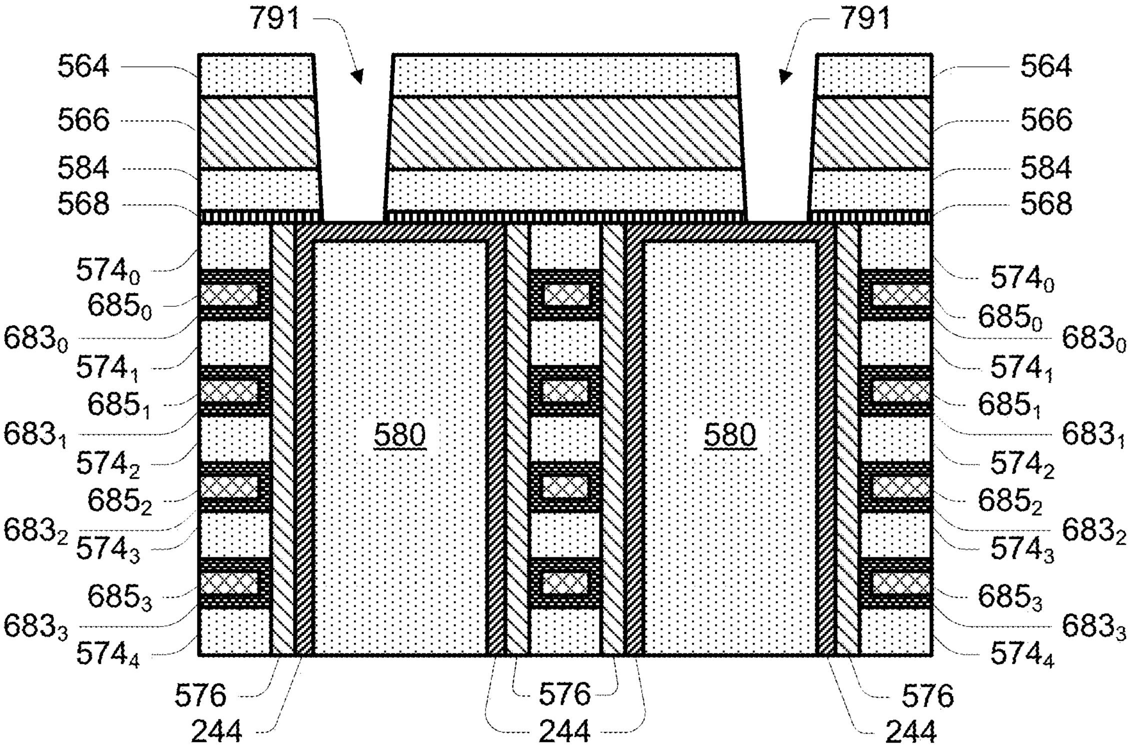
Figure 9E:
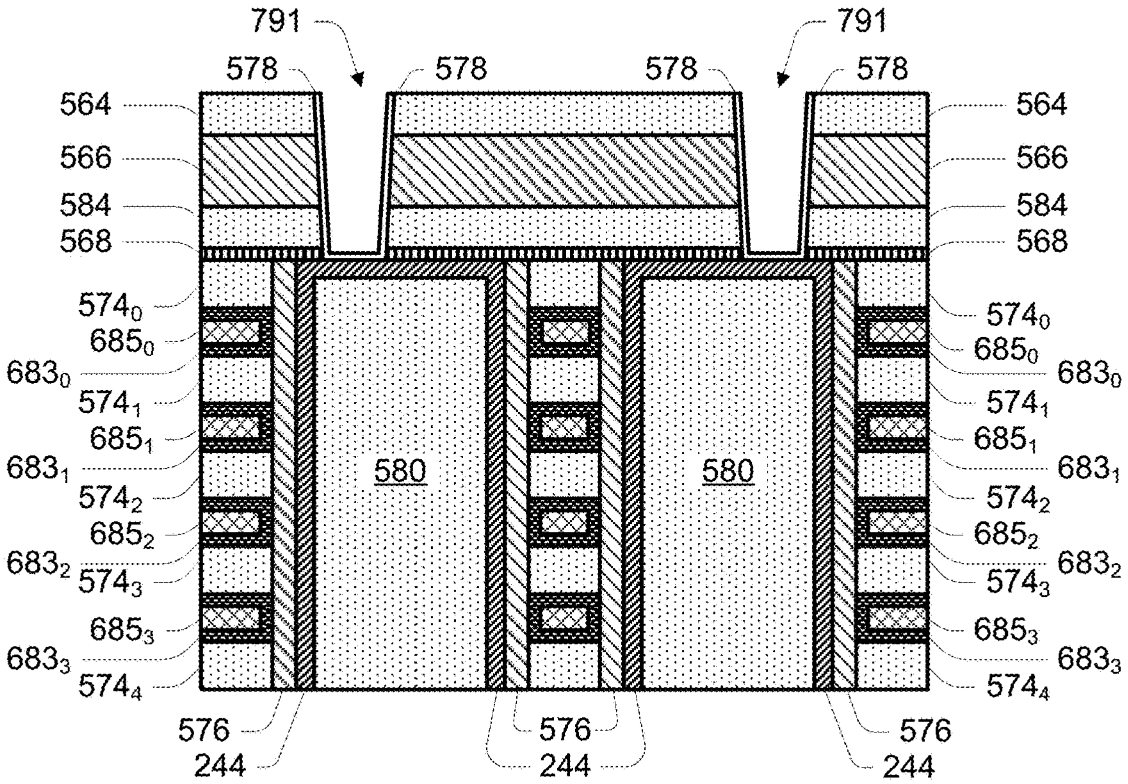
Figure 9F:
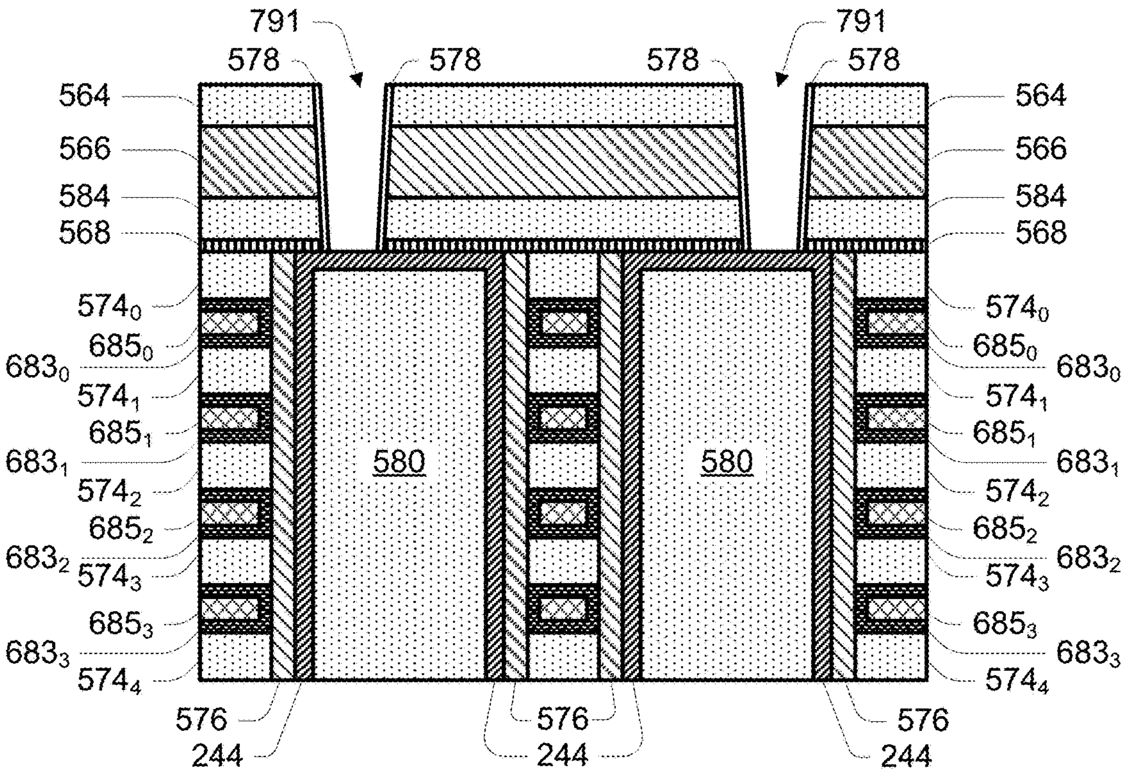

In FIG. 9D, portions of the dielectric 564, conductor 566, dielectric 584 and dielectric 568 might be removed to form vias 791 and to expose portions of the channel material structures 244. This removal might involve an anisotropic removal process, such as RIE. In FIG. 9E, dielectrics 578 might be formed to line the vias 791. In FIG. 9F, portions of the dielectrics 578, e.g., bottom portions, might be removed to expose portions of the channel material structures 244. This removal might involve an anisotropic removal process, such as RIE.

Figure 9G:
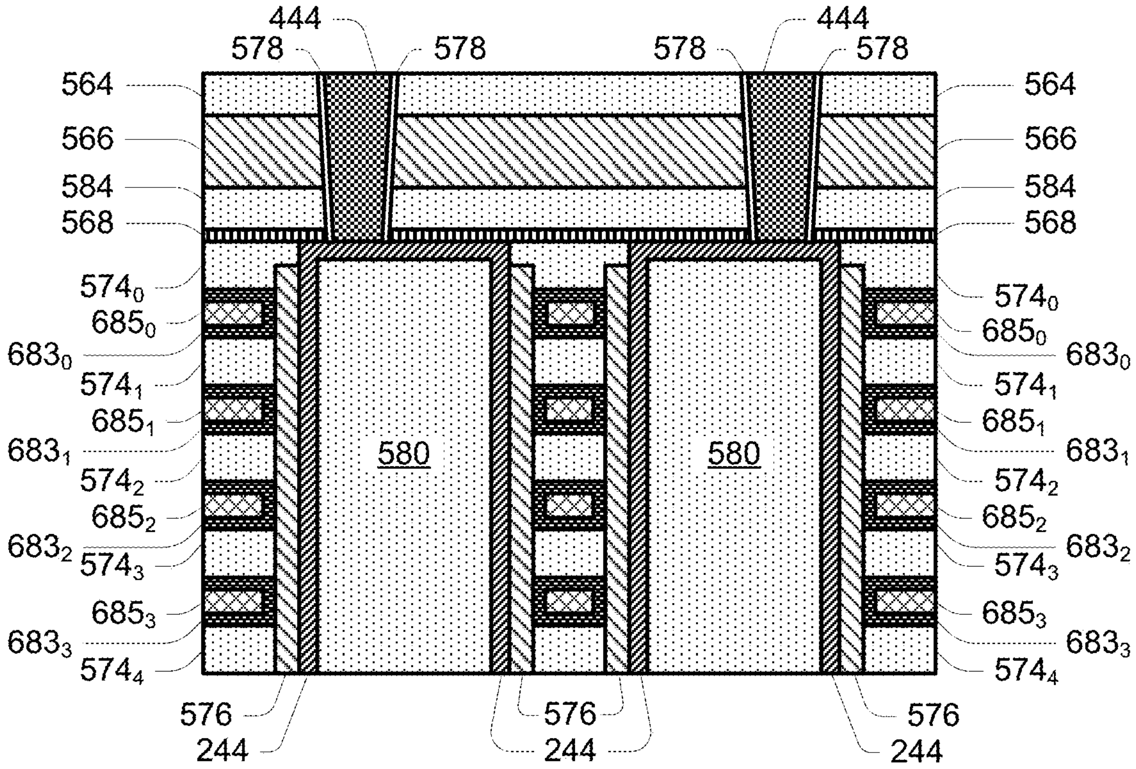

In FIG. 9G, channel material structures 444 might be formed in (e.g., to fill) the vias 791. The channel material structures 444 might include one or more semiconductor materials. For one embodiment, the channel material structures 444 might include a silicon-containing material, such as amorphous or polycrystalline silicon. The channel material structure 444 might have a conductivity type, e.g., a p-type conductivity or an n-type conductivity, and might have sufficient conductivity to give a future transistor a negative threshold voltage. Although the channel material structure 444 is depicted as a solid structure, the channel material structure 444 could alternatively be a hollow structure.

Figure 9H:
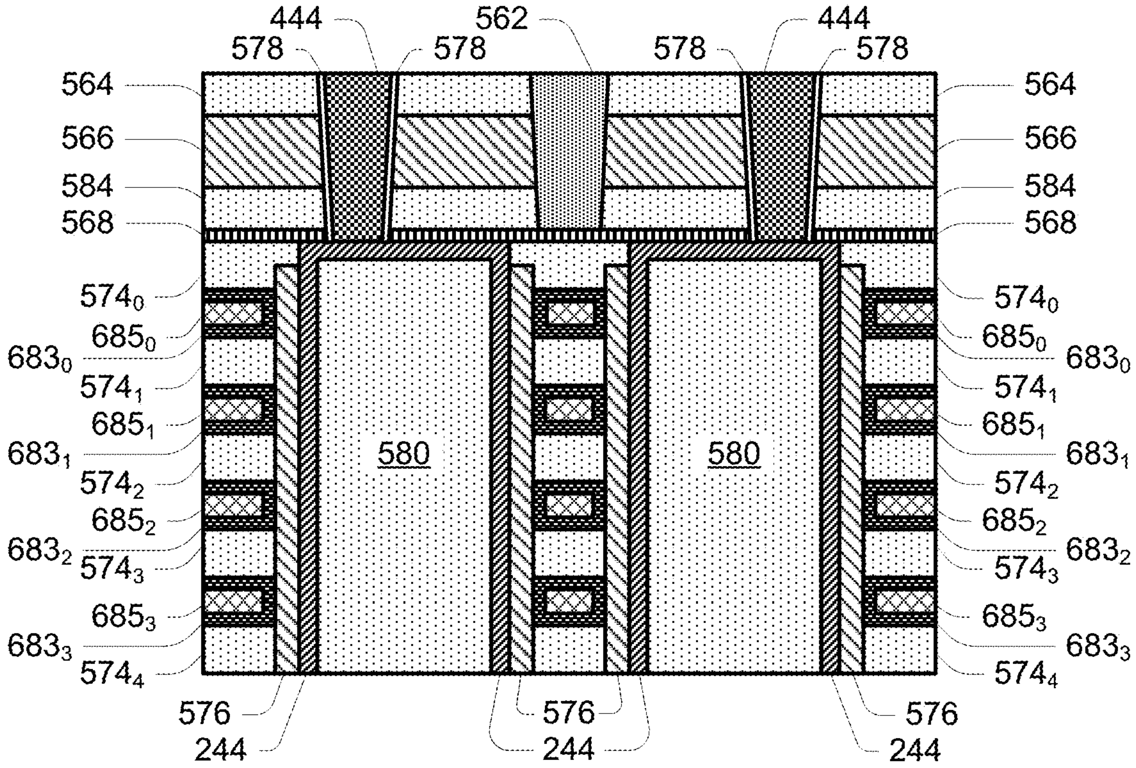

In FIG. 9H, an isolation structure 562 might be formed through the dielectric 564 and the conductor 566. A bottom surface of the isolation structure 562 might extend below a bottom surface of the conductor 566. The isolation structure 562 might further extend to be in contact with the dielectric 568 as depicted, and might further extend into the dielectric 574$_0$. The isolation structure 562 might contain one or more dielectric materials such as described with reference to the dielectric 574, the dielectric of the gate structures 572, and/or the dielectric 580.

Figure 9I:
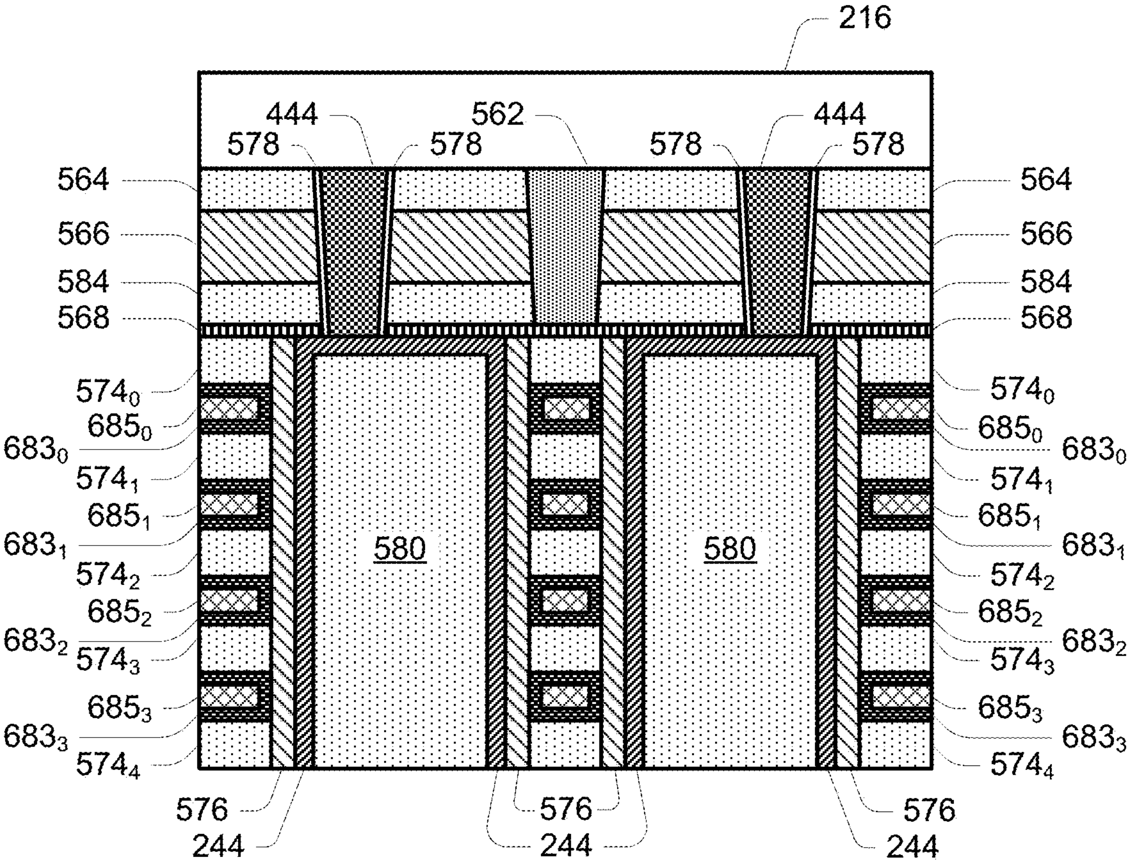

In FIG. 9I, the common source 216 might be formed overlying the dielectric 564, the dielectrics 578, the channel material structures 444, and the isolation structure 562. The common source 216 might contain one or more conductive materials such as described with reference to the conductor of the gate structure 572. As one example, the common source 216 might contain conductively-doped polysilicon. For some embodiments, the common source 216 might represent a surface of a second carrier substrate and might be bonded to the structure of FIG. 9H. For other embodiments, the common source 216 might be deposited on the structure of FIG. 9H.

Figure 10A:
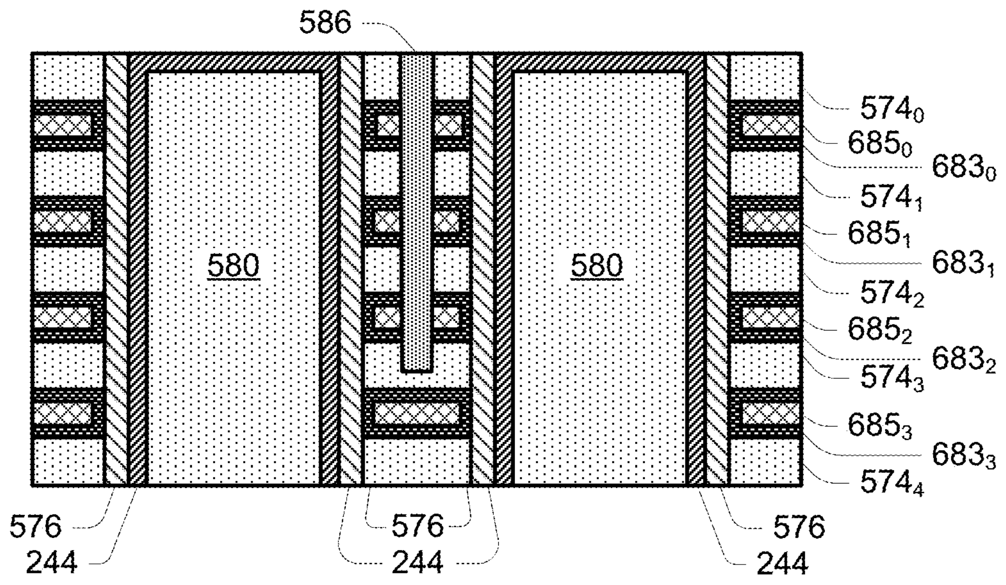
FIGS. 10A-10B depict cross-sectional views of a portion of a memory array structure during various stages of fabrication in accordance with embodiments.
Figure 10B:
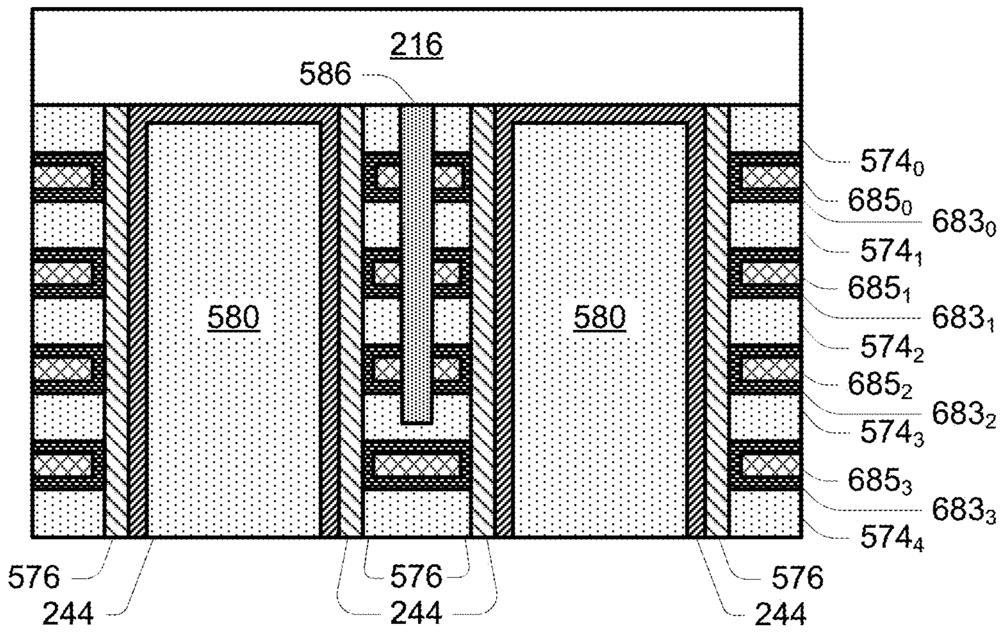

The structure depicted in FIG. 9I might correspond to the portion of the memory array structure depicted in FIGS. 5E-5F. To fabricate a structure such as depicted in FIGS. 5G-5H, the process might proceed as described with reference to FIGS. 6A-6J and 9A-9B, and then proceed to a process as described with reference to FIGS. 10A-10B. FIGS. 10A-10B depict cross-sectional views of a portion of a memory array structure during various stages of fabrication in accordance with embodiments. Like numbered elements in FIGS. 10A-10B correspond to the description as provided with respect to FIGS. 6A-6J and 9A-9B.

In FIG. 10A, an isolation structure 586 might be formed through the instance of the dielectric 574$_0$, the instance of the charge-blocking material 683$_0$, and the instance of the conductor 685$_0$, thereby separating the instance of the conductor 685$_0$ into isolated control lines. For example, the portion of the instance of the conductor 685$_0$ to the left of the isolation structure 586 might correspond to a control line for one sub-block of memory cells, e.g., the select line 214$_X$ of FIG. 4B, while the portion of the instance of the conductor 685$_0$ to the right of the isolation structure 586 might correspond to a control line for a different sub-block of memory cells, e.g., the select line 214$_{X-1}$ of FIG. 4B.

The isolation structure 586 might further extend through one or more additional instances of the conductors 685 as well as other intervening structures. For example, as depicted in FIG. 10A, the isolation structure 586 further extends through the instance of the conductor 685$_1$, the instance of the conductor 685$_2$, the instance of the charge-blocking layer 683$_1$, the instance of the charge-blocking layer 683$_2$, the instance of the dielectric 574$_1$, and the instance of the dielectric 574$_2$, and further has a bottom surface (relative to the orientation of FIG. 10A) extending into the instance of the dielectric 574$_3$. Similar to the isolated portions of the instance of the conductor 685$_0$, the portion of the instance of the conductor 685$_1$ to the left of the isolation structure 586 might correspond to a control line for the one sub-block of memory cells, while the portion of the instance of the conductor 685$_1$ to the right of the isolation structure 586 might correspond to a control line for the different sub-block of memory cells, and the portion of the instance of the conductor 685$_2$ to the left of the isolation structure 586 might correspond to a control line for the one sub-block of memory cells, while the portion of the instance of the conductor 685$_2$ to the right of the isolation structure 586 might correspond to a control line for the different sub-block of memory cells. It is noted that the instances of the conductor 685 that are segmented by the isolation structure 586 might correspond to select lines for source select gates, to control lines for GG gates, and/or to control lines for other transistors for which segmentation by sub-block of memory cells might be desired.

In FIG. 10B, the common source 216 might be formed overlying the instance of the dielectric 574$_0$, the dielectrics 576, the channel material structures 244, and the isolation structure 586. The common source 216 might contain one or more conductive materials such as described with reference to the conductor of the gate structure 572. As one example, the common source 216 might contain conductively-doped polysilicon. For some embodiments, the common source 216 might represent a surface of a second carrier substrate and might be bonded to the structure of FIG. 10A. For other embodiments, the common source 216 might be deposited on the structure of FIG. 10A.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory array structure, comprising:

a data line;

a common source;

a plurality of sub-blocks of memory cells, wherein each sub-block of memory cells of the plurality of sub-blocks of memory cells comprises:

a respective first channel material structure connected to the data line;

a respective string of series-connected memory cells selectively connected to the data line, selectively connected to the common source, and formed around its respective first channel material structure;

a respective plurality of first transistors connected in series between the data line and its respective string of series-connected memory cells, and formed around its respective first channel material structure;

a respective second channel material structure connected to the common source and connected to its respective first channel material structure; and a respective second transistor formed around its respective second channel material structure;

wherein a control gate of the respective second transistor for one sub-block of memory cells of the plurality of sub-blocks of memory cells is isolated from a control gate of the respective second transistor for a different sub-block of memory cells of the plurality of sub-blocks of memory cells.

2. The memory array structure of claim 1, further comprising:

an isolation structure formed between the respective second channel material structure for one sub-block of memory cells and the respective second channel material structure for a different sub-block of memory cells.

3. The memory array structure of claim 1, further comprising:

a plurality of isolation structures, wherein each isolation structure of the plurality of isolation structures is formed between the respective second channel material structures for a respective pair of adjacent sub-blocks of memory cells of the plurality of sub-blocks of memory cells.

4. The memory array structure of claim 3, wherein a respective isolation structure of the plurality of isolation structures is formed between the respective second channel material structures for each pair of adjacent sub-blocks of memory cells of the plurality of sub-blocks of memory cells.

5. The memory array structure of claim 1, wherein the respective first channel material structure for one sub-block of memory cells of the plurality of sub-blocks of memory cells comprises a hollow structure.

6. The memory array structure of claim 5, wherein each sub-block of memory cells of the plurality of sub-blocks of memory cells further comprises:

a respective conductive plug connected to the data line and connected to its respective first channel material structure;

wherein the respective conductive plug for the one sub-block of memory cells is in physical and electrical contact with inner sidewalls of its respective first channel material structure.

7. The memory array structure of claim 5, wherein the respective first channel material structure for the one sub-block of memory cells is formed to line a respective data storage structure.

8. The memory array structure of claim 7, wherein each memory cell of the respective string of series-connected memory cells and each first transistor of the respective plurality of first transistors for the one sub-block of memory cells comprises a respective control gate formed to surround its respective data storage structure and its respective first channel material structure.

9. The memory array structure of claim 5, wherein the respective second channel material structure for the one sub-block of memory cells comprises a solid structure.

10. The memory array structure of claim 1, wherein, for each sub-block of memory cells of the plurality of sub-blocks of memory cells, a pattern of threshold voltages configured to activate each first transistor of the respective plurality of first transistors for that sub-block of memory cells is further configured to deactivate at least one first transistor of the respective plurality of first transistors for each remaining sub-block of memory cells of the plurality of sub-blocks of memory cells.

11. The memory array structure of claim 1, wherein each memory cell of the respective string of series-connected memory cells and each first transistor of the respective plurality of first transistors for one sub-block of memory cells is configured to be programmable to alter its threshold voltage, and wherein each second transistor of the plurality of second transistors is configured to be non-programmable.

12. A memory array structure, comprising:

a data line;

a common source;

a plurality of sub-blocks of memory cells, wherein each sub-block of memory cells of the plurality of sub-blocks of memory cells comprises:

a respective channel material structure connected to the data line and connected to the common source;

a respective string of series-connected memory cells selectively connected to the data line, selectively connected to the common source, and formed around its respective channel material structure;

a respective plurality of first transistors connected in series between the data line and its respective string of series-connected memory cells, and formed around its respective channel material structure; and a respective second transistor connected in series between the common source and its respective string of series-connected memory cells, and formed around its respective channel material structure;

wherein, for each sub-block of memory cells of the plurality of sub-blocks of memory cells, a pattern of threshold voltages of the respective plurality of first transistors for that sub-block of memory cells is different than a pattern of threshold voltages of the respective plurality of first transistors for each remaining sub-block of memory cells of the plurality of sub-blocks of memory cells; and wherein a control gate for the respective second transistor for one sub-block of memory cells of the plurality of sub-blocks of memory cells is isolated from a control gate for at least one other sub-block of memory cells of the plurality of sub-blocks of memory cells by an isolation structure formed between the control gate for the respective second transistor for the one sub-block of memory cells and the control gate for the at least one other sub-block of memory cells.

13. The memory array structure of claim 12, wherein, for each sub-block of memory cells of the plurality of sub-blocks of memory cells, the control gate for the respective second transistor for that sub-block of memory cells is isolated from the respective control gate for each immediately adjacent sub-block of memory cells of the plurality of sub-blocks of memory cells by a respective isolation structure formed between the control gate for the respective second transistor for that sub-block of memory cells and the respective control gate for each immediately adjacent sub-block of memory cells of the plurality of sub-blocks of memory cells.

14. The memory array structure of claim 12, wherein each sub-block of memory cells of the plurality of sub-blocks of memory cells comprises:

a respective first conductive plug connected to the data line and connected to its respective channel material structure; and a respective second conductive plug connected to the common source and connected to its respective channel material structure;

wherein the respective channel material structure for one sub-block of memory cells of the plurality of sub-blocks of memory cells comprises a hollow structure;

wherein the respective first conductive plug for the one sub-block of memory cells is in physical and electrical contact with inner sidewalls of a first end of its respective channel material structure;

and wherein the respective second conductive plug for the one sub-block of memory cells is in physical and electrical contact with the inner sidewalls of a second end of its respective channel material structure opposite the first end of its respective channel material structure.

15. The memory array structure of claim 12, wherein, for each sub-block of memory cells of the plurality of sub-blocks of memory cells, its respective channel material structure connected to the common source to the common source in a manner selected from a group consisting of directly connected and connected to the common source through a conductive plug in contact with inner sidewalls of its respective channel material structure.

16. A method of forming a memory array structure:

forming a plurality of first channel material structures overlying a carrier substrate;

forming a respective plurality of series-connected memory cells to surround each first channel material structure of the plurality of first channel material structures;

forming a respective plurality of series-connected first transistors to surround each first channel material structure of the plurality of first channel material structures;

forming a data line connected to each first channel material structure of the plurality of first channel material structures;

removing the carrier substrate to expose each first channel material structure of the plurality of first channel material structures;

forming a plurality of second channel material structures, wherein each second channel material structure of the plurality of second channel material structures is formed to be connected to a respective first channel material structure of the plurality of first channel material structures;

forming a plurality of second transistors, wherein each second transistor of the plurality of second transistors is formed to surround a respective second channel material structure of the plurality of second channel material structures;

forming one or more isolation structures, wherein each isolation structure of the one or more isolation structures is formed between a respective pair of second channel material structures of the plurality of second channel material structures; and forming a common source connected to each second channel material structure of the plurality of second channel material structures.

17. The method of claim 16, wherein forming the plurality of first channel material structures overlying a carrier substrate, forming the respective plurality of series-connected memory cells to surround each first channel material structure of the plurality of first channel material structures, and forming the respective plurality of series-connected first transistors to surround each first channel material structure of the plurality of first channel material structures comprises:

forming a plurality of instances of a first dielectric and a plurality of instances of a sacrificial material in an alternating manner overlying the carrier substrate;

forming a plurality of first vias extending through the plurality of instances of the first dielectric and the plurality of instances of the sacrificial material to expose a plurality of portions of the carrier substrate;

forming a plurality of data storage structures, wherein each data storage structure of the plurality of data storage structures is formed to line sidewalls of a respective first via of the plurality of first vias;

forming the plurality of first channel material structures, wherein each first channel material structure of the plurality of first channel material structures is formed to line sidewalls of a respective data storage structure of the plurality of data storage structures;

removing each instance of the sacrificial material of the plurality of instances of sacrificial material to define a plurality of voids exposing portions of outer sidewalls of each data storage structure of the plurality of data storage structures; and forming a plurality of gate structures, wherein each gate structure of the plurality of gate structures comprises a respective first conductor and is formed to line a respective void of the plurality of voids.

18. The method of claim 17, wherein forming the plurality of second channel material structures, and forming the plurality of second transistors comprises:

forming a third dielectric overlying each first channel material structure of the plurality of first channel material structures;

forming a plurality of second vias extending through the third dielectric to expose a portion of each first channel material structure of the plurality of first channel material structures;

forming a plurality of conductive plugs, wherein each conductive plug of the plurality of conductive plugs is formed in a respective second via of the plurality of second vias to be connected to its respective first channel material structure of the plurality of first channel material structures;

forming a fourth dielectric overlying the plurality of conductive plugs;

forming a second conductor overlying the fourth dielectric;

forming a fifth dielectric overlying the second conductor;

forming a plurality of third vias extending through the fifth dielectric, the second conductor, and the fourth dielectric to expose a portion of each conductive plug of the plurality of conductive plugs; and forming the plurality of second channel material structures, wherein each second channel material structure of the plurality of second channel material structures is formed in a respective third via of the plurality of third vias, and to be connected to a respective conductive plug of the plurality of conductive plugs.

19. The method of claim 16, further comprising:

after removing the carrier substrate to expose each first channel material structure of the plurality of first channel material structures, anneal the exposed first channel material structures.

20. The method of claim 16, wherein the first channel material structure is a hollow structure, the method further comprising:

forming a plurality of first conductive plugs between the data line and the plurality of first channel material structures, such that each first conductive plug of the plurality of first conductive plugs is formed to be in physical contact with inner sidewalls of its respective first channel material structure at one end of its respective first channel material structure; and forming a plurality of second conductive plugs between the common source and the plurality of first channel material structures, such that each second conductive plug of the plurality of second conductive plugs is formed to be in physical contact with the inner sidewalls of its respective first channel material structure at an opposite end of its respective first channel material structure.

* * * * *